(12) United States Patent
Kunitake et al.

(10) Patent No.: US 12,317,600 B2
(45) Date of Patent: May 27, 2025

(54) SEMICONDUCTOR MATERIAL AND SEMICONDUCTOR DEVICE

(71) Applicant: SEMICONDUCTOR ENERGY LABORATORY CO., LTD., Atsugi (JP)

(72) Inventors: Hitoshi Kunitake, Kanagawa (JP); Shuhei Nagatsuka, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 110 days.

(21) Appl. No.: 16/964,115

(22) PCT Filed: Jan. 17, 2019

(86) PCT No.: PCT/IB2019/050375
§ 371 (c)(1),
(2) Date: Jul. 22, 2020

(87) PCT Pub. No.: WO2019/145827
PCT Pub. Date: Aug. 1, 2019

(65) Prior Publication Data
US 2021/0036025 A1     Feb. 4, 2021

(30) Foreign Application Priority Data
Jan. 25, 2018   (JP) ................. 2018-010564

(51) Int. Cl.
*H10D 87/00*     (2025.01)
*H10D 86/80*     (2025.01)

(52) U.S. Cl.
CPC ............. *H10D 87/00* (2025.01); *H10D 86/80* (2025.01)

(58) Field of Classification Search
CPC ................. H01L 27/1207; H01L 27/13; H01L 29/78648; H01L 27/1251; H01L 21/822;
(Continued)

(56) References Cited

U.S. PATENT DOCUMENTS 5,371,392 A    12/1994  Isono et al.
5,545,909 A     8/1996  Williams et al.
(Continued)

FOREIGN PATENT DOCUMENTS

CN    101030585 A    9/2007
CN    101090266 A    12/2007
(Continued)

OTHER PUBLICATIONS

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.
(Continued)

*Primary Examiner* — Errol V Fernandes
(74) *Attorney, Agent, or Firm* — Fish & Richardson P.C.

(57) ABSTRACT

A semiconductor device in which an electrification phenomenon that leads to characteristic fluctuations, element deterioration, or dielectric breakdown is inhibited is provided. A first transistor, a second transistor, a third transistor, and a fourth transistor are included over a substrate; the fourth transistor includes a first conductor, a second conductor, a third conductor, and an oxide semiconductor; the first conductor is electrically connected to the semiconductor substrate through the first transistor; the second conductor is electrically connected to the semiconductor substrate through the first transistor; the third conductor is electrically connected to the semiconductor substrate through the first transistor; and the fourth conductor is electrically connected to the semiconductor substrate through the first transistor.

3 Claims, 28 Drawing Sheets

(58) Field of Classification Search
CPC ..... H01L 21/8234; H01L 27/04; H01L 27/06; H01L 27/088; H01L 27/108; H01L 27/1156; H01L 27/1225; H01L 27/32; H01L 29/788; H01L 29/792; H01L 51/50; H01L 27/0255; H01L 27/0266; H01L 29/7869; G02F 1/1368; H05B 33/14; H10D 87/00; H10D 86/80

See application file for complete search history.

(56) References Cited

U.S. PATENT DOCUMENTS

| | | | |
|---|---|---|---|
| 5,641,981 | A | 6/1997 | Isono et al. |
| 5,654,574 | A | 8/1997 | Williams et al. |
| 5,677,205 | A | 10/1997 | Williams et al. |
| 5,811,845 | A | 9/1998 | Isono et al. |
| 5,877,534 | A | 3/1999 | Williams et al. |
| 5,969,929 | A | 10/1999 | Kleveland et al. |
| 6,365,941 | B1 | 4/2002 | Rhee |
| 6,437,407 | B1 | 8/2002 | Ker et al. |
| 7,443,202 | B2 | 10/2008 | Kimura et al. |
| 7,663,404 | B2 | 2/2010 | Kimura et al. |
| 7,795,658 | B2 | 9/2010 | Shino |
| 7,961,006 | B2 | 6/2011 | Kimura et al. |
| 8,351,226 | B2 | 1/2013 | Osada |
| 8,471,596 | B2 | 6/2013 | Kimura et al. |
| 8,698,137 | B2 | 4/2014 | Yamazaki et al. |
| 8,836,034 | B2 | 9/2014 | Hirose et al. |
| 8,941,958 | B2 | 1/2015 | Tomatsu |
| 9,177,890 | B2 | 11/2015 | Du |
| 9,312,280 | B2 | 4/2016 | Kobayashi |
| 9,721,953 | B2 | 8/2017 | Kobayashi |
| 9,817,032 | B2 | 11/2017 | Takahashi et al. |
| 9,865,588 | B2 | 1/2018 | Isobe |
| 9,947,801 | B2 | 4/2018 | Yamazaki et al. |
| 10,038,402 | B2 | 7/2018 | Okamoto et al. |
| 10,236,392 | B2 | 3/2019 | Yamazaki et al. |
| 10,355,019 | B1* | 7/2019 | Li ................. H01L 27/1225 |
| 10,566,460 | B2 | 2/2020 | Yamazaki et al. |
| 10,615,076 | B2 | 4/2020 | Yanagawa et al. |
| 10,651,790 | B2 | 5/2020 | Okamoto et al. |
| 10,833,203 | B2 | 11/2020 | Yamazaki et al. |
| 11,177,392 | B2 | 11/2021 | Yamazaki et al. |
| 11,581,440 | B2 | 2/2023 | Yamazaki et al. |
| 2002/0036323 | A1 | 3/2002 | Shimomura |
| 2003/0129829 | A1* | 7/2003 | Greenlaw ............. H01L 23/481 |
| | | | 257/E21.597 |
| 2004/0070901 | A1 | 4/2004 | Umeda |
| 2005/0156275 | A1 | 7/2005 | Hsieh |
| 2006/0145238 | A1* | 7/2006 | Fontana ............. H01L 27/0255 |
| | | | 257/315 |
| 2007/0200157 | A1* | 8/2007 | Shino ..................... H10B 12/00 |
| | | | 257/296 |
| 2007/0296660 | A1 | 12/2007 | Kimura et al. |
| 2009/0065941 | A1* | 3/2009 | La Tulipe, Jr. ... H01L 21/76804 |
| | | | 257/761 |
| 2009/0256196 | A1* | 10/2009 | Wang ................. H01L 29/7809 |
| | | | 257/334 |
| 2011/0010332 | A1 | 1/2011 | Vasudevan et al. |
| 2011/0101332 | A1* | 5/2011 | Yamazaki ............. G11C 11/405 |
| | | | 257/43 |
| 2011/0241639 | A1* | 10/2011 | Noda ..................... H02M 3/156 |
| | | | 323/282 |
| 2011/0287590 | A1* | 11/2011 | Song ................. H01L 27/11578 |
| | | | 438/129 |
| 2012/0001345 | A1* | 1/2012 | Park ..................... H01L 29/7889 |
| | | | 257/E21.597 |
| 2012/0056175 | A1* | 3/2012 | Takemura ......... H01L 29/78633 |
| | | | 257/E29.094 |
| 2013/0049164 | A1* | 2/2013 | Baars ................. H01L 29/66136 |
| | | | 257/E21.334 |
| 2013/0075740 | A1* | 3/2013 | Correia Fortunato ....................... H01L 21/02628 |
| | | | 252/512 |
| 2014/0231799 | A1 | 8/2014 | Matsubayashi |
| 2014/0252306 | A1* | 9/2014 | Du ....................... H01L 27/0886 |
| | | | 977/762 |
| 2015/0001551 | A1* | 1/2015 | Kashyap ............. H01L 21/8252 |
| | | | 257/77 |
| 2016/0027809 | A1* | 1/2016 | Kobayashi .......... H01L 27/1225 |
| | | | 257/43 |
| 2016/0307938 | A1* | 10/2016 | Jin ....................... H01L 27/1214 |
| 2017/0040354 | A1* | 2/2017 | Smith ...................... H01L 28/60 |
| 2017/0047321 | A1* | 2/2017 | Nishimura ............ H01L 29/861 |
| 2017/0126176 | A1 | 5/2017 | Okamoto et al. |
| 2017/0186843 | A1* | 6/2017 | Hosaka ............... H01L 29/7869 |
| 2018/0012869 | A1* | 1/2018 | Sadaka ................. H01L 23/481 |
| 2018/0144984 | A1 | 5/2018 | Yanagawa et al. |
| 2018/0263594 | A1* | 9/2018 | Morimoto ............. H01L 29/786 |
| 2018/0358925 | A1 | 12/2018 | Okamoto et al. |
| 2023/0100524 | A1* | 3/2023 | Ikeda .................. H01M 10/425 |
| | | | 429/7 |
| 2023/0197859 | A1 | 6/2023 | Yamazaki et al. |

FOREIGN PATENT DOCUMENTS

| | | |
|---|---|---|
| CN | 101159388 A | 4/2008 |
| CN | 105027284 A | 11/2015 |
| CN | 106165106 A | 11/2016 |
| CN | 107431042 A | 12/2017 |
| EP | 0708516 A | 4/1996 |
| EP | 0976190 A | 2/2000 |
| EP | 1826819 A | 8/2007 |
| EP | 1909384 A | 4/2008 |
| EP | 3288068 A | 2/2018 |
| JP | 06-013563 A | 1/1994 |
| JP | 06-021356 A | 1/1994 |
| JP | 08-227976 A | 9/1996 |
| JP | 2000-510653 | 8/2000 |
| JP | 2004-087765 A | 3/2004 |
| JP | 2008-009418 A | 1/2008 |
| JP | 2008-098341 A | 4/2008 |
| JP | 2014-002133 A | 1/2014 |
| JP | 2016-032112 A | 3/2016 |
| JP | 2016-207846 A | 12/2016 |
| JP | 2017-085571 A | 5/2017 |
| KR | 2007-0115736 A | 12/2007 |
| KR | 2017-0051296 A | 5/2017 |
| TW | 200813972 | 3/2008 |
| WO | WO-1998/047190 | 10/1998 |
| WO | WO-2014/138317 | 9/2014 |
| WO | WO-2015/145292 | 10/2015 |
| WO | WO-2016/170913 | 10/2016 |

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Kato.K et al., "Evaluation of Off-State Current Characteristics of Transistor Using Oxide Semiconductor Material, Indium.Gallium.Zinc Oxide", Jpn. J. Appl. Phys. (Japanese Journal of Applied Physics) , 2012, vol. 51, pp. 021201-1-021201-7.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

(56) References Cited

OTHER PUBLICATIONS

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
International Search Report (Application No. PCT/IB2019/050375) Dated Apr. 2, 2019.
Written Opinion (Application No. PCT/IB2019/050375) Dated Apr. 2, 2019.
Chinese Office Action (Application No. 201980008397.X) Dated Oct. 14, 2023.

\* cited by examiner

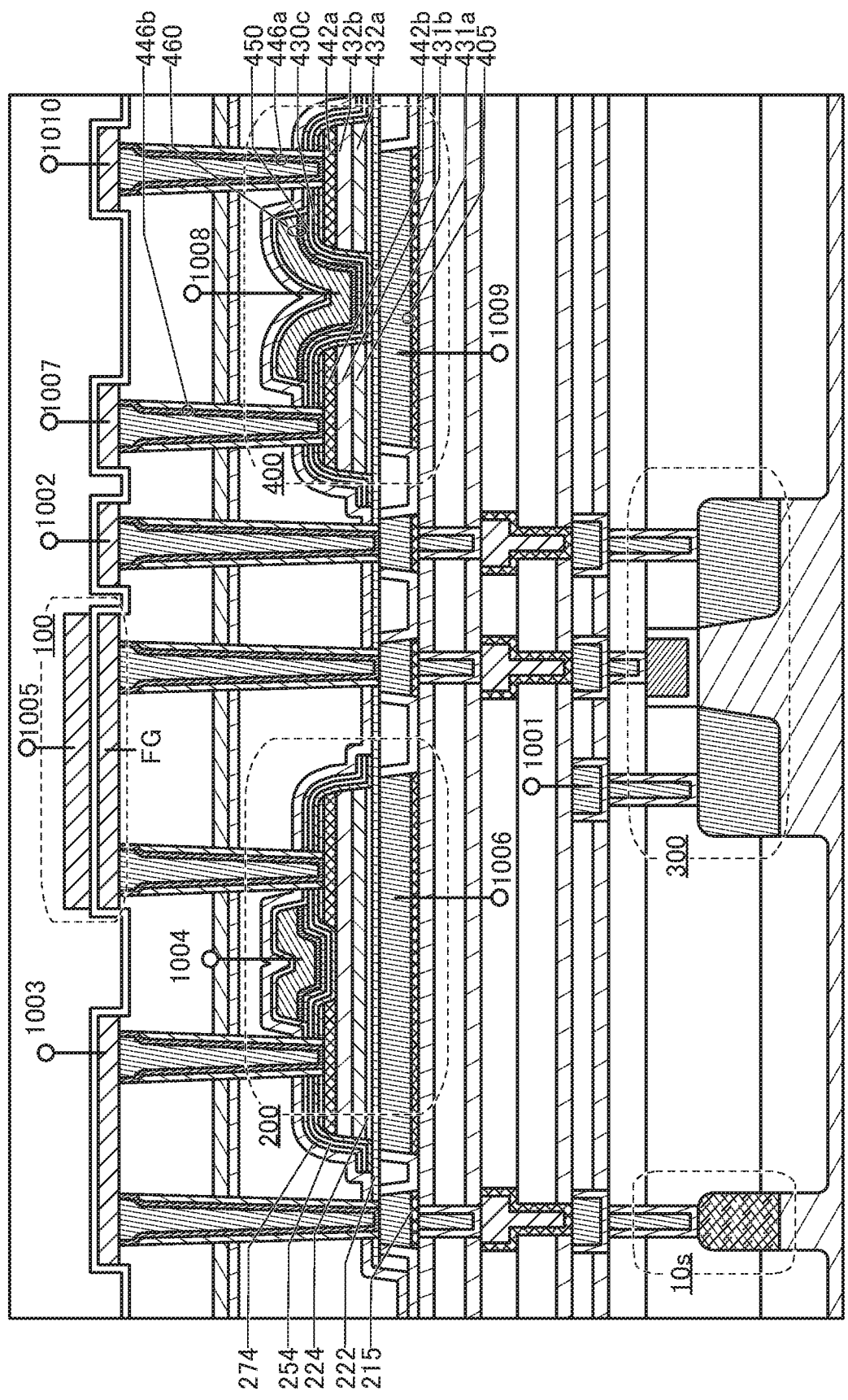

FIG. 28A
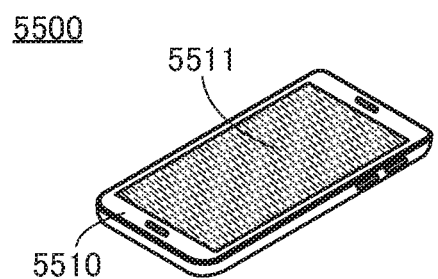
FIG. 28C
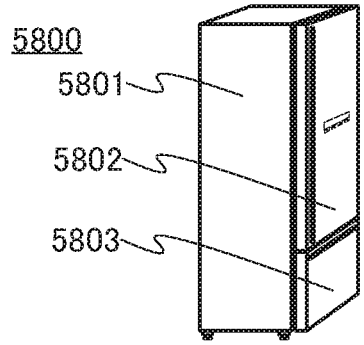
FIG. 28E1
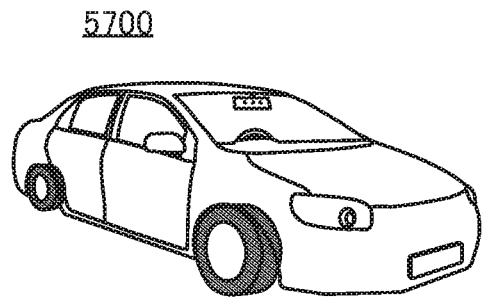
FIG. 28B
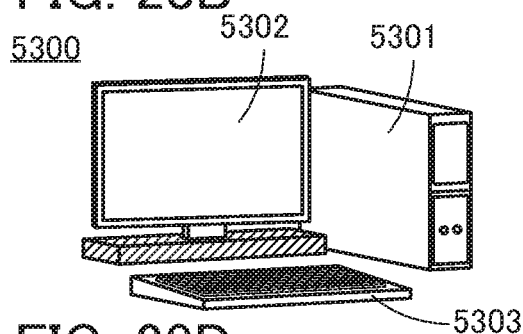
FIG. 28D
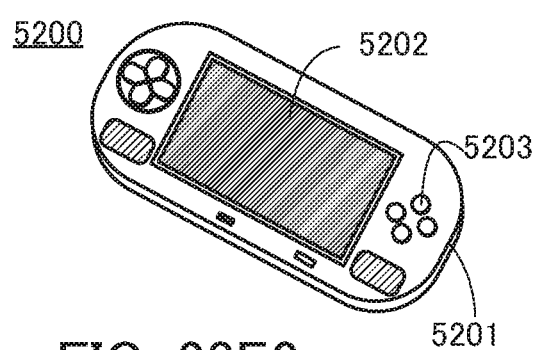
FIG. 28E2
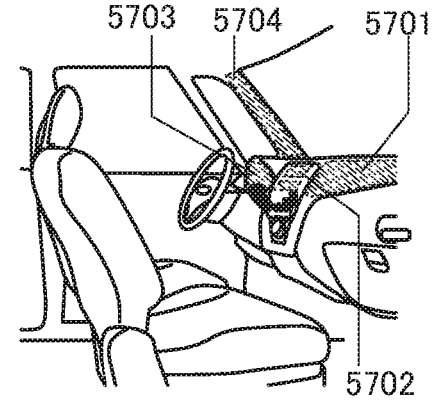
FIG. 28F
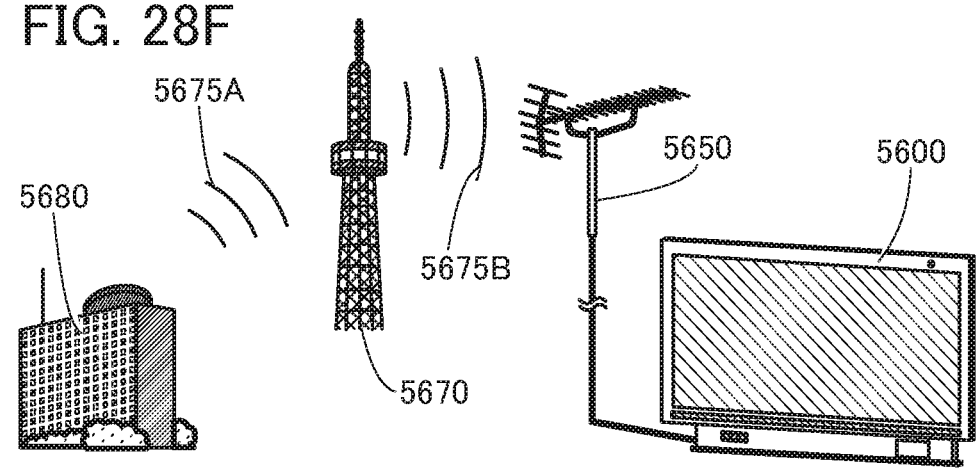

SEMICONDUCTOR MATERIAL AND SEMICONDUCTOR DEVICE

CROSS REFERENCE TO RELATED APPLICATIONS

This application is a U.S. National Phase Application under 35 U.S.C. § 371 of International Application PCT/IB2019/050375, filed on Jan. 17, 2019, which is incorporated by reference and claims the benefit of a foreign priority applications filed in Japan on Jan. 25, 2018, as Application No. 2018-010564.

TECHNICAL FIELD

One embodiment of the present invention relates to a semiconductor material and a semiconductor device.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A silicon-based semiconductor material is widely known as a semiconductor thin film that can be used in a transistor, and as another material, an oxide semiconductor has attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). In Non-Patent Document 1 and Non-Patent Document 2, a technique for manufacturing a transistor using an oxide semiconductor having a CAAC structure is also disclosed. Moreover, Non-Patent Document 4 and Non-Patent Document 5 show that a fine crystal is included even in an oxide semiconductor which has lower crystallinity than an oxide semiconductor having the CAAC structure or the nc structure.

In addition, a transistor that uses IGZO for an active layer has an extremely low off-state current (see Non-Patent Document 6), and an LSI and a display utilizing the characteristics have been reported (see Non-Patent Document 7 and Non-Patent Document 8).

REFERENCES

Non-Patent Documents

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

An object of one embodiment of the present invention is to inhibit an electrification phenomenon that leads to characteristic fluctuations, element deterioration, or dielectric breakdown in a semiconductor device. In particular, since the thicknesses of various insulating films such as gate insulating films are decreased with miniaturization, dielectric breakdown due to abnormal electrification is a more serious problem.

An object of one embodiment of the present invention is to provide a semiconductor device capable of retaining data for a long time. An object of one embodiment of the present invention is to provide a semiconductor device which includes a transistor using an oxide semiconductor and in which the transistor has stable electrical characteristics and reliability.

An object of one embodiment of the present invention is to provide a semiconductor device having favorable electrical characteristics. An object of one embodiment of the present invention is to provide a semiconductor device that can be miniaturized or highly integrated. An object of one embodiment of the present invention is to provide a semiconductor device with high productivity. An object of one embodiment of the present invention is to provide a semiconductor device with high design flexibility.

An object of one embodiment of the present invention is to provide a semiconductor device capable of reducing power consumption. An object of one embodiment of the present invention is to provide a semiconductor device with high-speed data writing. An object of one embodiment of the present invention is to provide a novel semiconductor device.

Note that the descriptions of these objects do not preclude the existence of other objects. Note that one embodiment of the present invention does not necessarily achieve all of these objects. Objects other than these will be apparent from the description of the specification, the drawings, the claims, and the like, and objects other than these can be derived from the description of the specification, the drawings, the claims, and the like.

Means for Solving the Problems

One embodiment of the present invention includes a transistor including a first conductor, a second conductor, a third conductor, and an oxide semiconductor over a substrate, a first diode element, a second diode element, and a third diode element; charged charges in the transistor move to the semiconductor substrate through the first diode element, the second diode element, or the third diode element.

In the above, the first diode element, the second diode element, the third diode element, and a fourth diode element are electrically connected to a fourth conductor.

One embodiment of the present invention includes a transistor including a first conductor, a second conductor, a third conductor, and an oxide semiconductor over a substrate, a first capacitor, a second capacitor, and a third capacitor; charged charges in the transistor move to the first capacitor, the second capacitor, or the third capacitor to be fixed thereto.

In the above, the first capacitor, the second capacitor, and the third capacitor are electrically connected to a fourth conductor.

In the above, the fourth conductor functions as a gate electrode of the transistor.

In the above, the semiconductor device includes two or more transistors.

One embodiment of the present invention includes a first transistor, a second transistor, a third transistor, and a fourth transistor over a substrate; the fourth transistor includes a first conductor, a second conductor, a third conductor, and an oxide semiconductor; the first conductor is electrically connected to the semiconductor substrate through the first transistor; the second conductor is electrically connected to the semiconductor substrate through the first transistor; the third conductor is electrically connected to the semiconductor substrate through the first transistor; and the fourth conductor is electrically connected to the semiconductor substrate through the first transistor.

In the above, the first transistor, the second transistor, and the third transistor function as capacitors.

In the above, the first transistor, the second transistor, and the third transistor function as diode elements.

Effect of the Invention

According to one embodiment of the present invention, a semiconductor device in which element deterioration or dielectric breakdown is inhibited can be provided. According to one embodiment of the present invention, a semiconductor device capable of retaining data for a long time can be provided. According to one embodiment of the present invention, a semiconductor device which includes a transistor using an oxide semiconductor and in which the transistor has stable electrical characteristics and reliability can be provided.

According to one embodiment of the invention, a semiconductor device having favorable electrical characteristics can be provided. According to one embodiment of the present invention, a semiconductor device that can be miniaturized or highly integrated can be provided. According to one embodiment of the present invention, a semiconductor device with high productivity can be provided. According to one embodiment of the present invention, a semiconductor device with high design flexibility can be provided.

According to one embodiment of the present invention, a semiconductor device with high-speed data writing can be provided. According to one embodiment of the present invention, a semiconductor device capable of reducing power consumption can be provided. According to one embodiment of the present invention, a novel semiconductor device can be provided.

Note that the descriptions of these effects do not preclude the existence of other effects. Note that one embodiment of the present invention does not necessarily have all of these effects. Effects other than these will be apparent from the description of the specification, the drawings, the claims, and the like, and effects other than these can be derived from the description of the specification, the drawings, the claims, and the like.

BRIEF DESCRIPTION OF THE DRAWINGS

FIGS. 11A and 11B Top views of semiconductor devices of one embodiment of the present invention.

FIG. 17 A cross-sectional view illustrating a structure of a memory device of one embodiment of the present invention.

FIGS. 28A-28D, 28E1, 28E2, and 28F Diagrams illustrating electronic devices of one embodiment of the present invention.

MODE FOR CARRYING OUT THE INVENTION

Figure 1A:
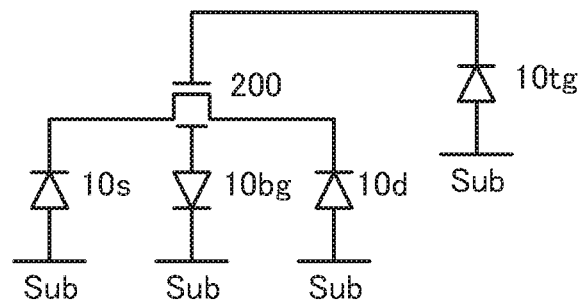
FIGS. 1A to 1D A circuit diagram and cross-sectional views of a semiconductor device of one embodiment of the present invention.

Hereinafter, embodiments are described with reference to drawings. Note that the embodiments can be implemented with many different modes, and it is readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. The drawings are schematic views showing ideal examples, and embodiments of the present invention are not limited to shapes or values shown in the drawings. In the drawings, the same portions or portions having similar functions are denoted by the same reference numerals in different drawings, and explanation thereof is not repeated. Furthermore, the same hatch pattern is used for the portions having similar functions, and the portions are not especially denoted by reference numerals in some cases.

In this specification, terms for describing arrangement, such as "over" and "under", are used for convenience in describing a positional relation between components with reference to drawings. Furthermore, the positional relation between components is changed as appropriate in accordance with a direction in which each component is described. Thus, terms for the description are not limited to those used in this specification, and the description can be rephrased appropriately depending on the situation.

In this specification and the like, a transistor is an element having at least three terminals of a gate, a drain, and a source. The transistor has a channel formation region between the drain (a drain terminal, a drain region, or a drain electrode) and the source (a source terminal, a source region, or a source electrode), and current can flow through the drain, the channel formation region, and the source. Note that in this specification and the like, a channel formation region refers to a region through which current mainly flows.

Furthermore, functions of a source and a drain might be switched when a transistor of opposite polarity is employed or a direction of current is changed in circuit operation, for example. Therefore, the terms "source" and "drain" are used interchangeably in this specification and the like.

Furthermore, in this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

Note that in this specification and the like, a nitride oxide refers to a compound that includes more nitrogen than oxygen. An oxynitride refers to a compound that includes more oxygen than nitrogen. The content of each element can be measured by Rutherford backscattering spectrometry (RBS: Rutherford Ackscattering Spectrometry), for example.

In this specification and the like, "parallel" indicates a state where two straight lines are placed at an angle greater than or equal to −10° and less than or equal to 10°. Thus, the case where the angle is greater than or equal to −5° and less than or equal to 5° is also included. In addition, the term "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "substantially perpendicular" indicates a state where two straight lines are placed at an angle greater than or equal to 60° and less than or equal to 120°.

Note that in this specification, a barrier film means a film having a function of inhibiting the passage of oxygen and impurities such as hydrogen, and the barrier film having conductivity is referred to as a conductive barrier film in some cases.

In this specification and the like, a transistor having normally-on characteristics is a transistor that is on when no potential (0 V) is applied by a power supply. For example, the normally-on characteristics of a transistor mean, in some cases, electrical characteristics in which current (Id) flows between a drain and a source when a voltage applied to a gate of the transistor (Vg) is 0 V.

In this specification and the like, an oxide semiconductor is a type of metal oxide. A metal oxide means an oxide including a metal element. A metal oxide exhibits insulating properties, semiconductor properties, or conductivities depending on its composition or formation method. A metal oxide exhibiting semiconductor properties is referred to as a metal oxide semiconductor or an oxide semiconductor (or simply OS). A metal oxide exhibiting insulating properties is referred to as a metal oxide insulator or an oxide insulator. A metal oxide exhibiting conductivities is referred to as a metal oxide conductor or an oxide conductor. In other words, a metal oxide used in a channel formation region or the like of a transistor can be referred to as an oxide semiconductor.

Embodiment 1

In this embodiment, a semiconductor device including a transistor using an oxide semiconductor, which is one embodiment of the present invention, is described with reference to FIG. 1 to FIG. 5.

It is effective to secure a discharge path by a protection circuit formed using a diode element (protection diode) or a capacitor (protection capacitor) in preventing electrostatic breakdown in a transistor using an oxide semiconductor. Thus, in one embodiment of the present invention, a transistor using an oxide semiconductor and a diode element or a capacitor are provided over the same substrate.

Structure Example of Semiconductor Device

Figure 1B:
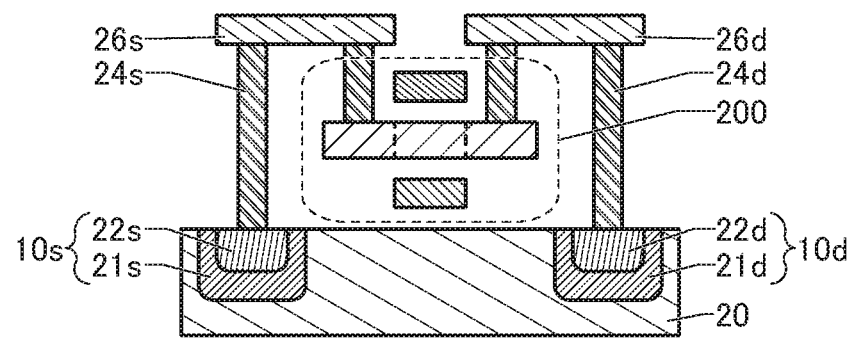
Figure 1C:
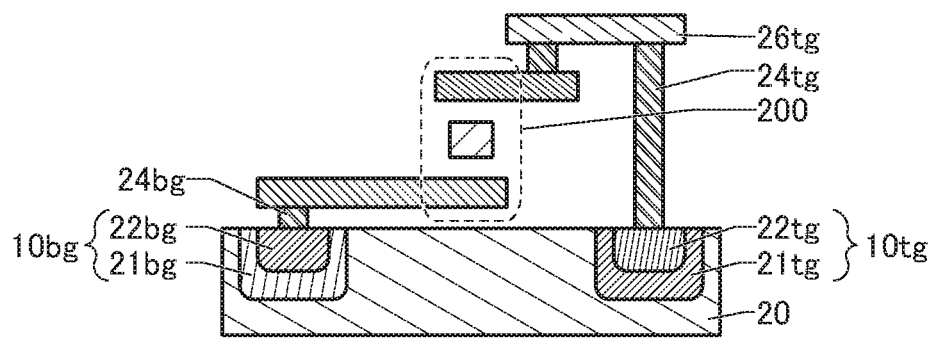
Figure 1D:
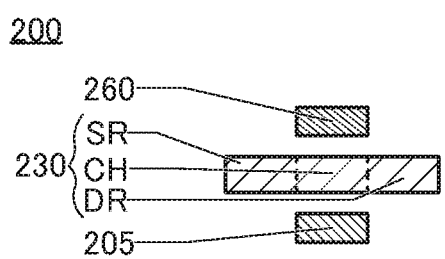

FIG. 1(D) is a schematic diagram of a transistor 200 of one embodiment of the present invention. For clarity of the drawing, some components are not illustrated in FIG. 1(D).
[Transistor 200]

As illustrated in FIG. 1(D), the transistor 200 includes at least 260 that functions as a gate and an oxide 230 that includes a region CH where a channel is formed (hereinafter, also referred to as a channel formation region), a region SR functioning as a source, and a region DR functioning as a drain.

The transistor 200 may include a conductor 205 below the oxide 230. Note that the conductor 205 may have a function of a second gate. By changing a potential applied to the conductor 205 independently of a potential applied to the conductor 260, for example, the threshold voltage of the transistor 200 can be controlled. In particular, by applying a negative potential to the conductor 205, the threshold voltage of the transistor 200 can be higher than 0 V and the off-state current can be reduced. Thus, drain current when a potential applied to the conductor 260 is 0 V can be lower in the case where a negative potential is applied to the conductor 205 than in the case where a negative potential is not applied.

For example, when the conductor 205 and the conductor 260 are provided to overlap with each other, an electric field generated from the conductor 260 and an electric field generated from the conductor 205 are connected and can cover a channel formation region formed in the oxide 230 in the case where the same potential is applied to the conductor 260 and the conductor 205. That is, the channel formation region can be electrically surrounded by the electric field of the conductor 260 having a function of a first gate electrode and the electric field of the conductor 205 having a function of the second gate electrode. In this specification, a transistor structure in which a channel formation region is electrically surrounded by electric fields of a first gate electrode and a second gate electrode is referred to as a surrounded channel (S-channel) structure.

Note that a metal oxide containing indium is preferably used for the oxide 230. For example, a metal oxide such as an In-M-Zn oxide (the element M is one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) can be used. Furthermore, for the oxide 230, an In—Ga oxide or an In—Zn oxide may be used.

The transistor 200 using an oxide semiconductor in the region CH where the channel is formed has an extremely low leakage current in a non-conduction state; thus, a semiconductor device with low power consumption can be provided. An oxide semiconductor can be deposited by a sputtering method or the like, and thus can be used for the transistor 200 included in a highly integrated semiconductor device.

The use of an oxide semiconductor as an active layer enables formation of a thin film transistor by using a semiconductor thin film formed over a semiconductor substrate, a conductive substrate, or an insulating substrate. Alternatively, a substrate which is an insulating substrate provided with a conductor or a semiconductor, a substrate which is a semiconductor substrate provided with a conductor or an insulator, or a substrate which is a conductive substrate provided with a semiconductor or an insulator may be used. Alternatively, these substrates provided with elements may be used. Examples of the elements provided for the substrates include a capacitor, an inductance element, and a resistor (such as a switching element, a light-emitting element, or a memory element).

Here, each structure included in the transistor can be formed by repeating deposition of a film using a material suitable for each structure and processing and shaping of the film.

The film can be deposited by, for example, a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma CVD (PECVD: plasma enhanced CVD) method using plasma, a thermal CVD (TCVD) method using heat, a photo CVD method using light, and the like. Moreover, CVD methods can be classified into a metal CVD (MCVD) method and a metal organic CVD (MOCVD) method depending on a source gas to be used.

Here, high-quality films can be obtained at relatively low temperatures by a plasma CVD method. However, a wiring, an electrode, an element (e.g., a transistor or a capacitor), or the like included in the semiconductor device might cause an electrification phenomenon (charging) when receiving charges from plasma generated during deposition (being in a charging state is also referred to as being charged up). In this case, accumulated charges might break the wiring, the electrode, the element, or the like included in the semiconductor device.

Examples of a method for processing and shaping the film include dry etching, wet etching, and chemical mechanical polishing (CMP: Chemical Mechancal Polishing) treatment. To perform minute processing because of a reduction in device size, dry etching using plasma is generally used. However, charge up might be caused by plasma also in dry etching.

For example, in a process of forming a wiring, each of wirings obtained by cutting a wiring is likely to be in an electrically floating state. Each of the wirings after the cutting is charged up in a later process, which causes electrostatic breakdown (ESD: Electro-Static Discharge) of an element. In particular, there is a high probability that a gate insulator is broken when different potentials are charged in electrodes of the transistor.

Note that the causes and environments of charging are very complicated and diverse. Thus, it is preferable not only to investigate the causes and environments of charging but also to increase the resistance of the semiconductor device structure to deterioration or dielectric breakdown due to charging.

To prevent deterioration or dielectric breakdown of the transistor 200 due to charging, a discharge path is secured by a protection circuit formed using a diode (protection diode) or a capacitor. When a discharge path is secured, charges accumulated in an insulating film can be prevented from being discharged in the vicinity of a semiconductor element.

Structure Example of Semiconductor Device Using Semiconductor Substrate

An example of a semiconductor device using a semiconductor substrate is described below with reference to FIG. 1(A).

FIG. 1(A) is a circuit diagram of a semiconductor device including the transistor 200 of one embodiment of the present invention. The semiconductor device illustrated in FIG. 1(A) includes diodes 10 (a diode 10$tg$, a diode 10$bg$, a diode 10$s$, and a diode 10$d$) each of which is electrically connected to the corresponding electrode of the transistor 200. The transistor 200 is connected to a substrate 20 through each of the diodes.

A semiconductor substrate is preferably used as the substrate 20. For example, the substrate 20 is placed on a grounded stage or the like. Accordingly, charged charges in the transistor 200 flow in the direction of a ground potential (GND) through the diodes 10; thus, discharging eventually occurs.

Note that in general, a potential (voltage) is relative, and its quantity depends on the relative quantity from a reference potential. Thus, even when "grounding", "GND", "ground", or the like is found in this specification, the potential is not limited to 0 V. For example, "grounding" or "GND" is defined using the lowest potential in a circuit as a reference in some cases. Alternatively, "grounding" or "GND" is defined using an intermediate potential in a circuit as a reference in some other cases. Note that a positive potential or a negative potential is defined using a potential such as "grounding", "GND", or "ground" as a reference.

Here, FIG. 1(B) and FIG. 1(C) illustrate examples of cross-sectional views of the semiconductor device including the transistor 200 of one embodiment of the present invention illustrated in FIG. 1(A). FIG. 1(B) illustrates a cross-sectional view in the L length direction of the transistor 200, and FIG. 1(C) illustrates a cross-sectional view in the W length direction of the transistor 200. Note that for clarity of the drawings, some components are not illustrated in FIG. 1(B) and FIG. 1(C).

As illustrated in FIG. 1(B) and FIG. 1(C), the semiconductor device includes at least the transistor 200 functioning as a transistor, the diode 10$s$, the diode 10$d$, the diode 10$tg$, and the diode 10$bg$. Note that each of the diodes 10 (the diode 10$s$, the diode 10$d$, the diode 10$tg$, and the diode 10$bg$) includes a region 21 (a region 21$s$, a region 21$d$, a region 21$tg$, or a region 21$bg$) and a region 22 (a region 22$s$, a region 22$d$, a region 22$tg$, or a region 22$bg$).

The semiconductor device includes a plug electrically connected to one of a source and a drain of the transistor 200, a wiring 26$s$ electrically connected to the plug, and a plug 24$s$ electrically connected to the wiring 26$s$ and the region 22$s$ of the diode 10$s$.

The semiconductor device includes a plug electrically connected to the other of the source and the drain of the transistor 200, a wiring 26$d$ electrically connected to the plug, and a plug 24$d$ electrically connected to the wiring 26$d$ and the region 22$d$ of the diode 10$d$.

The semiconductor device includes a plug electrically connected to the conductor 260, a wiring 26$tg$ electrically connected to the plug, and a plug 24$tg$ electrically connected to the wiring 26$tg$ and the region 22$tg$ of the diode 10$tg$.

The semiconductor device includes a plug 24$bg$ that electrically connects the conductor 205 of the transistor 200 and the region 22$bg$ of the diode 10$bg$.

A p-type single crystal silicon substrate can be used as the substrate 20, for example. In that case, part of the substrate 20 is selected and made conductive so that what is called a buried diode can be formed. The buried diode can be used as the diodes 10.

Specifically, to form the diode 10$s$, the diode 10$d$, and the diode 10$tg$ in FIG. 1, the region 21$s$, the region 21$d$, and the region 21$tg$ which are thin p-type regions are formed in the substrate 20 which is a p-type single crystal silicon substrate, and the region 22$s$, the region 22$d$, and the region 22$tg$ which are n-type regions are formed thereover. Meanwhile, to form the diode 10$bg$, the region 21$bg$ which is a thin n-type region is formed in the substrate 20 which is a p-type single crystal silicon substrate, and a p-type region is formed thereover.

In the case where a p-type single crystal silicon substrate is used as the substrate 20, the thin p-type regions are not necessarily provided. In the case where a Si transistor or the like is provided using the substrate 20, the region 21 and the region 22 can be provided in the same process as that for the formation of the Si transistor.

Although an example of using a single crystal semiconductor substrate is described above, a substrate with an SOI (Silicon On Insulator) structure may be used. Examples of semiconductor substrates include, in addition to the semiconductor substrate of silicon, a semiconductor substrate of germanium or the like and a compound semiconductor substrate containing silicon carbide, silicon germanium, gallium arsenide, indium phosphide, zinc oxide, or gallium oxide. A semiconductor substrate including an insulator region in the above semiconductor substrate is also included.

Although the diode 10$s$ and the diode 10$d$ are formed on the extension of the L length direction of the transistor 200 and the diode 10$bg$ and the diode 10$tg$ are formed on the extension of the W length direction of the transistor 200 in FIG. 1(B) and FIG. 1(C), the structure is not limited to this and the layout can be changed appropriately depending on the required circuit design.

Note that the diode 10$s$, the diode 10$d$, the diode 10$tg$, and the diode 10$bg$ can be provided as needed. In the case where the transistor 200 has a structure that does not include the conductor 205, for example, the diode 10$bg$ is unnecessary.

Furthermore, each of the diodes 10 is not necessarily provided for the corresponding one transistor 200. The number of the diodes 10 provided for a plurality of transistors 200 may be smaller than that of the transistors 200. For example, in the case where a plurality of transistors 200 arranged in an array have common wirings, at least one diode 10 is necessary for each common wiring.

Structure Example of Semiconductor Device Using Conductive Substrate

Examples of a semiconductor device using a conductive substrate are described below with reference to FIG. 2 and FIG. 3.

Unlike in a semiconductor substrate, it is difficult to provide a buried diode in a conductive substrate. Thus, a transistor 200$t$ using an oxide semiconductor and a transistor 200$s$, a transistor 200$d$, a transistor 200$tg$, and a transistor 200$bg$ that function as diode elements or capacitors are formed over the same substrate. Accordingly, the transistor 200$s$, the transistor 200$d$, the transistor 200$tg$, and the transistor 200$bg$ are preferably provided at the same time as the transistor 200*t*. In other words, the transistor 200*s*, the transistor 200*d*, the transistor 200*tg*, and the transistor 200*bg* are placed in the same layer as the transistor 200*t*.

Note that a plurality of cell arrays (a cell array is a group of a plurality of transistors) can be provided over the conductive substrate. The transistor 200*s*, the transistor 200*d*, the transistor 200*tg*, and the transistor 200*bg* are made to function as diode elements or capacitors depending on the required design. In the case where capacitors are used, for example, the semiconductor device can be used as a power supply circuit or the like because there is no voltage range. Meanwhile, in the case where the response speed of a cell array to be designed is important, diode elements are used. Diode elements or capacitors can be provided for each of the cell arrays provided over the same substrate.

Note that examples of a conductive substrate that can be used as the substrate 20 include a graphite substrate, a metal substrate, an alloy substrate, and a conductive resin substrate. Other examples include a substrate containing a metal nitride and a substrate containing a metal oxide. Alternatively, for example, a semiconductor substrate may have its resistance reduced to be used. For example, a p-type single crystal silicon substrate can be made p-type to be used.

Although the transistor 200*s* and the transistor 200*d* are formed on the extension of the L length direction of the transistor 200*t* and the transistor 200*bg* and the transistor 200*tg* are formed on the extension of the W length direction of the transistor 200*t* in FIG. 2 and FIG. 3, the structure is not limited to this and the layout can be changed appropriately depending on the required circuit design.

The transistor 200*s*, the transistor 200*d*, the transistor 200*tg*, and the transistor 200*bg* can be provided as needed. In the case where the transistor 200 has a structure that does not include the conductor 205, for example, the transistor 200*bg* is unnecessary.

Furthermore, each of the transistors 200 is not necessarily provided for one transistor 200. The number of the transistors 200 provided for a plurality of transistors 200 may be smaller than that of the transistors 200. For example, in the case where a plurality of transistors 200 arranged in an array have common wirings, at least one or more transistors 200 are necessary for each common wiring.

<<Semiconductor Device 1 with Diode Connection>>

Figure 2A:
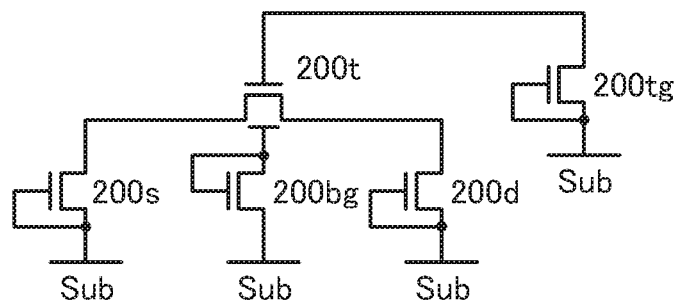
FIGS. 2A to 2C A circuit diagram and cross-sectional views of a semiconductor device of one embodiment of the present invention.

FIG. 2(A) is a circuit diagram of a semiconductor device including the transistor 200*t* of one embodiment of the present invention. The semiconductor device illustrated in FIG. 2(A) includes a plurality of transistors (the transistor 200*tg*, the transistor 200*bg*, the transistor 200*s*, and the transistor 200*d*) that function as diodes each of which is electrically connected to the corresponding electrode of the transistor 200*t*. The transistor 200*t* is connected to the substrate 20 through each of the diodes.

Note that a conductive substrate is used as the substrate 20. For example, the substrate 20 is placed on a grounded stage or the like. Accordingly, charged charges in the transistor 200*t* flow in the direction of a ground potential (GND) through the transistor 200*tg*, the transistor 200*bg*, the transistor 200*s*, and the transistor 200*d*; thus, discharging eventually occurs.

Figure 2B:
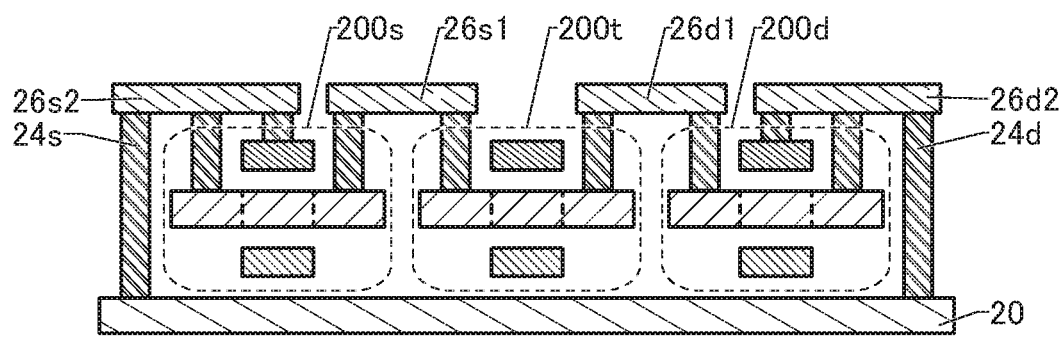
Figure 2C:
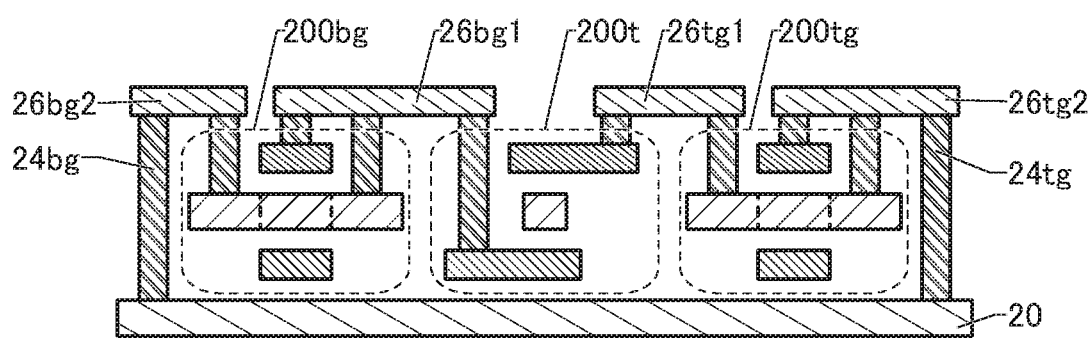

Here, FIG. 2(B) and FIG. 2(C) illustrate examples of cross-sectional views of the semiconductor device including the transistor 200*t* of one embodiment of the present invention illustrated in FIG. 2(A). FIG. 2(B) illustrates a cross-sectional view in the L length direction of the transistor 200*t*, and FIG. 2(C) illustrates a cross-sectional view in the W length direction of the transistor 200*t*. Note that for clarity of the drawings, some components are not illustrated in FIG. 2(B) and FIG. 2(C).

As illustrated in FIG. 2(B) and FIG. 2(C), the semiconductor device includes at least the transistor 200*t* functioning as a transistor. In addition, the transistor 200*s*, the transistor 200*d*, the transistor 200*tg*, and the transistor 200*bg* functioning as diodes are included.

The semiconductor device includes a plug electrically connected to one of a source and a drain of the transistor 200*t*, a wiring 26*s*1 electrically connected to the plug, and a plug electrically connected to the wiring 26*s*1 and the other of a source and a drain of the transistor 200*s*. Furthermore, a plug electrically connected to one of the source and the drain of the transistor 200*s*, a plug electrically connected to the conductor 260 of the transistor 200*s*, and a wiring 26*s*2 electrically connected to both of the plugs are included. Furthermore, the plug 24*s* electrically connecting the wiring 26*s*2 and the substrate 20 is included.

The semiconductor device includes a plug electrically connected to the other of the source and the drain of the transistor 200*t*, a wiring 26*d*1 electrically connected to the plug, and a plug electrically connected to the wiring 26*d*1 and one of a source and a drain of the transistor 200*d*. Furthermore, a plug electrically connected to the other of the source and the drain of the transistor 200*d*, a plug electrically connected to the conductor 260 of the transistor 200*d*, and a wiring 26*d*2 electrically connected to both of the plugs are included. Furthermore, the plug 24*d* electrically connecting the wiring 26*d*2 and the substrate 20 is included.

The semiconductor device includes a plug electrically connected to the conductor 260 of the transistor 200*t*, a wiring 26*tg*1 electrically connected to the plug, and a plug electrically connected to the wiring 26*tg*1 and one of a source and a drain of the transistor 200*tg*. Furthermore, a plug electrically connected to the other of the source and the drain of the transistor 200*tg*, a plug electrically connected to the conductor 260 of the transistor 200*tg*, and a wiring 26*tg*2 electrically connected to both of the plugs are included. Furthermore, the plug 24*tg* electrically connecting the wiring 26*tg*2 and the substrate 20 is included.

The semiconductor device includes a plug electrically connected to the conductor 205 of the transistor 200*t*, a wiring 26*bg*1 electrically connected to the plug, a plug electrically connected to the wiring 26*bg*1 and the other of a source and a drain of the transistor 200*bg*, and a plug electrically connecting the wiring 26*bg*1 and the conductor 260 of the transistor 200*bg*. Furthermore, a plug electrically connected to one of the source and the drain of the transistor 200*bg*, and a wiring 26*bg*2 electrically connected to the plug are included. Furthermore, the plug 24*bg* electrically connecting the wiring 26*bg*2 and the substrate 20 is included.

In other words, the electrodes of the transistor 200*t* functioning as a transistor are electrically connected to the substrate 20 having conductivity through the diode-connected transistor 200*s*, transistor 200*d*, transistor 200*tg*, and transistor 200*bg*.

Note that a transistor that is provided in the same process as and has the same structure as the transistor 200*s*, the transistor 200*d*, the transistor 200*tg*, and the transistor 200*bg* functioning as diode elements is preferably used as the transistor 200*t* using an oxide semiconductor.

<<Semiconductor Device 1 with Capacitor Connection>>

Figure 3A:
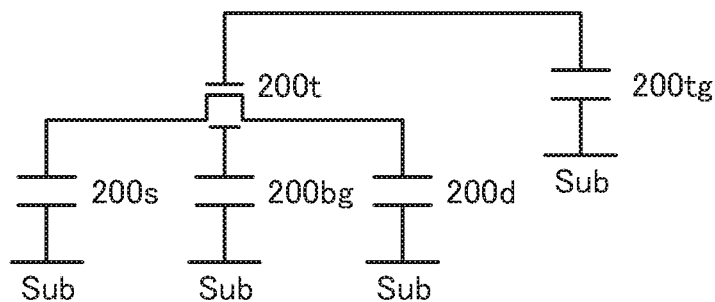
FIGS. 3A to 3C A circuit diagram and cross-sectional views of a semiconductor device of one embodiment of the present invention.

FIG. 3(A) is a circuit diagram of a semiconductor device including the transistor 200*t* of one embodiment of the present invention. The semiconductor device illustrated in FIG. 3(A) includes a plurality of transistors (the transistor 200*tg*, the transistor 200*bg*, the transistor 200*s*, and the transistor 200*d*) that function as capacitors each of which is electrically connected to the corresponding electrode of the transistor 200*t*. The transistor 200*t* is connected to the substrate 20 through each of the capacitors.

Charged charges in the transistor 200*t* are absorbed and retained in the transistor 200*tg*, the transistor 200*bg*, the transistor 200*s*, and the transistor 200*d* functioning as protection capacitors.

Note that the potentials of the transistor 200*tg*, the transistor 200*bg*, the transistor 200*s*, and the transistor 200*d* are preferably equal to one another. For that purpose, the transistor 200*tg*, the transistor 200*bg*, the transistor 200*s*, and the transistor 200*d* functioning as capacitors are preferably designed to have capacitance values as large as possible. Moreover, the other electrodes of the transistor 200*tg*, the transistor 200*bg*, the transistor 200*s*, and the transistor 200*d* functioning as capacitors are preferably grounded through the substrate 20 using a conductive substrate.

Figure 3B:
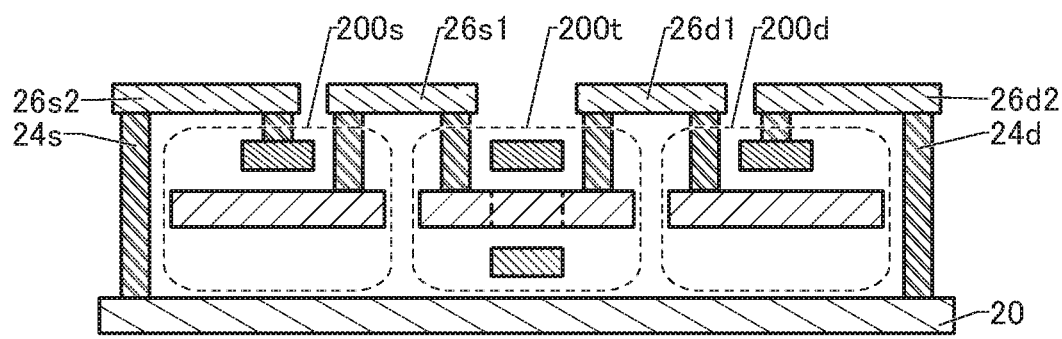
Figure 3C:
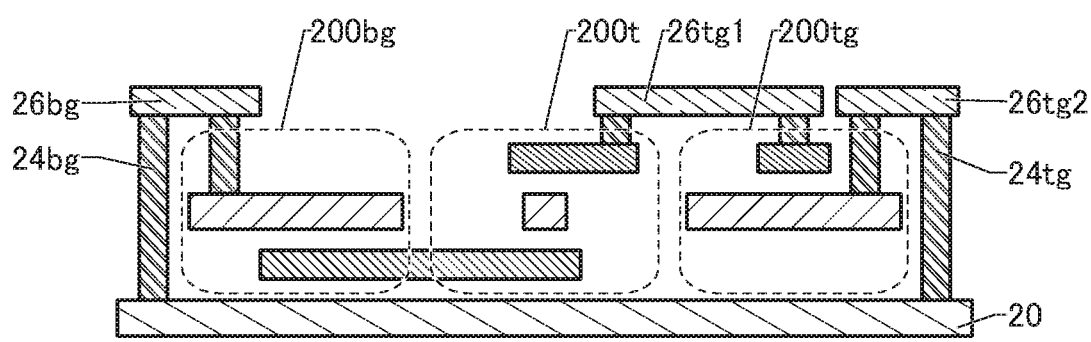

Here, FIG. 3(B) and FIG. 3(C) illustrate examples of cross-sectional views of the semiconductor device including the transistor 200*t* of one embodiment of the present invention illustrated in FIG. 3(A). FIG. 3(B) illustrates a cross-sectional view in the L length direction of the transistor 200*t*, and FIG. 3(C) illustrates a cross-sectional view in the W length direction of the transistor 200*t*. Note that for clarity of the drawings, some components are not illustrated in FIG. 3(B) and FIG. 3(C).

As illustrated in FIG. 3(B) and FIG. 3(C), the semiconductor device includes at least the transistor 200*t* functioning as a transistor. In addition, the transistor 200*s*, the transistor 200*d*, the transistor 200*tg*, and the transistor 200*bg* functioning as capacitors are included.

The semiconductor device includes a plug electrically connected to one of a source and a drain of the transistor 200*t*, the wiring 26*s*1 electrically connected to the plug, and a plug electrically connected to the wiring 26*s*1 and the oxide 230 of the transistor 200*s*. Furthermore, a plug electrically connected to the conductor 260 of the transistor 200*s*, and the wiring 26*s*2 electrically connected to the plug are included. Furthermore, the plug 24*s* electrically connecting the wiring 26*s*2 and the substrate 20 is included.

The semiconductor device includes a plug electrically connected to the other of the source and the drain of the transistor 200*t*, the wiring 26*d*1 electrically connected to the plug, and a plug electrically connected to the wiring 26*d*1 and the oxide 230 of the transistor 200*d*. Furthermore, a plug electrically connected to the conductor 260 of the transistor 200*d*, and the wiring 26*d*2 electrically connected to the plug are included. Furthermore, the plug 24*d* electrically connecting the wiring 26*d*2 and the substrate 20 is included.

The semiconductor device includes a plug electrically connected to the conductor 260 of the transistor 200*t*, the wiring 26*tg*1 electrically connected to the plug, and a plug electrically connected to the wiring 26*tg*1 and the conductor 260 of the transistor 200*tg*. Furthermore, a plug electrically connected to the other of a source and a drain of the transistor 200*tg*, and the wiring 26*tg*2 electrically connected to the plug are included. Furthermore, the plug 24*tg* electrically connecting the wiring 26*tg*2 and the substrate 20 is included.

Furthermore, a plug electrically connected to the oxide 230 of the transistor 200*bg*, and a wiring 26*bg* electrically connected to the plug are included. Furthermore, the plug 24*bg* electrically connecting the wiring 26*bg* and the substrate 20 is included.

Here, some components are not illustrated for simple explanation. Although the conductor 205 of the transistor 200*t* and the conductor 205 of the transistor 200*bg* are provided in common, the structure is not limited to this and can be changed appropriately depending on the required design.

In other words, the electrodes of the transistor 200*t* functioning as a transistor are electrically connected to the substrate 20 having conductivity through the capacitor-connected transistor 200*s*, transistor 200*d*, transistor 200*tg*, and transistor 200*bg*.

The transistor 200*s*, the transistor 200*d*, the transistor 200*tg*, and the transistor 200*bg* are preferably provided at the same time as the transistor 200*t*. Note that capacitor-connected transistors that are provided in the same process as and have the same structure as the transistor 200*t* may be used as the transistor 200*s*, the transistor 200*d*, the transistor 200*tg*, and the transistor 200*bg*.

Note that a capacitor may be formed using a film included in the transistor 200*t*. For example, an oxide semiconductor that can be used as the oxide 230 can become a conductor when the electrical resistance is reduced. This can be referred to as an OC (Oxide Conductor) electrode. Accordingly, in the transistor 200*s*, the transistor 200*d*, the transistor 200*tg*, and the transistor 200*bg*, the oxide 230 may be made to be a conductor to be used as an electrode of a capacitor.

Although the oxide 230 is used as an electrode of a capacitor in the drawings, the structure is not limited to this. For example, in the case where a conductor functioning as the source electrode or a conductor functioning as the drain electrode is provided in the transistor 200*t*, the conductor may be used as the electrode.

Structure Example of Semiconductor Device Using Insulating Substrate

Examples of a semiconductor device using a conductive substrate are described below with reference to FIG. 4 and FIG. 5.

Unlike in a semiconductor substrate, it is difficult to provide a buried diode in an insulating substrate. Thus, the transistor 200*t* using an oxide semiconductor and the transistor 200*s*, the transistor 200*d*, and the transistor 200*tg* that function as diode elements or capacitors are formed over the same substrate. Accordingly, the transistor 200*s*, the transistor 200*d*, and the transistor 200*tg* are preferably provided at the same time as the transistor 200*t*. In other words, the transistor 200*s*, the transistor 200*d*, and the transistor 200*tg* are placed in the same layer as the transistor 200*t*.

Note that a plurality of cell arrays (a cell array is a group of a plurality of transistors) can be provided over the conductive substrate. The transistor 200*s*, the transistor 200*d*, the transistor 200*tg*, and the transistor 200*bg* are made to function as diode elements or capacitors depending on the required design. In the case where capacitors are used, for example, the semiconductor device can be used as a power supply circuit or the like because there is no voltage range. Meanwhile, in the case where the response speed of a cell array to be designed is important, diode elements are used. Diode elements or capacitors can be separately formed for each of the cell arrays provided over the same substrate.

Here, in the case where the transistor 200*t* is provided over the insulating substrate, it is difficult to discharge charged charges in the transistor 200*t* even when the substrate 20 is placed on a grounded stage or the like. Thus, it is preferable to electrically connect the transistor 200*tg*, the transistor 200*bg*, the transistor 200*s*, and the transistor 200*d* to a conductor 29 with an adequate size.

For example, the conductor 205 may be provided in common across the transistor 200*t*, the transistor 200*s*, the transistor 200*d*, and the transistor 200*tg* to be used as the conductor 29. In that case, charged charges in the conductor 29 (the conductor 205) may be discharged through a wiring connected to the conductor 205 after fabrication of the semiconductor device.

When an appropriate potential is applied to the conductor 29 (the conductor 205), the conductor 29 (the conductor 205) can be used as a second gate electrode.

Note that examples of an insulating substrate that can be used as the substrate 20 include a glass substrate, a quartz substrate, a sapphire substrate, a stabilized zirconia substrate (an yttria-stabilized zirconia substrate or the like), and a resin substrate.

Although the transistor 200*s* and the transistor 200*d* are formed on the extension of the L length direction of the transistor 200*t* and the transistor 200*tg* is formed on the extension of the W length direction of the transistor 200*t* in FIG. 4 and FIG. 5, the structure is not limited to this and the layout can be changed appropriately depending on the required circuit design.

The transistor 200*s*, the transistor 200*d*, and the transistor 200*tg* can be provided as needed.

Furthermore, each of the transistors 200 is not necessarily provided for the corresponding one transistor 200. The number of the transistors 200 provided for a plurality of transistors 200 may be smaller than that of the transistors 200. For example, in the case where a plurality of transistors 200 arranged in an array have common wirings, at least one or more transistors 200 are necessary for each common wiring.

<<Semiconductor Device 2 with Diode Connection>>

Figure 4A:
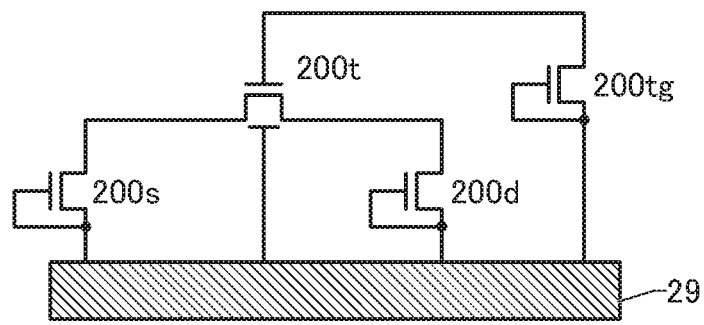
FIGS. 4A to 4C A circuit diagram and cross-sectional views of a semiconductor device of one embodiment of the present invention.

FIG. 4(A) is a circuit diagram of a semiconductor device including the transistor 200*t* of one embodiment of the present invention. The semiconductor device illustrated in FIG. 4(A) includes a plurality of transistors (the transistor 200*tg*, the transistor 200*s*, and the transistor 200*d*) that function as diodes each of which is electrically connected to the corresponding electrode of the transistor 200*t*. The transistor 200*t* is connected to the conductor 29 through each of the diodes.

Note that an insulating substrate is used as the substrate 20, and the conductor 29 is provided over the substrate 20. Charged charges in the transistor 200*t* flow in the direction of the conductor 29 through the transistor 200*tg*, the transistor 200*s*, and the transistor 200*d* functioning as diodes and then are absorbed into the conductor 29. Since the conductor 29 is sufficiently larger than the transistor 200*t*, potential change due to the charges absorbed into the conductor 29 is unlikely to occur. Thus, the charges absorbed into the conductor 29 are retained in the conductor 29.

Figure 4B:
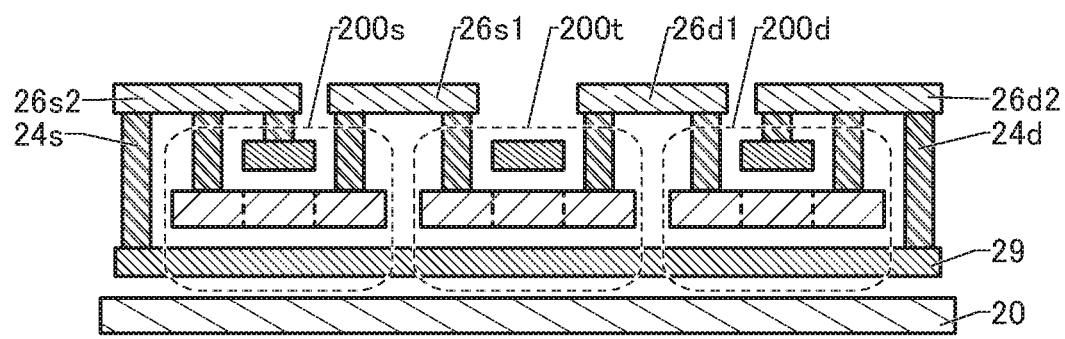
Figure 4C:
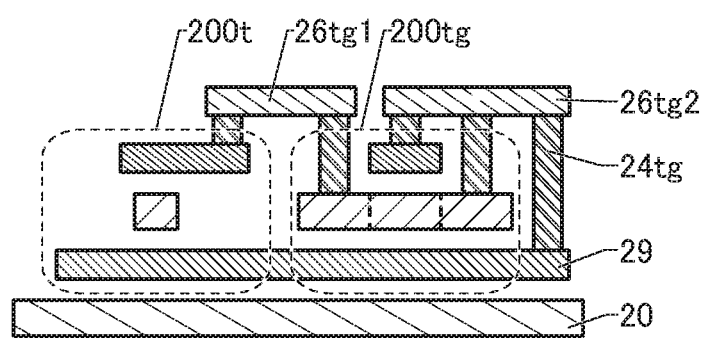

Here, FIG. 4(B) and FIG. 4(C) illustrate examples of cross-sectional views of the semiconductor device including the transistor 200*t* of one embodiment of the present invention illustrated in FIG. 4(A). FIG. 4(B) illustrates a cross-sectional view in the L length direction of the transistor 200*t*, and FIG. 4(C) illustrates a cross-sectional view in the W length direction of the transistor 200*t*. Note that for clarity of the drawings, some components are not illustrated in FIG. 4(B) and FIG. 4(C).

As illustrated in FIG. 4(B) and FIG. 4(C), the semiconductor device includes at least the transistor 200*t* functioning as a transistor. In addition, the semiconductor device includes the transistor 200*s*, the transistor 200*d*, and the transistor 200*tg* functioning as diodes.

The semiconductor device includes a plug electrically connected to one of a source and a drain of the transistor 200*t*, the wiring 26*s*1 electrically connected to the plug, and a plug electrically connected to the wiring 26*s*1 and the other of a source and a drain of the transistor 200*s*. A plug electrically connected to one of the source and the drain of the transistor 200*s*, a plug electrically connected to the conductor 260 of the transistor 200*s*, and the wiring 26*s*2 electrically connected to both of the plugs are included. Furthermore, the plug 24*s* electrically connecting the wiring 26*s*2 and the conductor 29 is included.

The semiconductor device includes a plug electrically connected to the other of the source and the drain of the transistor 200*t*, the wiring 26*d*1 electrically connected to the plug, and a plug electrically connected to the wiring 26*d*1 and one of a source and a drain of the transistor 200*d*. Furthermore, a plug electrically connected to the other of the source and the drain of the transistor 200*d*, a plug electrically connected to the conductor 260 of the transistor 200*d*, and the wiring 26*d*2 electrically connected to both of the plugs are included. Furthermore, the plug 24*d* electrically connecting the wiring 26*d*2 and the conductor 29 is included.

The semiconductor device includes a plug electrically connected to the conductor 260 of the transistor 200*t*, the wiring 26*tg*1 electrically connected to the plug, and a plug electrically connected to the wiring 26*tg*1 and one of a source and a drain of the transistor 200*tg*. Furthermore, a plug electrically connected to the other of the source and the drain of the transistor 200*tg*, a plug electrically connected to the conductor 260 of the transistor 200*tg*, and the wiring 26*tg*2 electrically connected to both of the plugs are included. Furthermore, the plug 24*tg* electrically connecting the wiring 26*tg*2 and the conductor 29 is included.

In other words, the electrodes of the transistor 200*t* functioning as a transistor are electrically connected to the conductor 29 through the diode-connected transistor 200*s*, transistor 200*d*, and transistor 200*tg*.

Note that a transistor that is provided in the same process as and has the same structure as the transistor 200*s*, the transistor 200*d*, and the transistor 200*tg* functioning as diode elements is preferably used as the transistor 200*t* using an oxide semiconductor.

<<Semiconductor Device 2 with Capacitor Connection>>

Figure 5A:
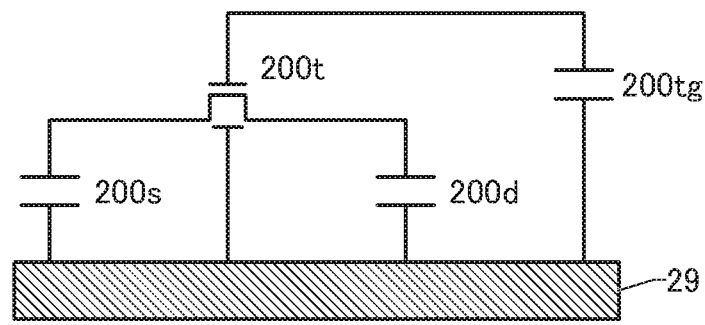
FIGS. 5A to 5C A circuit diagram and cross-sectional views of a semiconductor device of one embodiment of the present invention.

FIG. 5(A) is a circuit diagram of a semiconductor device including the transistor 200*t* of one embodiment of the present invention. The semiconductor device illustrated in FIG. 5(A) includes a plurality of transistors (the transistor 200*tg*, the transistor 200*s*, and the transistor 200*d*) that function as capacitors each of which is electrically connected to the corresponding electrode of the transistor 200*t*. The transistor 200*t* is connected to the conductor 29 through each of the capacitors.

Charged charges in the transistor 200*t* are absorbed into the transistor 200*tg*, the transistor 200*s*, and the transistor 200*d* functioning as protection capacitors. Since the conductor 29 is sufficiently larger than the transistor 200*t*, potential change due to the charges absorbed into the conductor 29 is unlikely to occur. Thus, the charges absorbed into the conductor 29 are retained in the conductor 29.

Note that the potentials of the transistor 200*tg*, the transistor 200*s*, and the transistor 200*d* are preferably equal to one another. For that purpose, the transistor 200*tg*, the transistor 200*s*, and the transistor 200*d* functioning as capacitors are preferably designed to have capacitance values as large as possible. Moreover, a conductor electrically connected to the other electrodes of the transistor 200tg, the transistor 200s, and the transistor 200d functioning as capacitors is preferably provided in common.

Figure 5B:
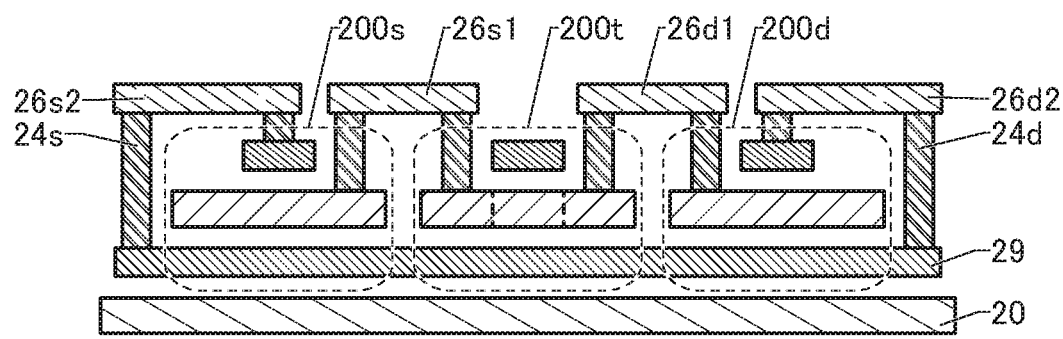
Figure 5C:
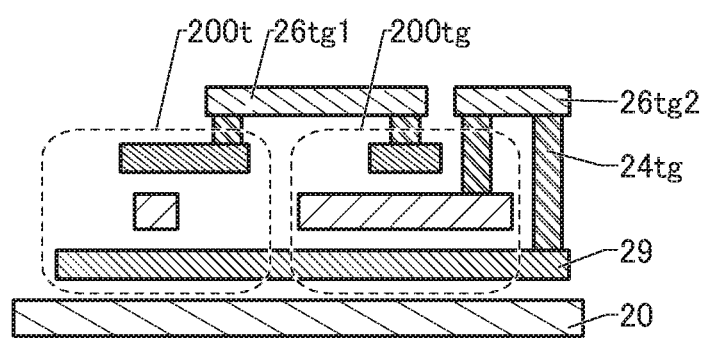
Figure 6A:
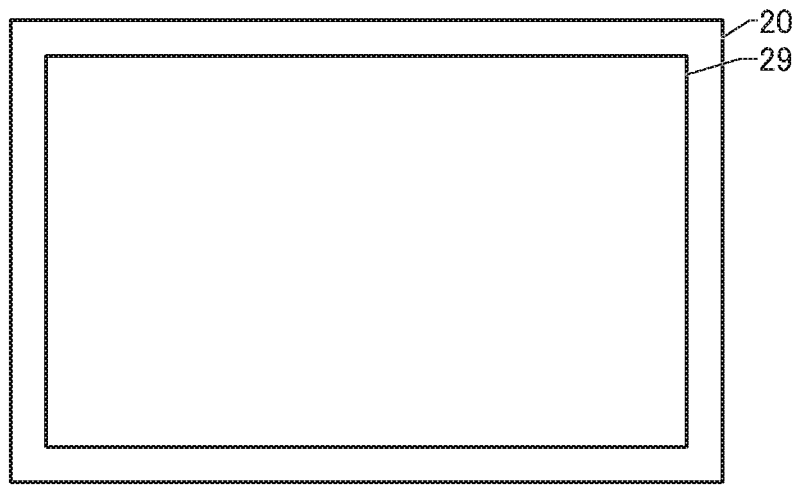
FIGS. 6A to 6D Top views and cross-sectional views of a semiconductor device of one embodiment of the present invention.
Figure 6B:
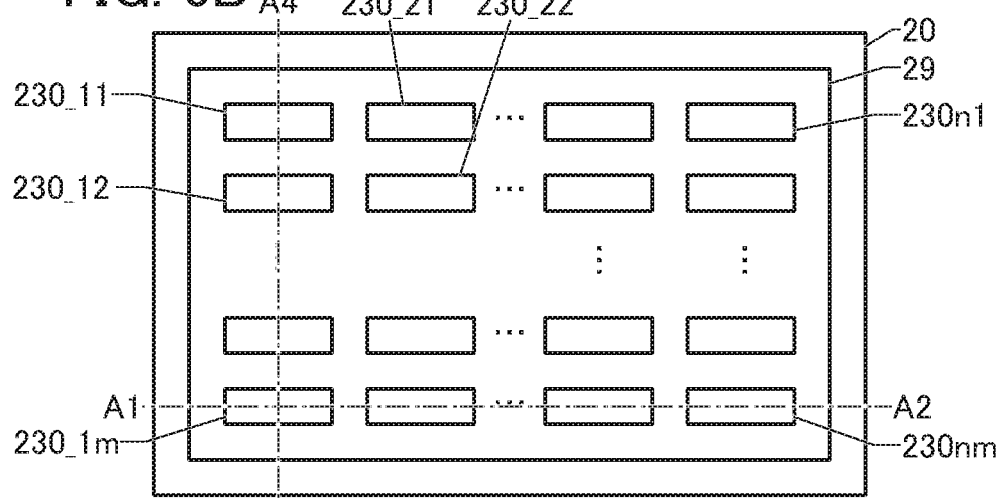
Figure 6C:
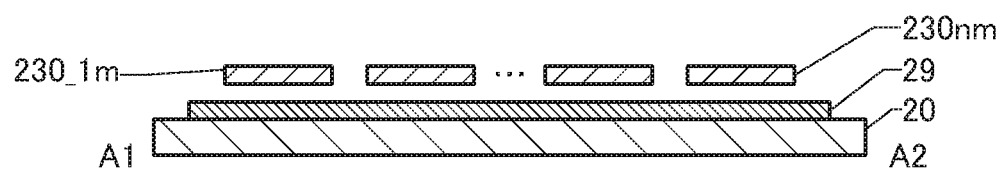
Figure 6D:
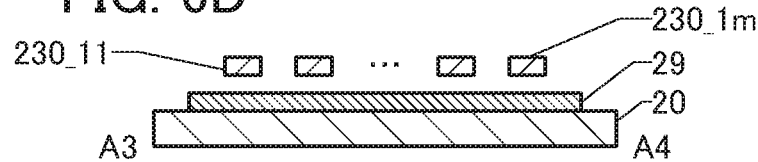
Figure 7A:
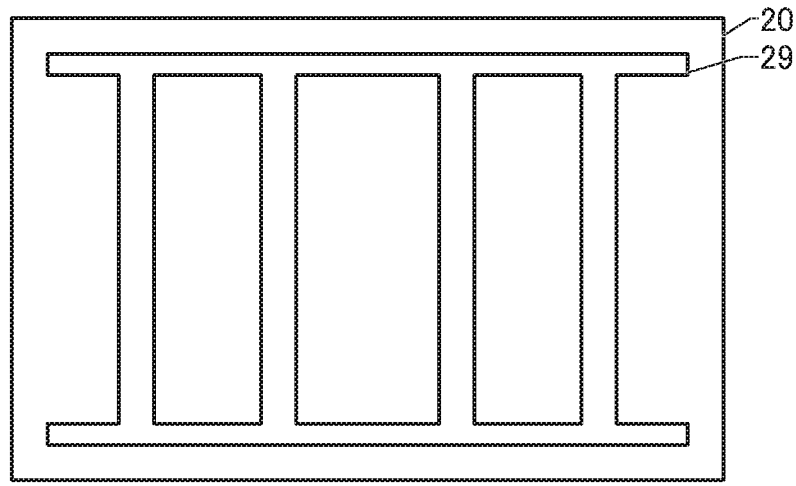
FIGS. 7A to 7D Top views and cross-sectional views of a semiconductor device of one embodiment of the present invention.
Figure 7B:
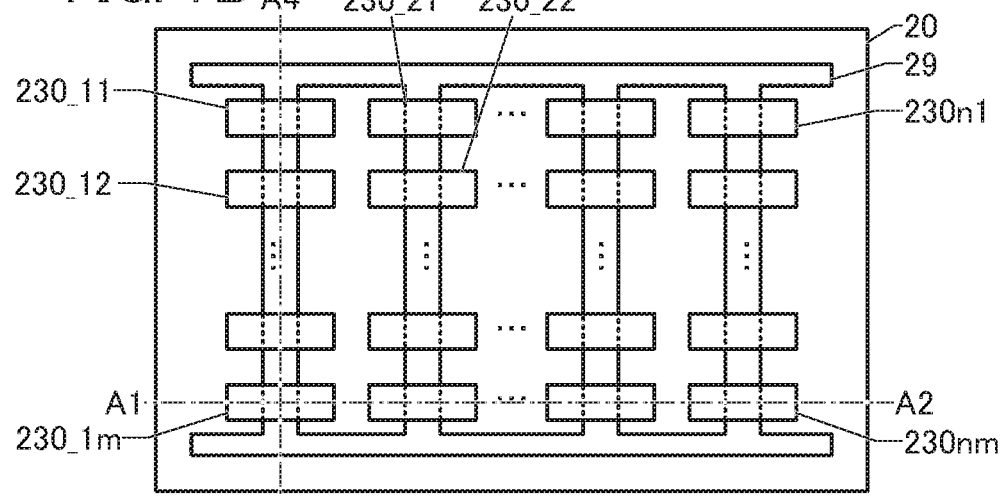
Figure 7C:
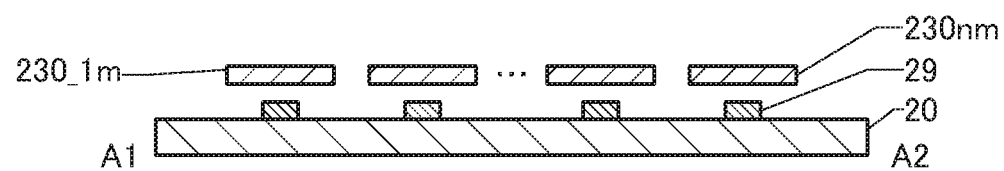
Figure 7D:
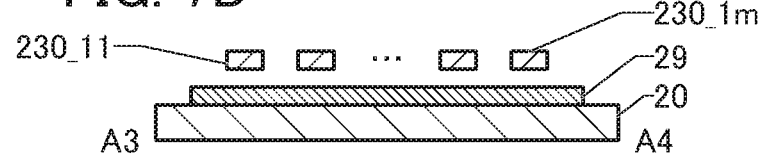
Figure 8A:
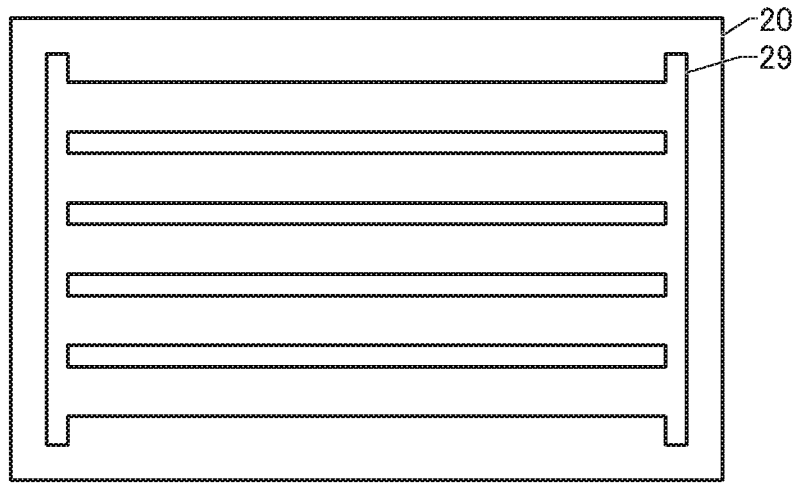
FIGS. 8A to 8D Top views and cross-sectional views of a semiconductor device of one embodiment of the present invention.
Figure 8B:
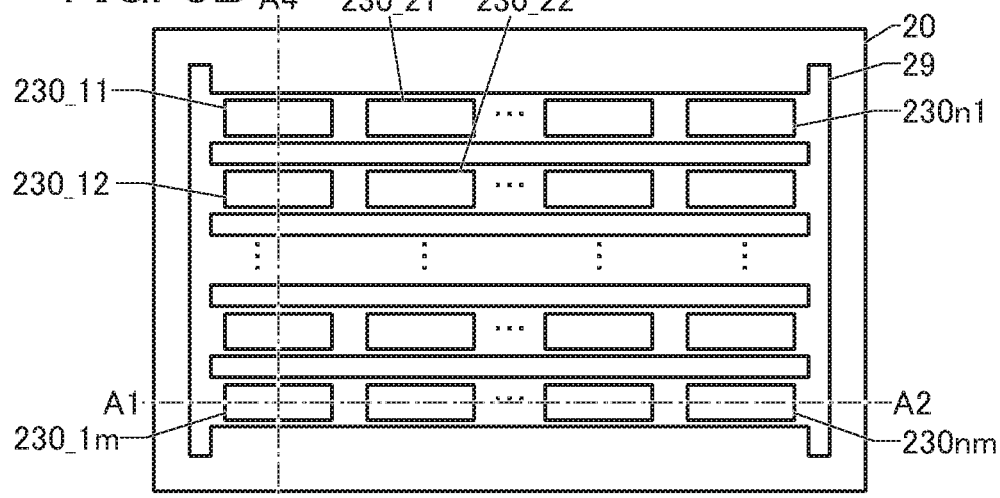
Figure 8C:
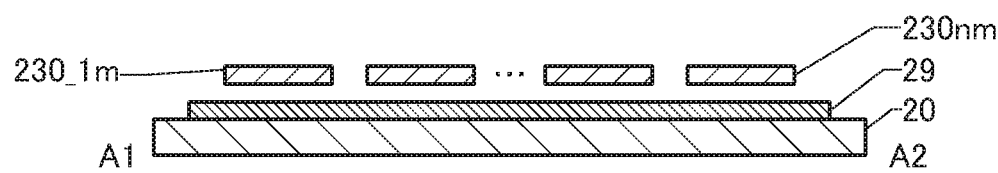
Figure 8D:
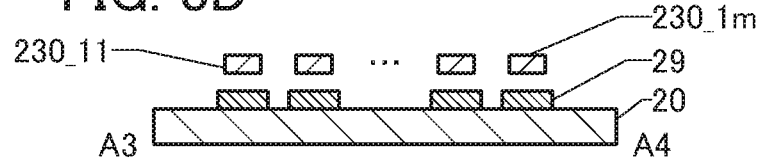

Here, FIG. 5(B) and FIG. 5(C) illustrate examples of cross-sectional views of the semiconductor device including the transistor 200t of one embodiment of the present invention illustrated in FIG. 5(A). FIG. 5(B) illustrates a cross-sectional view in the L length direction of the transistor 200t, and FIG. 5(C) illustrates a cross-sectional view in the W length direction of the transistor 200t. Note that for clarity of the drawings, some components are not illustrated in FIG. 5(B) and FIG. 5(C).

As illustrated in FIG. 5(B) and FIG. 5(C), the semiconductor device includes at least the transistor 200t functioning as a transistor. In addition, the transistor 200s, the transistor 200d, and the transistor 200tg functioning as capacitors are included.

The semiconductor device includes a plug electrically connected to one of a source and a drain of the transistor 200t, the wiring 26s1 electrically connected to the plug, and a plug electrically connected to the wiring 26s1 and the oxide 230 of the transistor 200s. Furthermore, a plug electrically connected to the conductor 260 of the transistor 200s, and the wiring 26s2 electrically connected to the plug are included. Furthermore, the plug 24s electrically connecting the wiring 26s2 and the conductor 29 is included.

The semiconductor device includes a plug electrically connected to the other of the source and the drain of the transistor 200t, the wiring 26d1 electrically connected to the plug, and a plug electrically connected to the wiring 26d1 and the oxide 230 of the transistor 200d. Furthermore, a plug electrically connected to the conductor 260 of the transistor 200d, and the wiring 26d2 electrically connected to the plug are included. Furthermore, the plug 24d electrically connecting the wiring 26d2 and the conductor 29 is included.

The semiconductor device includes a plug electrically connected to the conductor 260 of the transistor 200t, the wiring 26tg1 electrically connected to the plug, and a plug electrically connected to the wiring 26tg1 and the conductor 260 of the transistor 200tg. Furthermore, a plug electrically connected to the other of a source and a drain of the transistor 200tg, and the wiring 26tg2 electrically connected to the plug are included. Furthermore, the plug 24tg electrically connecting the wiring 26tg2 and the conductor 29 is included.

In other words, the electrodes of the transistor 200t functioning as a transistor are electrically connected to the capacitor-connected transistor 200s, transistor 200d, and transistor 200tg and the conductor 29.

The transistor 200s, the transistor 200d, and the transistor 200tg are preferably provided at the same time as the transistor 200t. Note that capacitor-connected transistors that are provided in the same process as and have the same structure as the transistor 200t may be used as the transistor 200s, the transistor 200d, and the transistor 200tg.

Note that a capacitor may be formed using a film included in the transistor 200t. For example, an oxide semiconductor that can be used as the oxide 230 can become a conductor when the electrical resistance is reduced. This can be referred to as an OC (Oxide Conductor) electrode. Accordingly, in the transistor 200s, the transistor 200d, and the transistor 200tg, the oxide 230 may be made to be a conductor to be used as an electrode of a capacitor.

Although the oxide 230 is used as an electrode of a capacitor in the drawings, the structure is not limited to this. For example, in the case where a conductor functioning as the source electrode or a conductor functioning as the drain electrode is provided in the transistor 200t, the conductor may be used as the electrode.

In the case of the circuit configuration illustrated in FIG. 5(A), the conductor 29 (the conductor 205) can be used as a second gate electrode when respective voltages are applied to a first gate electrode, the source electrode, and the drain electrode of the transistor 200t after a second gate voltage is applied to the conductor 29 (the conductor 205), for example.

According to the above, providing a protection diode element or a protection capacitor over the same substrate as a transistor element improves the yield; thus, the productivity of the semiconductor devices can be improved.

<<Semiconductor Device Including Common Conductor Below a Plurality of Transistors>>

Specific layout examples of a semiconductor device including the conductor 29 provided over an insulating substrate are described below with reference to FIG. 6 to FIG. 11.

As described above, when the conductor 29 that retains charges is provided over the insulating substrate, charged charges in the transistor 200t can be absorbed into the conductor 29 or a protection capacitor and fixed thereto.

Note that the conductor 29 is preferably made sufficiently larger than the transistor. The larger the conductor 29 is, the less likely potential change is to occur even when the amount of absorbed charges is large. Thus, making the conductor 29 to have an adequate size can provide a highly reliable semiconductor device.

In particular, the case where the conductor 205 is provided in common across the transistor 200t, the transistor 200s, the transistor 200d, and the transistor 200tg to be used as the conductor 29 is preferable because the conductor 29 (the conductor 205) can be used as second gate electrodes when an appropriate potential is applied to the conductor 29 (the conductor 205).

Here, FIG. 6(A) to FIG. 8(A) illustrate top views in a state in which the conductor 29 is provided over the substrate 20, and FIG. 6(B) to FIG. 8(B) illustrate top views in a state in which the conductor 29 is provided over the substrate 20 and a plurality of oxides 230 are provided in a matrix over the conductor 29. FIG. 6(C) to FIG. 8(C) are cross-sectional views of portions taken along dashed-dotted lines A1-A2 in FIG. 6(B) to FIG. 8(B). FIG. 6(D) to FIG. 8(D) are cross-sectional views of portions taken along dashed-dotted lines A3-A4 in FIG. 6(B) to FIG. 8(B).

Furthermore, (B) of each diagram illustrates an example in which a plurality of oxides 230 are provided in a matrix of n rows×m columns over the conductor 29. In the diagrams, the addresses of the matrix are added to the ends of the numerals of the oxides 230. Note that the plurality of oxides 230 are not necessarily arranged in a matrix. An efficient layout for the required usage of the semiconductor device is appropriately employed.

For example, a one-plane conductor 29 that is in common with a plurality of transistors can be used as illustrated in FIG. 6. When the conductor 29 is provided on the entire surface, wiring resistance can be reduced.

Alternatively, as illustrated in FIG. 7, the conductor 29 may have a shape in which n linear regions that overlap with m oxides 230 are included and the n linear regions are electrically connected to one another. It is particularly preferable that the linear regions of the conductor 29 overlap with channel formation regions of the oxides 230. With this structure, the probability of occurrence of unnecessary parasitic capacitance around the transistors in the case where the conductor 29 is used as the conductor 205 functioning as the second gate electrodes can be reduced.

Alternatively, as illustrated in FIG. 8, the conductor 29 may have a shape in which m linear regions that overlap with n oxides 230 are included and the m linear regions are electrically connected to one another. For example, the linear regions of the conductor 29 may be provided in regions overlapping with the oxides 230.

Figure 9A:
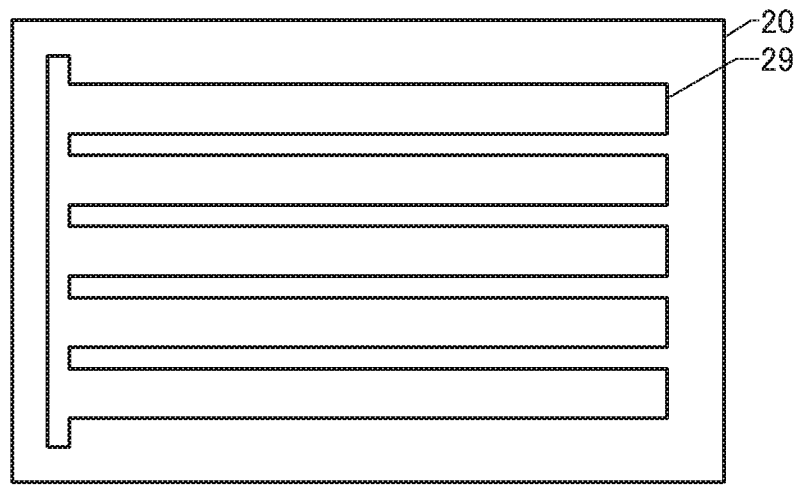
FIGS. 9A to 9C Top views of semiconductor devices of one embodiment of the present invention.
Figure 9B:
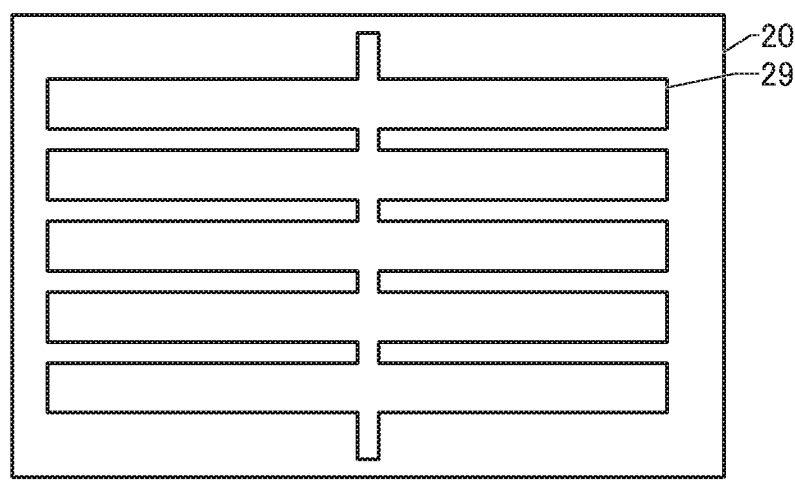
Figure 9C:
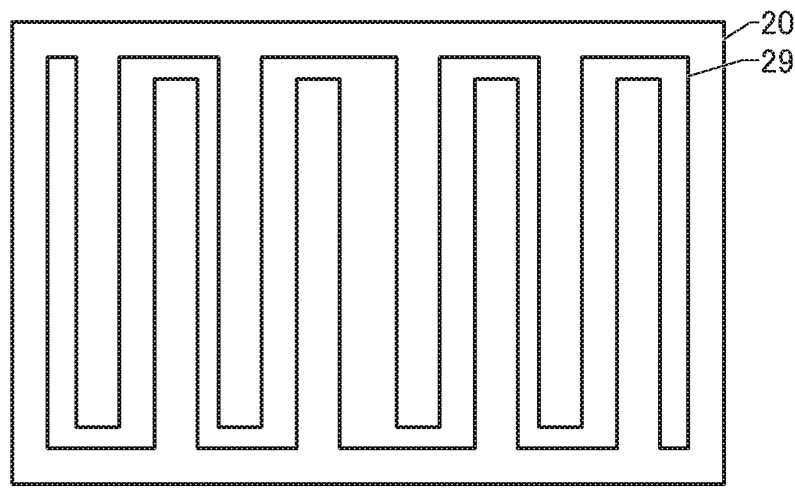

FIG. 9(A), FIG. 9(B), and FIG. 9(C) illustrate top views in a state in which the conductor 29 is provided over the substrate 20.

As illustrated in FIG. 9(A) and FIG. 9(B), the conductor 29 may have a comb-teeth-shaped region. As illustrated in FIG. 9(B), the conductor 29 having linear regions does not necessary have a region where the linear regions are electrically connected to one another in an end region, and may have a region where the linear regions are electrically in contact with one another in any region of the conductor 29. Alternatively, for example, the conductor 29 may have a shape that can be drawn with one stroke. As an example, a shape in which U-shapes are connected as illustrated in FIG. 9(C) may be used.

Figure 10A:
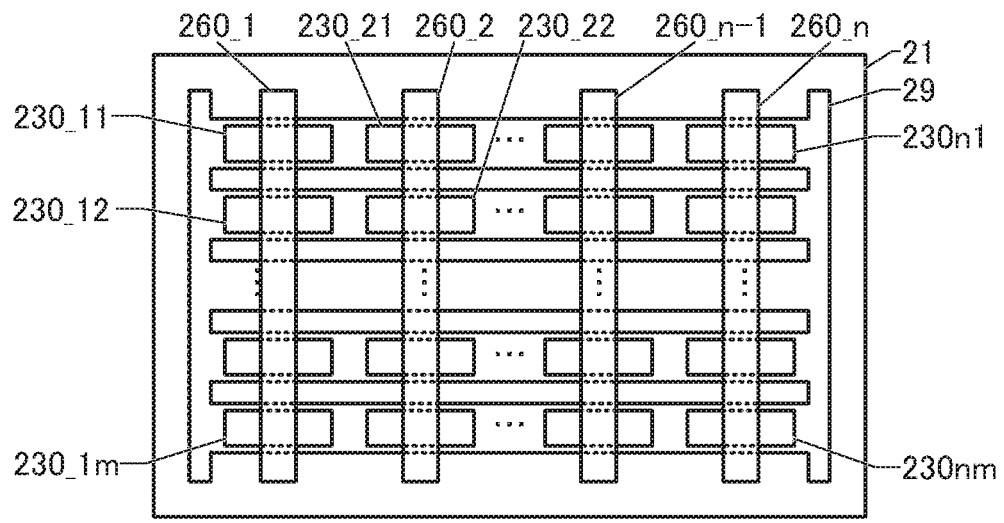
FIGS. 10A to 10C Top views of semiconductor devices of one embodiment of the present invention.
Figure 10B:
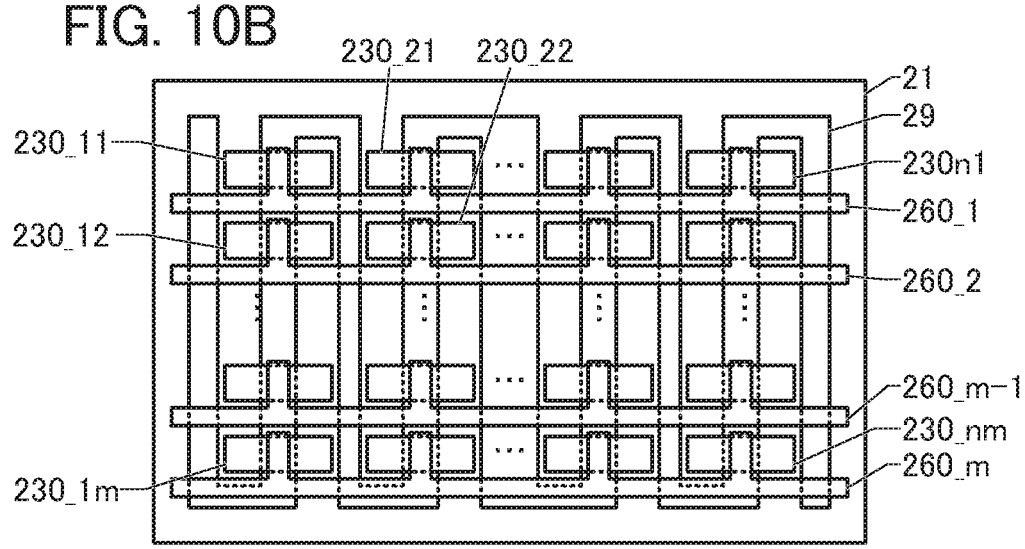
Figure 10C:
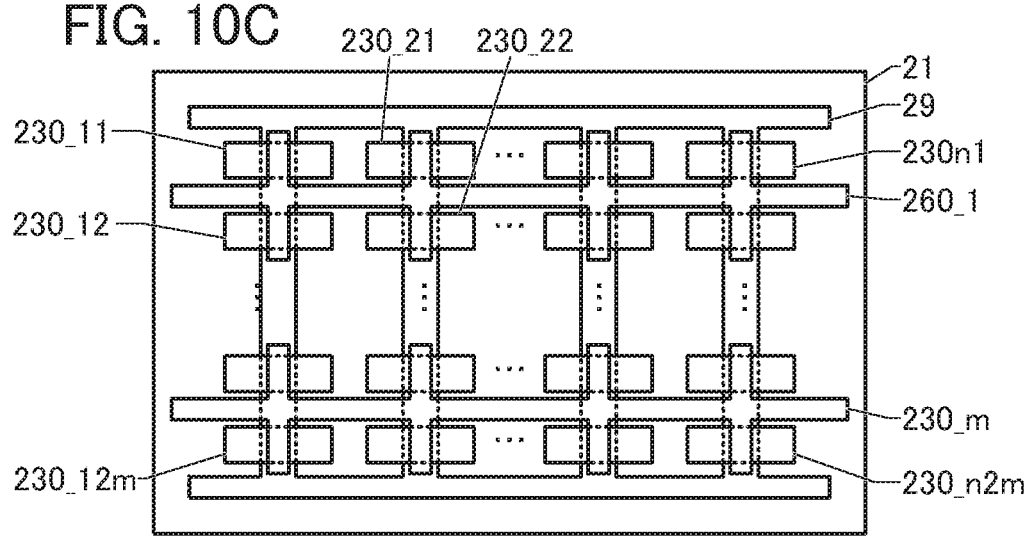

Here, FIG. 10(A), FIG. 10(B), and FIG. 10(C) illustrate top views in a state in which the conductor 29 is provided over the substrate 20, a plurality of oxides 230 arranged in a matrix are provided over the conductor 29, and a plurality of conductors 260 are provided over the plurality of oxides 230.

For example, it is preferable that a plurality of conductors 260 (a conductor 260_1 to a conductor 260_n: n is a natural number) be provided in the form of stripes so as to cross linear regions included in the conductor 29 as illustrated in FIG. 10(A). It is particularly preferable that the conductor 29, channel formation regions of the oxides 230, and channel formation regions of the oxides 230 overlap with each other. With this structure, the probability of occurrence of wiring resistance or parasitic capacitance between the conductors 260 and the conductor 29 can be reduced.

In the case where linear regions included in the conductor 29 and the oxides 230 are placed on straight lines that cross each other, for example, a plurality of conductors 260 (the conductor 260_1 to the conductor 260_n) may include regions parallel to the oxides 230 and regions crossing the oxides 230. Specifically, the conductors 260 include protruding regions that extend from linear regions as illustrated in FIG. 10(B). The peninsular regions overlap with the channel formation regions of the oxides 230. With this structure, the probability of occurrence of wiring resistance or parasitic capacitance between the conductors 260 and the conductor 29 can be reduced.

Alternatively, a structure in which one of a plurality of conductors 260 (the conductor 260_1 to the conductor 260_n) is provided for every two rows (two columns) of the oxides 230 may be employed, for example. Specifically, the conductors 260 include regions with a shape in which a straight line and a straight line cross each other (also referred to as a cross) as illustrated in FIG. 10(B). With this structure, the probability of occurrence of wiring resistance or parasitic capacitance between the conductors 260 and the conductor 29 can be reduced.

Figure 11A:
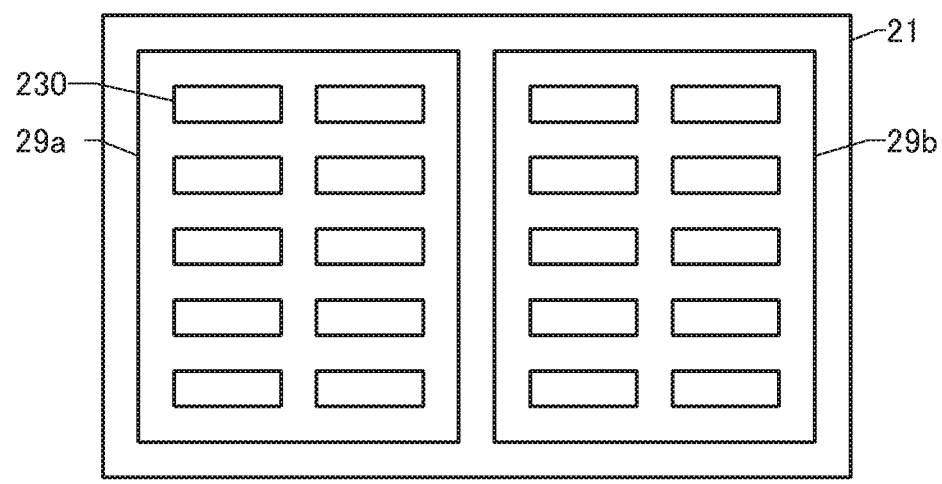
Figure 11B:
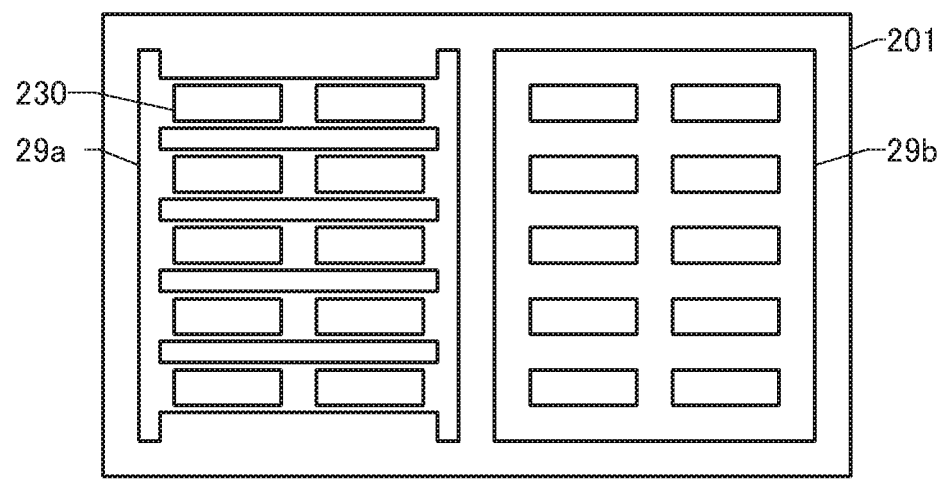

FIG. 11 illustrates top views in a state in which the conductor 29 is provided over the substrate, and a plurality of oxides 230 arranged in a matrix are provided over the conductor 29. As illustrated in FIG. 11(A) and FIG. 11(B), two or more conductors 29 (e.g., a conductor 29a and a conductor 29b) may be included over the substrate 20. Note that a plurality of transistors arranged in an array can be provided over the conductors 29. The conductors 29 do not necessarily have the same shape. As illustrated in FIG. 11(B), the shapes may be different from each other depending on the design.

Note that the structures described in Structure example of semiconductor device using conductive substrate and Structure example of semiconductor device using insulating substrate may be used over a semiconductor substrate. The structures described in Structure example of semiconductor device using insulating substrate may be used over a conductive substrate.

A semiconductor device including a transistor with a high on-state current can be provided. Alternatively, a semiconductor device including a transistor with a low off-state current can be provided. Alternatively, a semiconductor device that has small variations in electrical characteristics, stable electrical characteristics, and high reliability can be provided. An oxide semiconductor can be deposited by a sputtering method or the like, and thus can be used for a transistor included in a highly integrated semiconductor device.

The composition, structure, method, and the like described above in this embodiment can be used in an appropriate combination with the compositions, structures, methods, and the like described in the other embodiments.

Embodiment 2

In this embodiment, structure examples of the transistor described in the above embodiment are described.

Transistor Structure Example 1

Figure 12A:
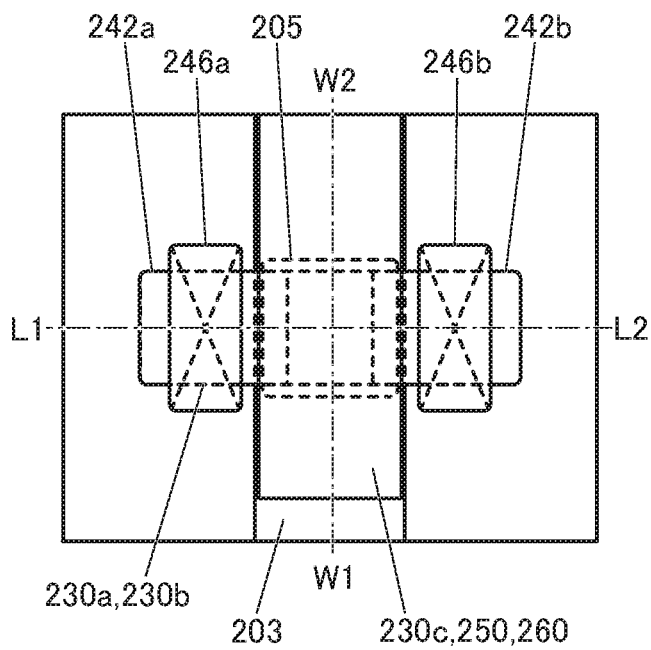
FIGS. 12A to 12C Diagrams illustrating a structure example of a transistor of one embodiment of the present invention.
Figure 12C:
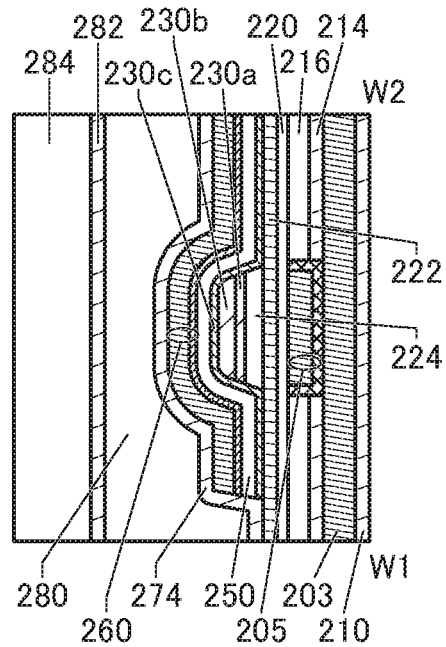
Figure 12B:
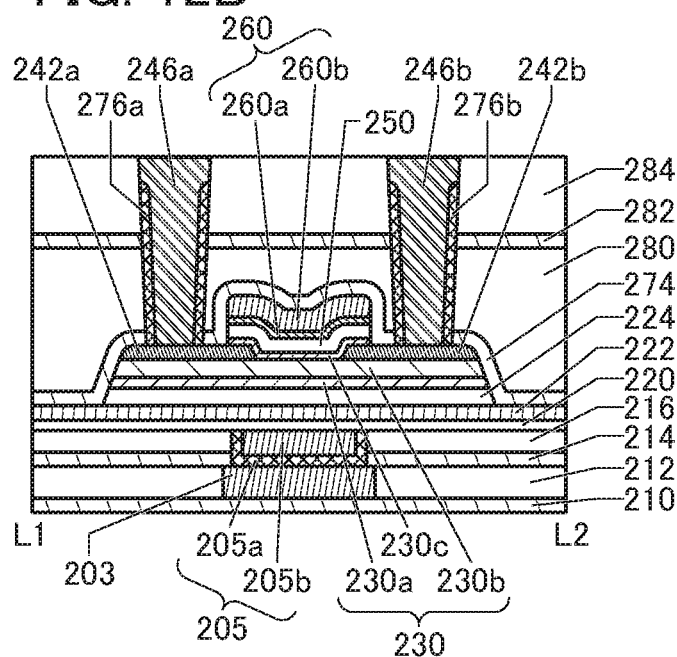

A structure example of a transistor 200A is described with reference to FIGS. 12(A) to 12(C). FIG. 12(A) is a top view of the transistor 200A. FIG. 12(B) is a cross-sectional view of a portion indicated by a dashed-dotted line L1-L2 in FIG. 12(A). FIG. 12(C) is a cross-sectional view of a portion indicated by a dashed-dotted line W1-W2 in FIG. 12(A). Note that for clarification of the drawing, some components are not illustrated in the top view of FIG. 12(A).

FIGS. 12(A) to 12(C) illustrate the transistor 200A and an insulator 210, an insulator 212, an insulator 214, an insulator 216, an insulator 280, an insulator 282, and an insulating layer 284 that function as interlayer films. In addition, a conductor 246 (a conductor 246a and a conductor 246b) that is electrically connected to the transistor 200A and functions as a contact plug, and a conductive layer 203 functioning as a wiring are illustrated.

The transistor 200A includes the conductor 260 (a conductor 260a and a conductor 260b) functioning as a first gate (also referred to as top gate) electrode; the conductor 205 (a conductor 205a and a conductor 205b) functioning as a second gate (also referred to as bottom gate) electrode; an insulator 250 functioning as a first gate insulating layer; an insulating layer 220, an insulator 222, and an insulator 224 functioning as a second gate insulating layer; the oxide 230 (an oxide 230a, an oxide 230b, and an oxide 230c) including a region where a channel is formed; a conductor 242a functioning as one of a source and a drain; a conductor 242b functioning as the other of the source and the drain; and an insulator 274.

The insulator 210 and the insulator 212 function as interlayer films.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 210 preferably functions as a barrier film that inhibits entry of impurities such as water or hydrogen into the transistor 200A from the substrate side. Accordingly, for the insulator 210, it is preferable to use an insulating material that has a function of inhibiting diffusion of impurities such as a hydrogen atom, a hydrogen molecule, a water molecule, and a copper atom (through which the above impurities do not easily pass). Alternatively, it is preferable to use an insulating material that has a function of inhibiting diffusion of oxygen (e.g., at least one of oxygen atoms, oxygen molecules, and the like) (through which the above oxygen does not easily pass). Moreover, aluminum oxide or silicon nitride, for example, may be used for the insulator 210. This structure can inhibit diffusion of impurities such as water or hydrogen to the transistor 200A side from the substrate side of the insulator 210.

For example, the permittivity of the insulator 212 is preferably lower than that of the insulator 210. When a material with a low permittivity is used for the interlayer film, the parasitic capacitance generated between wirings can be reduced.

The conductive layer 203 is formed to be embedded in the insulator 212. Here, the level of the top surface of the conductive layer 203 and the level of the top surface of the insulator 212 can be substantially the same. Note that although a structure in which the conductive layer 203 is a single layer is illustrated, the present invention is not limited thereto. For example, the conductive layer 203 may have a stacked-layer structure of two or more layers. Note that for the conductive layer 203, a conductive material that has high conductivity and contains tungsten, copper, or aluminum as its main component is preferably used.

In the transistor 200A, the conductor 260 sometimes functions as a first gate electrode. The conductor 205 sometimes functions as a second gate electrode. In that case, the threshold voltage of the transistor 200A can be controlled by changing a potential applied to the conductor 205 independently of a potential applied to the conductor 260. In particular, the threshold voltage of the transistor 200A can be higher than 0 V and the off-state current can be reduced by applying a negative potential to the conductor 205. Thus, a drain current at the time when a potential applied to the conductor 260 is 0 V can be lower in the case where a negative potential is applied to the conductor 205 than in the case where a negative potential is not applied.

For example, when the conductor 205 and the conductor 260 overlap with each other, in the case where a potential is applied to the conductor 260 and the conductor 205, an electric field generated from the conductor 260 and an electric field generated from the conductor 205 are connected and can cover a channel formation region formed in the oxide 230.

That is, the channel formation region can be electrically surrounded by the electric field of the conductor 260 functioning as the first gate electrode and the electric field of the conductor 205 functioning as the second gate electrode. In this specification, a transistor structure in which a channel formation region is electrically surrounded by electric fields of a first gate electrode and a second gate electrode is referred to as a surrounded channel (S-channel) structure.

Like the insulator 210 or the insulator 212, the insulator 214 and the insulator 216 function as interlayer films. For example, the insulator 214 preferably functions as a barrier film that inhibits entry of impurities such as water or hydrogen into the transistor 200A from the substrate side. This structure can inhibit diffusion of impurities such as water or hydrogen to the transistor 200A side from the substrate side of the insulator 214. Moreover, for example, the insulator 216 preferably has a lower permittivity than the insulator 214. When a material with a low permittivity is used for the interlayer film, the parasitic capacitance generated between wirings can be reduced.

In the conductor 205 functioning as the second gate electrode, the conductor 205a is formed in contact with an inner wall of an opening in the insulator 214 and the insulator 216, and the conductor 205b is formed further inside. Here, the top surfaces of the conductor 205a and the conductor 205b and the top surface of the insulator 216 can be substantially level with each other. Although the transistor 200A having a structure in which the conductor 205a and the conductor 205b are stacked is illustrated, the present invention is not limited thereto. For example, the conductor 205 may have a single-layer structure or a stacked-layer structure of three or more layers.

Here, for the conductor 205a, a conductive material that has a function of inhibiting diffusion of impurities such as a hydrogen atom, a hydrogen molecule, a water molecule, and a copper atom (through which the above impurities are less likely to pass) is preferably used. Alternatively, it is preferable to use a conductive material that has a function of inhibiting diffusion of oxygen (e.g., at least one of oxygen atoms, oxygen molecules, and the like) (the above oxygen is less likely to pass). Note that in this specification, a function of inhibiting diffusion of impurities or oxygen means a function of inhibiting diffusion of any one or all of the impurities and the oxygen.

For example, when the conductor 205a has a function of inhibiting diffusion of oxygen, a reduction in conductivity of the conductor 205b due to oxidation can be inhibited.

In the case where the conductor 205 doubles as a wiring, the conductor 205b is preferably formed using a conductive material that has high conductivity and contains tungsten, copper, or aluminum as its main component. In that case, the conductive layer 203 is not necessarily provided. Note that the conductor 205b is illustrated as a single layer but may have a stacked-layer structure, for example, a stack of any of the above conductive materials and titanium or titanium nitride.

The insulating layer 220, the insulator 222, and the insulator 224 function as a second gate insulating layer.

Here, it is preferable that oxygen be released from the insulator 224 in contact with the oxide 230 by heating. In this specification, oxygen that is released by heating is referred to as excess oxygen in some cases. For example, silicon oxide, silicon oxynitride, or the like is used for the insulator 224 as appropriate. When an insulator containing oxygen is provided in contact with the oxide 230, oxygen vacancies in the oxide 230 can be reduced and the reliability of the transistor 200A can be improved.

As the insulator 224, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0\times10^{19}$ atoms/cm³ or greater than or equal to $3.0\times10^{20}$ atoms/cm³ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

The insulator 222 preferably has a barrier property. The insulator 222 having a barrier property functions as a layer that inhibits entry of impurities such as hydrogen into the transistor 200A from the surroundings of the transistor 200A.

For the insulator 222, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current may arise because of a thinner gate insulating layer. When a high-k material is used for an insulator functioning as the gate insulating layer, a gate potential during operation of the transistor can be reduced while the physical thickness is maintained.

For example, it is preferable that the insulating layer 220 be thermally stable. For example, silicon oxide and silicon oxynitride, which have thermal stability, are suitable. In addition, a combination of an insulator of a high-k material, silicon oxide or silicon oxynitride, and the insulator 222 allows the insulator 222 to have a stacked-layer structure with thermal stability and a high dielectric constant.

Note that the second gate insulating layer is shown to have a three-layer stacked structure in FIG. 12, but may have a single-layer structure or a stacked-layer structure of two or more layers. In that case, without limitation to a stacked-layer structure formed of the same material, a stacked-layer structure formed of different materials may be employed.

The oxide 230 including a region functioning as the channel formation region includes the oxide 230a, the oxide 230b over the oxide 230a, and the oxide 230c over the oxide 230b. Including the oxide 230a under the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c. As the oxide 230, a later-described oxide semiconductor, which is one kind of metal oxide, can be used.

The transistor 200A illustrated in FIG. 12 includes regions where the conductors 242 (the conductor 242a and the conductor 242b) overlap with the oxide 230c, the insulator 250, and the conductor 260. With this structure, a transistor having a high on-state current can be provided. Moreover, a transistor having high controllability can be provided.

One of the conductors 242 functions as a source electrode and the other functions as a drain electrode.

For the conductor 242, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high.

Although FIG. 12 illustrates the conductor 242 with a single-layer structure, a stacked-layer structure of two or more layers may be employed. For example, it is preferable to stack a tantalum nitride film and a tungsten film. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

A barrier layer may be provided over the conductor 242. The barrier layer is preferably formed using a material having a barrier property against oxygen or hydrogen. This structure can inhibit oxidation of the conductor 242 at the time of deposition of the insulator 274.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 242 can be expanded. For example, a material having a low oxidation resistance and high conductivity, such as tungsten or aluminum, can be used for the conductor 242. Moreover, for example, a conductor that can be easily deposited or processed can be used.

The insulator 250 functions as the first gate insulating layer.

As miniaturization and high integration of transistors progress, a problem such as leakage current may arise because of thinner gate insulating layers. In that case, the insulator 250 may have a stacked-layer structure like the second gate insulating layer. When the insulator functioning as the gate insulating layer has a stacked-layer structure of a high-k material and a thermally stable material, a gate potential during operation of the transistor can be reduced while the physical thickness is maintained. Furthermore, the stacked-layer structure can be thermally stable and have a high dielectric constant.

The conductor 260 functioning as a first gate electrode includes the conductor 260a and the conductor 260b over the conductor 260a. Like the conductor 205a, the conductor 260a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting oxygen diffusion, the range of choices for the material of the conductor 260b can be expanded. That is, the conductor 260a inhibits oxidation of the conductor 260b, thereby preventing the decrease in conductivity.

As a conductive material having a function of inhibiting diffusion of oxygen, for example, tantalum, tantalum nitride, ruthenium, or ruthenium oxide is preferably used. For the conductor 260a, the oxide semiconductor that can be used as the oxide 230 can be used. In that case, when the conductor 260b is deposited by a sputtering method, the conductor 260a can have a reduced electric resistance to be a conductive layer. This can be referred to as an OC (Oxide Conductor) electrode.

The conductor 260 functions as a wiring and thus is preferably formed using a conductor having high conductivity. For example, a conductive material containing tungsten, copper, or aluminum as its main component can be used for the conductor 260b. The conductor 260b may have a stacked-layer structure, for example, a stack of any of the above conductive materials and titanium or titanium nitride.

The insulator 274 is preferably provided to cover the top surface and a side surface of the conductor 260, a side surface of the insulator 250, and the side surface of the oxide 230c. For the insulator 274, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 274 can inhibit oxidation of the conductor 260. Moreover, the insulator 274 can inhibit diffusion of impurities such as water or hydrogen contained in the insulator 280 into the transistor 200A.

The insulator 280, the insulator 282, and the insulating layer 284 function as interlayer films.

Like the insulator 214, the insulator 282 preferably functions as a barrier insulating film that inhibits entry of impurities such as water or hydrogen into the transistor 200A from the outside.

Like the insulator 216, the insulator 280 and the insulating layer 284 preferably have a lower permittivity than the insulator 282. When a material with a low permittivity is used for the interlayer films, the parasitic capacitance generated between wirings can be reduced.

The transistor 200A may be electrically connected to another component through a plug or a wiring such as the conductor 246 embedded in the insulator 280, the insulator 282, and the insulating layer 284.

As a material for the conductor 246, a conductive material such as a metal material, an alloy material, a metal nitride material, or a metal oxide material can be used as a single layer or stacked layers, as in the conductor 205. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 246 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is maintained.

An insulator 276 (an insulator 276a and an insulator 276b) having a barrier property may be provided between the conductor 246 and the insulator 280. Providing the insulator 276 can prevent oxygen in the insulator 280 from reacting with the conductor 246 and oxidizing the conductor 246.

Furthermore, with the insulator 276 having a barrier property, the range of choices for the material of the conductor used as the plug or the wiring can be expanded. The use of a metal material having an oxygen absorbing property and high conductivity for the conductor 246, for example, can provide a semiconductor device with low power consumption. Specifically, a material having a low oxidation resistance and high conductivity, such as tungsten or aluminum, can be used. Moreover, for example, a conductor that can be easily deposited or processed can be used.

With the above structure, a semiconductor device including a transistor with a high on-state current can be provided. Alternatively, a semiconductor device including a transistor with a low off-state current can be provided. Alternatively, a semiconductor device that has small variations in electrical characteristics, stable electrical characteristics, and high reliability can be provided.

<Materials>

[Substrate]

Although there is no particular limitation on a material used for a substrate, it is required to have heat resistance high enough to withstand at least heat treatment performed later. For example, a single crystal semiconductor substrate or a polycrystalline semiconductor substrate using silicon, silicon carbide, or the like as a material or a compound semiconductor substrate using silicon germanium or the like as a material can be used as the substrate. Furthermore, an SOI substrate, a semiconductor substrate on which a semiconductor element such as a strained transistor or a FIN-type transistor is provided, or the like can be used. Alternatively, gallium arsenide, aluminum gallium arsenide, indium gallium arsenide, gallium nitride, indium phosphide, silicon germanium, or the like that can be used for a high electron mobility transistor (HEMT) may be used. That is, the substrate is not limited to a simple supporting substrate and may be a substrate where a device such as another transistor is formed.

Furthermore, a glass substrate of barium borosilicate glass, aluminoborosilicate glass, or the like, a ceramic substrate, a quartz substrate, a sapphire substrate, or the like can be used as the substrate. Note that a flexible substrate may be used as the substrate. In the case where a flexible substrate is used, a transistor, a capacitor, or the like may be directly fabricated over the flexible substrate, or a transistor, a capacitor, or the like may be fabricated over another fabrication substrate and then separated therefrom and transferred onto the flexible substrate. Note that to perform separation from the fabrication substrate and transfer to the flexible substrate, a separation layer is preferably provided between the fabrication substrate and the transistor, the capacitor, or the like.

For the flexible substrate, for example, a metal, an alloy, a resin, glass, or fiber thereof can be used. The flexible substrate used as the substrate preferably has a lower coefficient of linear expansion because deformation due to an environment is inhibited. For the flexible substrate used as the substrate, for example, a material whose coefficient of linear expansion is lower than or equal to $1\times10^{-3}$/K, lower than or equal to $5\times10^{-5}$/K, or lower than or equal to $1\times10^{-5}$/K is used. Examples of the resin include polyester, polyolefin, polyamide (e.g., nylon and aramid), polyimide, polycarbonate, and acrylic. In particular, aramid is suitable for the flexible substrate because of its low coefficient of linear expansion.

[Insulating Layer]

For the insulating layer, a single layer or a stack of a material selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like is used. A material in which a plurality of materials selected from an oxide material, a nitride material, an oxynitride material, and a nitride oxide material are mixed may be used.

Note that in this specification and the like, a nitride oxide refers to a compound in which the nitrogen content is higher than the oxygen content. An oxynitride refers to a compound in which the oxygen content is higher than the nitrogen content. The content of each element can be measured by Rutherford backscattering spectrometry (RBS), for example.

When an oxide semiconductor, which is one kind of metal oxide, is used for the semiconductor layer, the hydrogen concentration in the insulating layer is preferably lowered in order to prevent an increase in the hydrogen concentration in the semiconductor layer. Specifically, the hydrogen concentration in the insulating layer is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$ in secondary ion mass spectrometry (SIMS). It is particularly preferable to lower the hydrogen concentration in the insulating layer in contact with the semiconductor layer.

Furthermore, the nitrogen concentration in the insulating layer is preferably lowered in order to prevent an increase in the nitrogen concentration in the semiconductor layer. Specifically, the nitrogen concentration in the insulating layer is lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

It is preferred that a region of the insulating layer in contact with at least the semiconductor layer and a region of the insulating layer in contact with at least the semiconductor layer have few defects and typically have as few signals observed by electron spin resonance (ESR) spectroscopy as possible. An example of the signals is an E' center observed at a g-factor of 2.001. Note that the E' center is due to the dangling bond of silicon. For example, in the case where a silicon oxide layer or a silicon oxynitride layer is used as the insulating layer, a silicon oxide layer or a silicon oxynitride layer whose spin density due to the E' center is lower than or equal to $3\times10^{17}$ spins/cm$^3$, preferably lower than or equal to $5\times10^{16}$ spins/cm$^3$ is used.

In addition to the above-described signal, a signal due to nitrogen dioxide (NO$_2$) may be observed. The signal is divided into the following three signals according to the nitrogen nuclear spin: a signal observed at a g-factor greater than or equal to 2.037 and less than or equal to 2.039 (referred to as a first signal), a signal observed at a g-factor greater than or equal to 2.001 and less than or equal to 2.003 (referred to as a second signal), and a signal observed at a g-factor greater than or equal to 1.964 and less than or equal to 1.966 (referred to as a third signal).

For example, as the insulating layer, it is suitable for using an insulating layer whose spin density of a signal due to nitrogen dioxide (NO$_2$) is higher than or equal to $1\times10^{17}$ spins/cm$^3$ and lower than $1\times10^{18}$ spins/cm$^3$.

Note that nitrogen oxide (NO$_x$) including nitrogen dioxide (NO$_2$) forms a state in the insulating layer. The state is positioned in the energy gap of the oxide semiconductor layer. Thus, when nitrogen oxide (NO$_x$) diffuses to the interface between the insulating layer and the oxide semiconductor layer, an electron may be trapped by the state on the insulating layer side. As a result, the trapped electron remains in the vicinity of the interface between the insulating layer and the oxide semiconductor layer; hence, the threshold voltage of the transistor is shifted in the positive direction. Accordingly, the use of a film with a low nitrogen oxide content as the insulating layer can reduce a shift in the threshold voltage of the transistor.

As an insulating layer that releases a small amount of nitrogen oxide (NO$_x$), for example, a silicon oxynitride layer can be used. The silicon oxynitride layer is a film that releases more ammonia than nitrogen oxide (NO$_x$) in thermal desorption spectroscopy (TDS); the typical released amount of ammonia is greater than or equal to $1\times10^{18}$/cm$^3$ and less than or equal to $5\times10^{19}$/cm$^3$. Note that the released amount of ammonia is the total amount in the range of the heat treatment temperature in TDS from 50° C. to 650° C. or from 50° C. to 550° C.

Since nitrogen oxide (NO$_x$) reacts with ammonia and oxygen in heat treatment, the use of an insulating layer that releases a large amount of ammonia reduces nitrogen oxide (NO$_x$).

At least one of the insulating layers in contact with the oxide semiconductor layer is preferably formed using an insulating layer from which oxygen is released by heating. Specifically, it is preferable to use an insulating layer in which the amount of released oxygen converted into oxygen atoms is $1.0\times10^{18}$ atoms/cm$^3$ or more, $1.0\times10^{19}$ atoms/cm$^3$ or more, or $1.0\times10^{20}$ atoms/cm$^3$ or more in TDS performed with heat treatment where the surface temperature of the insulating layer is higher than or equal to 100° C. and lower than or equal to 700° C., preferably higher than or equal to 100° C. and lower than or equal to 500° C. Note that in this specification and the like, oxygen released by heating is also referred to as "excess oxygen".

Furthermore, an insulating layer containing excess oxygen can also be formed by performing treatment for adding oxygen to an insulating layer. The treatment for adding oxygen can be performed by heat treatment, plasma treatment, or the like in an oxidizing atmosphere. Alternatively, oxygen may be added by an ion implantation method, an ion doping method, a plasma immersion ion implantation method, or the like. Examples of a gas used in the treatment for adding oxygen include an oxygen gas such as $^{16}O_2$ or $^{18}O_2$ and a gas containing oxygen, such as a nitrous oxide gas or an ozone gas. Note that in this specification, the treatment for adding oxygen is also referred to as "oxygen doping treatment". The oxygen doping treatment may be performed while the substrate is heated.

For the insulating layer, a heat-resistant organic material such as polyimide, an acrylic resin, a benzocyclobutene-based resin, polyamide, or an epoxy-based resin can be used. Other than the above organic materials, it is also possible to use a low permittivity material (a low-k material), a siloxane-based resin, PSG (phosphosilicate glass), BPSG (borophosphosilicate glass), or the like. Note that the insulating layer may be formed by stacking a plurality of insulating layers formed of these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

There is no particular limitation on the method for forming the insulating layer. Note that a baking step is necessary in some cases depending on a material used for the insulating layer. In this case, when the baking step of the insulating layer also serves as another heat treatment step, the transistor can be manufactured efficiently.

[Electrode]

As a conductive material for forming the electrode, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. A semiconductor having high electrical conductivity, typified by polycrystalline silicon containing an impurity element such as phosphorus, or silicide such as nickel silicide may be used.

A conductive material containing the above metal element and oxygen may be used. A conductive material containing the above metal element and nitrogen may be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, indium gallium zinc oxide, or indium tin oxide to which silicon is added may be used. Furthermore, indium gallium zinc oxide containing nitrogen may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed. A stacked-layer structure combining a conductive material containing nitrogen and a conductive material containing oxygen may be employed.

Note that in the case where an oxide semiconductor is used for the semiconductor layer and the gate electrode employs a stacked-layer structure combining a material containing the above metal element and a conductive material containing oxygen, the conductive material containing oxygen is preferably provided on the semiconductor layer side. By providing the conductive material containing oxygen on the semiconductor layer side, oxygen released from the conductive material is easily supplied to the semiconductor layer.

For the electrode, a conductive material with high embeddability, such as tungsten or polysilicon, can be used, for example. A conductive material with high embeddability and a barrier layer (a diffusion prevention layer) such as a titanium layer, a titanium nitride layer, or a tantalum nitride layer may be used in combination. Note that the electrode may be referred to as a "contact plug".

In particular, the electrode in contact with the gate insulating layer is preferably formed using a conductive material through which impurities are less likely to pass. An example of the conductive material through which impurities are less likely to pass is tantalum nitride.

When an insulating material through which impurities are less likely to pass is used for the insulating layer and a conductive material through which impurities are less likely to pass is used for the electrode, diffusion of impurities to the transistor can be further inhibited. Thus, the reliability of the transistor can be further increased. That is, the reliability of the memory device can be further increased.

[Semiconductor Layer]

For the semiconductor layer, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Furthermore, a compound semiconductor such as silicon germanium, silicon carbide, gallium arsenide, an oxide semiconductor, or a nitride semiconductor, an organic semiconductor, or the like can be used.

In the case of using an organic semiconductor for the semiconductor layer, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

Note that semiconductor layers may be stacked. In the case of stacking semiconductor layers, semiconductors having different crystal states may be used or different semiconductor materials may be used.

The bandgap of an oxide semiconductor, which is one kind of metal oxide, is greater than or equal to 2 eV; thus, the use of the oxide semiconductor for the semiconductor layer can achieve a transistor with an extremely low off-state current. Specifically, the off-state current per micrometer of channel width at room temperature (typically 25° C.) at a voltage between a source and a drain of 3.5 V can be lower than $1\times10^{-20}$ A, lower than $1\times10^{-22}$ A, or lower than $1\times10^{-24}$ A. That is, the on/off ratio can be greater than or equal to 20 digits. In addition, a transistor using an oxide semiconductor for the semiconductor layer (an OS transistor) has high withstand voltage between its source and drain. Thus, a transistor with high reliability can be provided. A transistor with high output voltage and high withstand voltage can be provided. A memory device or the like with high reliability can be provided. A memory device with high output voltage and high withstand voltage can be provided.

In this specification and the like, a transistor in which silicon having crystallinity is used for a semiconductor layer where a channel is formed is also referred to as a "crystalline Si transistor".

The crystalline Si transistor tends to have relatively high mobility compared with the OS transistor. On the other hand, the crystalline Si transistor has difficulty in achieving an extremely low off-state current such as one in the OS transistor. Thus, it is important that the semiconductor material used for the semiconductor layer be properly selected depending on the purpose and the usage. For example, depending on the purpose and the usage, the OS transistor and the crystalline Si transistor and the like may be used in combination.

In the case where an oxide semiconductor layer is used as the semiconductor layer, the oxide semiconductor layer is preferably formed by a sputtering method. The oxide semiconductor layer is preferably formed by a sputtering method, in which case the density of the oxide semiconductor layer can be increased. When the oxide semiconductor layer is formed by a sputtering method, a rare gas (typically argon), oxygen, or a mixed gas of a rare gas and oxygen is used as a sputtering gas. In addition, increasing the purity of a sputtering gas is necessary. For example, as an oxygen gas or a rare gas used as a sputtering gas, a gas that is highly purified to have a dew point of −60° C. or lower, preferably −100° C. or lower is used. When the highly purified sputtering gas is used for the deposition, entry of moisture or the like into the oxide semiconductor layer can be prevented as much as possible.

Furthermore, in the case where the oxide semiconductor layer is formed by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum state (to a degree of approximately $5 \times 10^{-7}$ Pa to $1 \times 10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1 \times 10^{-4}$ Pa, further preferably lower than or equal to $5 \times 10^{-5}$ Pa.

[Metal Oxide]

An oxide semiconductor, which is one kind of metal oxide, preferably contains at least indium or zinc. In particular, indium and zinc are preferably contained. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, magnesium, and the like. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[[Structure of Metal Oxide]]

An oxide semiconductor, which is one kind of metal oxide, is classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear grain boundary even in the vicinity of distortion in the CAAC-OS. That is, formation of a grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced by indium, the layer can also be referred to as an (In,M,Zn) layer. Furthermore, when indium in the In layer is replaced by the element M, the layer can also be referred to as an (In,M) layer.

The CAAC-OS is a metal oxide with high crystallinity. On the other hand, in the CAAC-OS, a reduction in electron mobility due to a grain boundary is less likely to occur because it is difficult to observe a clear grain boundary. Furthermore, entry of impurities, formation of defects, or the like might decrease the crystallinity of a metal oxide, which means that the CAAC-OS is a metal oxide having small amounts of impurities and defects (e.g., oxygen vacancies). Thus, a metal oxide including the CAAC-OS is physically stable. Therefore, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (a metal oxide) can have various structures with different properties. The oxide semiconductor may include two or more of an amorphous oxide semiconductor, a polycrystalline oxide semiconductor, an a-like OS, an nc-OS, and a CAAC-OS.

[[Transistor Including Metal Oxide]]

Next, the case where the above metal oxide is used in a channel formation region of a transistor is described.

Note that when the above metal oxide is used in a channel formation region of a transistor, a transistor having high field-effect mobility can be achieved. In addition, a transistor having high reliability can be achieved.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$.

A highly purified intrinsic or substantially highly purified intrinsic metal oxide film has a low density of defect states and accordingly may have a low density of trap states.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the impurity concentration in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

[[Impurities]]

Here, the influence of each impurity in the metal oxide is described.

When silicon or carbon, which is a Group 14 element, is contained in the metal oxide, defect states are formed in the metal oxide. Thus, the concentration of silicon or carbon in the metal oxide and the concentration of silicon or carbon in the vicinity of an interface with the metal oxide (the concentration measured by secondary ion mass spectrometry (SIMS)) are set lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/cm$^3$, preferably lower than or equal to $2\times10^{16}$ atoms/cm$^3$.

When containing nitrogen, the metal oxide easily becomes n-type by generation of electrons serving as carriers and an increase in carrier density. As a result, a transistor using a metal oxide that contains nitrogen for its channel formation region is likely to have normally-on characteristics. Thus, nitrogen in the channel formation region in the metal oxide is preferably reduced as much as possible. For example, the nitrogen concentration in the metal oxide is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

Hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using the metal oxide that contains hydrogen for its channel formation region is likely to have normally-on characteristics. Accordingly, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When a metal oxide in which impurities are sufficiently reduced is used in a channel formation region of a transistor, stable electrical characteristics can be given.

As a metal oxide used for a semiconductor of a transistor, a thin film having high crystallinity is preferably used. With the use of the thin film, the stability or the reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, the manufacturing process cost is increased, and in addition, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed, and CAAC-IGZO can be formed over a substrate at low temperatures. It has also been reported that a transistor using CAAC-IGZO has excellent electrical characteristics and reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, crystalline IGZO of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

A transistor using a metal oxide has an extremely low leakage current in an off state. Specifically, Non-Patent Document 6 shows that the off-state current per micrometer in the channel width of the transistor is of the order of yA/μm ($10^{-24}$ A/μm). For example, a low-power-consumption CPU applying a characteristic of low leakage current of the transistor using a metal oxide is disclosed (see Non-Patent Document 7).

Furthermore, application of a transistor using a metal oxide to a display device that utilizes the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as driving frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate enables the power consumption of the display device to be reduced. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristic of a low leakage current of the transistor have been studied.

<Film Formation Method>

An insulating material for forming the insulating layer, a conductive material for forming the electrode, or a semiconductor material for forming the semiconductor layer can be formed by a sputtering method, a spin coating method, a CVD (Chemical Vapor Deposition) method (including a thermal CVD method, an MOCVD (Metal Organic Chemical Vapor Deposition) method, a PECVD (Plasma Enhanced CVD) method, a high density plasma CVD method, an LPCVD (low pressure CVD) method, an APCVD (atmospheric pressure CVD) method, and the like), an ALD (Atomic Layer Deposition) method, an MBE (Molecular Beam Epitaxy) method, a PLD (Pulsed Laser Deposition) method, a dipping method, a spray coating method, a droplet discharging method (e.g., an inkjet method), a printing method (e.g., screen printing or offset printing), or the like.

By a plasma CVD method, a high-quality film can be obtained at a relatively low temperature. With the use of a film formation method that does not use plasma at the time of film formation, such as an MOCVD method, an ALD method, or a thermal CVD method, damage is not easily caused on a surface where the film is formed. For example, a wiring, an electrode, an element (e.g., a transistor or a capacitor), or the like included in a memory device might be charged up by receiving charges from plasma. In that case, accumulated charges might break the wiring, electrode, element, or the like included in the memory device. By contrast, in the case of a film formation method not using plasma, such plasma damage is not caused; thus, the yield of memory devices can be increased. Moreover, since plasma damage during film formation is not caused, a film with few defects can be obtained.

Unlike a film formation method in which particles ejected from a target or the like are deposited, a CVD method and an ALD method are film formation methods in which a film is formed by reaction at a surface of an object. Thus, a CVD method and an ALD method are film formation methods that enable favorable step coverage almost regardless of the shape of an object. In particular, an ALD method enables excellent step coverage and excellent thickness uniformity and can be favorably used to cover a surface of an opening with a high aspect ratio, for example. On the other hand, an ALD method has a relatively low deposition rate, and thus is preferably used in combination with another film formation method with a high deposition rate, such as a CVD method, in some cases.

When a CVD method or an ALD method is used, the composition of a film to be formed can be controlled with a flow rate ratio of source gases. For example, by a CVD method or an ALD method, a film with a certain composition can be formed depending on the flow rate ratio of the source gases. Moreover, with a CVD method or an ALD method, by changing the flow rate ratio of the source gases while forming the film, a film whose composition is continuously changed can be formed. In the case of forming a film while changing the flow rate ratio of the source gases, as compared with the case of forming a film with the use of a plurality of deposition chambers, the time taken for the film formation can be shortened because the time taken for transfer and pressure adjustment is omitted. Thus, memory devices can be manufactured with improved productivity in some cases.

Note that in the case of forming a film by an ALD method, a gas that does not contain chlorine is preferably used as a material gas.

Transistor Structure Example 2

Figure 13A:
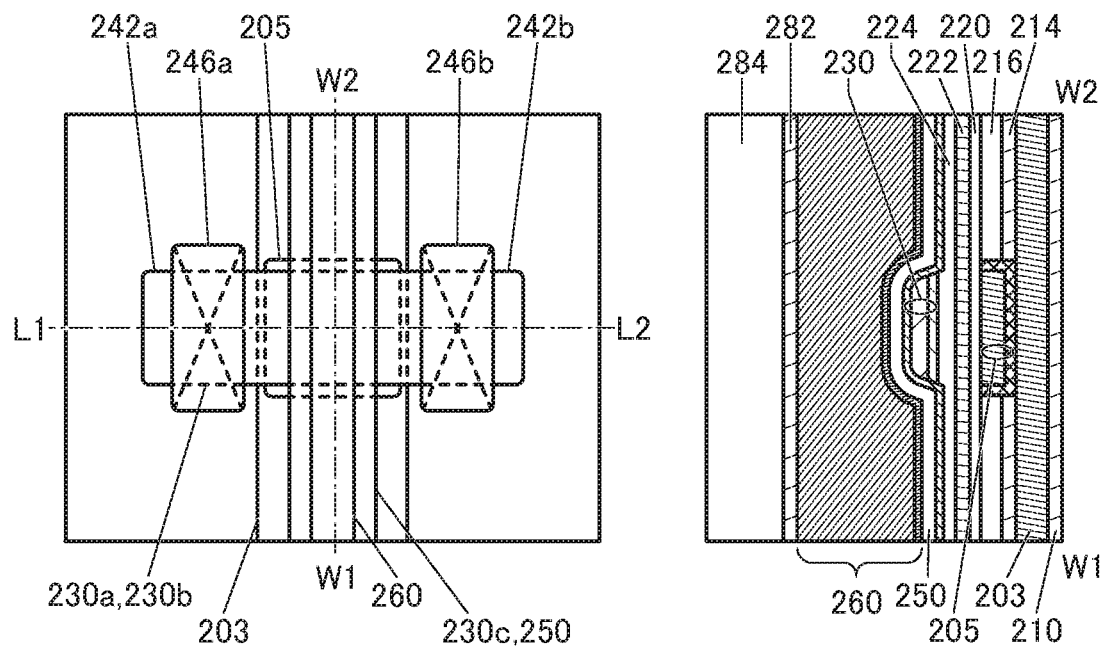
FIGS. 13A to 13C Diagrams illustrating a structure example of a transistor of one embodiment of the present invention.
Figure 13C:
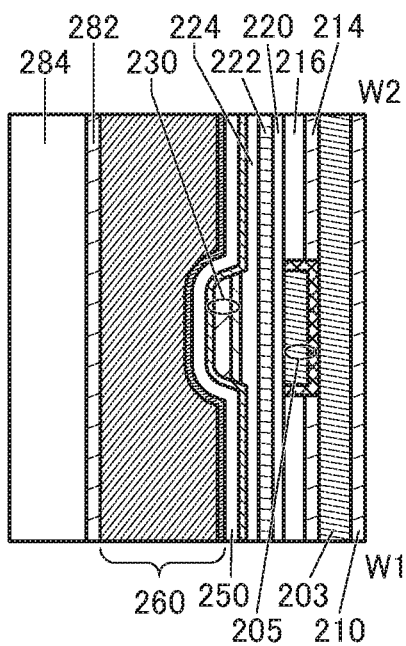
Figure 13B:
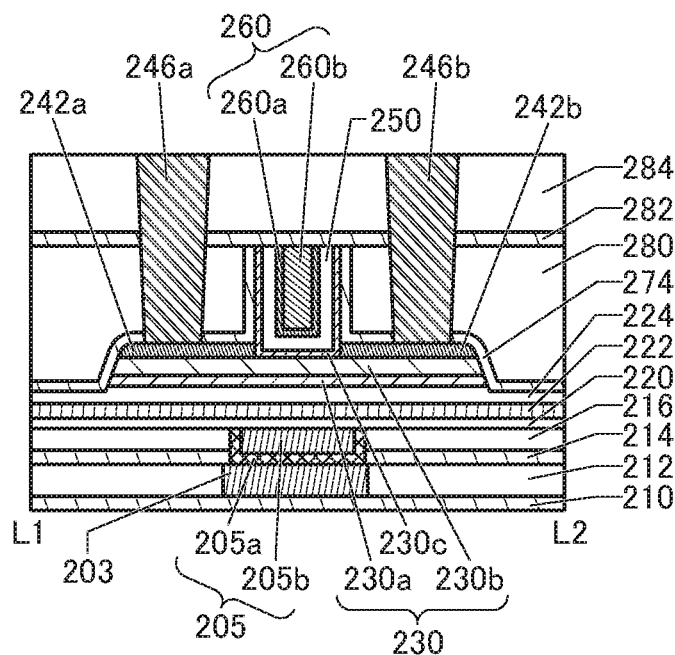

A structure example of a transistor 200B is described with reference to FIGS. 13(A) to 13(C). FIG. 13(A) is a top view of the transistor 200B. FIG. 13(B) is a cross-sectional view of a portion indicated by a dashed-dotted line L1-L2 in FIG. 13(A). FIG. 13(C) is a cross-sectional view of a portion indicated by a dashed-dotted line W1-W2 in FIG. 13(A). Note that for clarification of the drawing, some components are not illustrated in the top view of FIG. 13(A).

The transistor 200B is a variation example of the transistor 200A. Therefore, differences from the transistor 200A are mainly described to avoid repeated description.

In the transistor 200B illustrated in FIG. 13, the oxide 230c, the insulator 250, and the conductor 260 are positioned in an opening provided in the insulator 280 with the insulator 274 positioned therebetween. Moreover, the oxide 230c, the insulator 250, and the conductor 260 are positioned between the conductor 242a and the conductor 242b.

Note that the oxide 230c is preferably provided in the opening in the insulator 280 with the insulator 274 positioned therebetween. When the insulator 274 has a barrier property, diffusion of impurities from the insulator 280 into the oxide 230 can be inhibited.

The insulator 250 functions as a first gate insulating layer. The insulator 250 is preferably provided in the opening in the insulator 280 with the oxide 230c and the insulator 274 positioned therebetween.

The insulator 274 is positioned between the insulator 280 and the transistor 200B. For the insulator 274, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 274 can inhibit diffusion of impurities such as water or hydrogen contained in the insulator 280 into the oxide 230b through the oxide 230c and the insulator 250. Furthermore, oxidation of the conductor 260 due to excess oxygen contained in the insulator 280 can be inhibited.

Transistor Structure Example 3

Figure 14A:
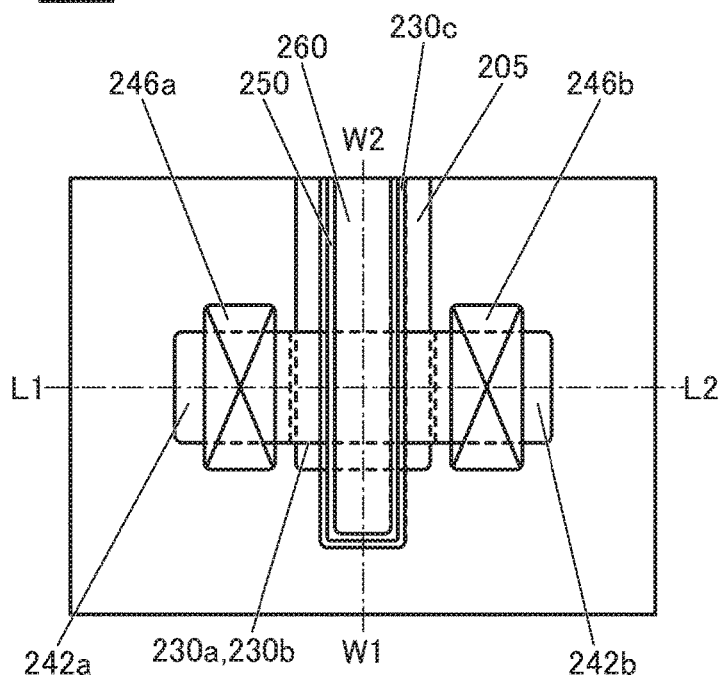
FIGS. 14A to 14C Diagrams illustrating a structure example of a transistor of one embodiment of the present invention.
Figure 14C:
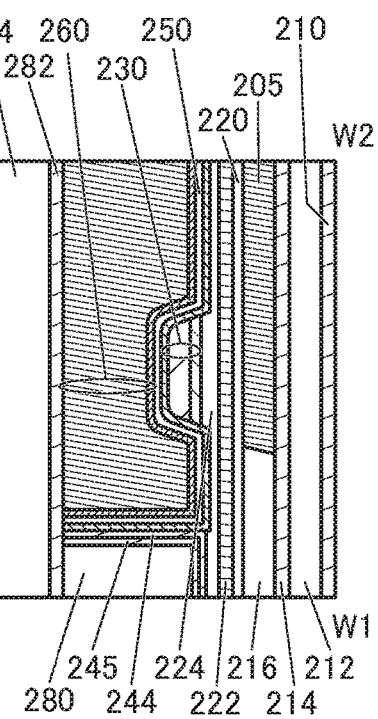
Figure 14B:
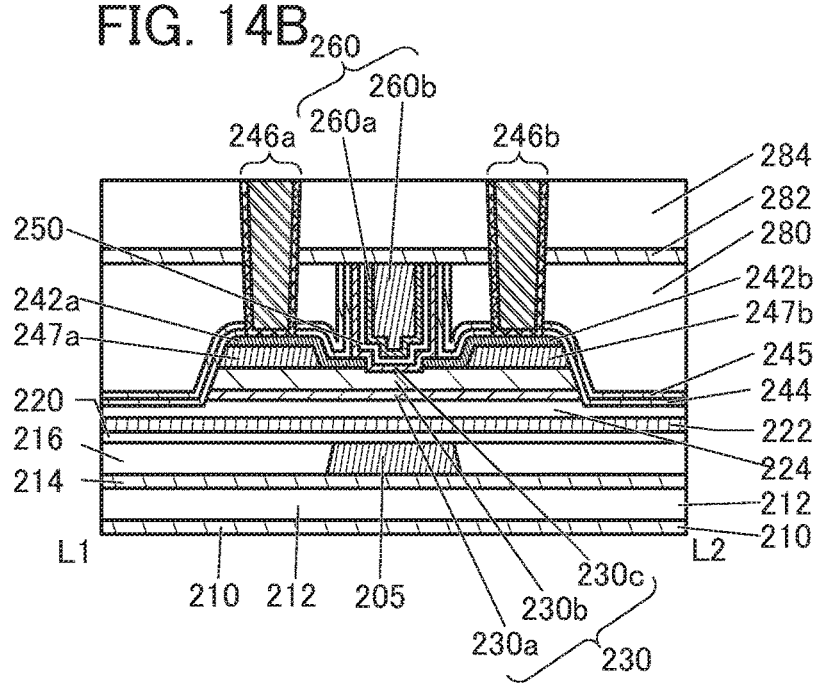

A structure example of a transistor 200C is described with reference to FIGS. 14(A) to 14(C). FIG. 14(A) is a top view of the transistor 200C. FIG. 14(B) is a cross-sectional view of a portion indicated by a dashed-dotted line L1-L2 in FIG. 14(A). FIG. 14(C) is a cross-sectional view of a portion indicated by a dashed-dotted line W1-W2 in FIG. 14(A). Note that for clarification of the drawing, some components are not illustrated in the top view of FIG. 14(A).

The transistor 200C is a variation example of the transistor 200B. Therefore, differences from the transistor 200B are mainly described to avoid repeated description.

In the transistor 200C illustrated in FIG. 14, a conductive layer 247a is positioned between the conductor 242a and the oxide 230b and a conductive layer 247b is positioned between the conductor 242b and the oxide 230b. Here, the conductor 242a (the conductor 242b) has a region that extends beyond the top surface and a side surface on the conductor 260 side of the conductive layer 247a (the conductive layer 247b) and is in contact with the top surface of the oxide 230b. For the conductive layer 247, a conductor that can be used for the conductor 242 is used. It is preferred that the thickness of the conductive layer 247 be at least greater than that of the conductor 242.

In the transistor 200C illustrated in FIG. 14, because of the above structure, the conductor 242 can be closer to the conductor 260 than in the transistor 200B. Alternatively, the conductor 260 and an end portion of the conductor 242a and an end portion of the conductor 242b can overlap with each other. Accordingly, the effective channel length of the transistor 200C can be shortened, and the on-state current and the operating frequency can be improved.

The conductive layer 247a (the conductive layer 247b) is preferably provided to be overlapped by the conductor 242a (the conductor 242b). With such a structure, the conductive layer 247a (the conductive layer 247b) can function as a stopper to prevent over-etching of the oxide 230b in etching for forming the opening in which the conductor 246a (the conductor 246b) is to be embedded.

The transistor 200C illustrated in FIG. 14 may have a structure in which an insulating layer 245 is positioned on and in contact with an insulating layer 244. The insulating layer 244 preferably functions as a barrier insulating film that inhibits entry of impurities such as water or hydrogen and excess oxygen into the transistor 200C from the insulator 280 side. The insulating layer 244 can be formed using an insulator that can be used for the insulating layer 245. Alternatively, the insulating layer 245 may be formed using a nitride insulator such as aluminum nitride, titanium nitride, silicon nitride, or silicon nitride oxide, for example.

Unlike in the transistor 200B illustrated in FIG. 13, in the transistor 200C illustrated in FIG. 14, the conductor 205 may be provided to have a single-layer structure. In this case, an insulating film to be the insulator 216 is formed over the patterned conductor 205, and an upper portion of the insulating film is removed by a chemical mechanical polishing (CMP) method or the like until the top surface of the conductor 205 is exposed. Preferably, the planarity of the top surface of the conductor 205 is made favorable. For example, the average surface roughness (Ra) of the top surface of the conductor 205 is less than or equal to 1 nm, preferably less than or equal to 0.5 nm, further preferably less than or equal to 0.3 nm. This allows the improvement in planarity of an insulating layer formed over the conductor 205 and the increase in crystallinity of the oxide 230b and the oxide 230c.

Transistor Structure Example 4

Figure 15A:
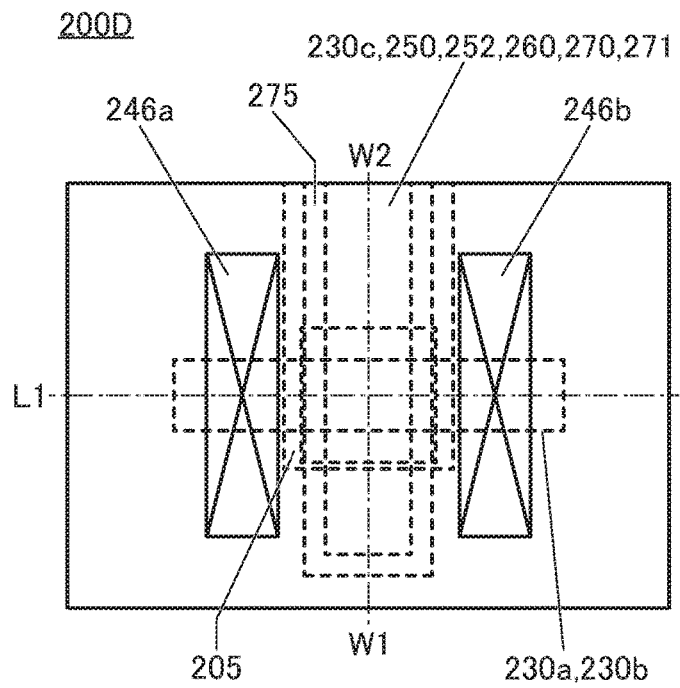
FIGS. 15A to 15C Diagrams illustrating a structure example of a transistor of one embodiment of the present invention.
Figure 15C:
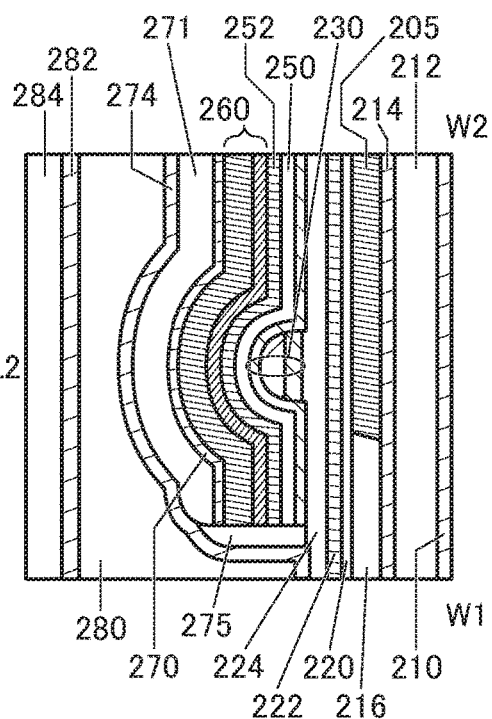
Figure 15B:
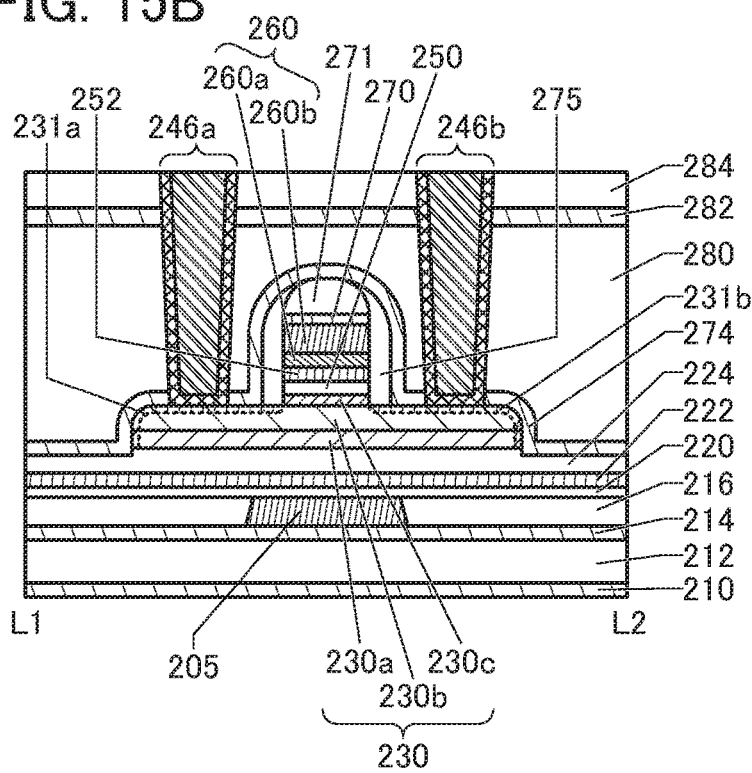

A structure example of a transistor 200D is described with reference to FIGS. 15(A) to 15(C). FIG. 15(A) is a top view of the transistor 200D. FIG. 15(B) is a cross-sectional view of a portion indicated by a dashed-dotted line L1-L2 in FIG. 15(A). FIG. 15(C) is a cross-sectional view of a portion indicated by a dashed-dotted line W1-W2 in FIG. 15(A). Note that for clarification of the drawing, some components are not illustrated in the top view of FIG. 15(A).

The transistor 200D is a variation example of the above transistors. Therefore, differences from the above transistors are mainly described to avoid repeated description.

In FIGS. 15(A) to 15(C), the conductive layer 203 is not provided and the conductor 205 that functions as a second gate is made to function also as a wiring. Furthermore, the insulator 250 is provided over the oxide 230c and a metal oxide 252 is provided over the insulator 250. The conductor 260 is provided over the metal oxide 252, and an insulating layer 270 is provided over the conductor 260. An insulating layer 271 is provided over the insulating layer 270.

The metal oxide 252 preferably has a function of inhibiting diffusion of oxygen. When the metal oxide 252 that inhibits oxygen diffusion is provided between the insulator 250 and the conductor 260, diffusion of oxygen into the conductor 260 is inhibited. That is, a reduction in the amount of oxygen supplied to the oxide 230 can be inhibited. Moreover, oxidization of the conductor 260 due to oxygen can be suppressed.

Note that the metal oxide 252 may function as part of a first gate electrode. For example, an oxide semiconductor that can be used for the oxide 230 can be used for the metal oxide 252. In this case, when the conductor 260 is deposited by a sputtering method, the metal oxide 252 can have a reduced electric resistance to be a conductive layer.

Note that the metal oxide 252 functions as part of a first gate insulating layer in some cases. Thus, when silicon oxide, silicon oxynitride, or the like is used for the insulator 250, a metal oxide that is a high-k material with a high dielectric constant is preferably used for the metal oxide 252. Such a stacked-layer structure can be thermally stable and can have a high dielectric constant. Thus, a gate potential that is applied during operation of the transistor can be reduced while the physical thickness is maintained. In addition, the equivalent oxide thickness (EOT) of the insulating layer functioning as the gate insulating layer can be reduced.

Although the metal oxide 252 in the transistor 200D is shown as a single layer, a stacked-layer structure of two or more layers may be employed. For example, a metal oxide functioning as part of the first gate electrode and a metal oxide functioning as part of the first gate insulating layer may be stacked.

With the metal oxide 252 functioning as the first gate electrode, the on-state current of the transistor 200D can be increased without a reduction in the influence of the electric field from the conductor 260. With the metal oxide 252 functioning as the first gate insulating layer, the distance between the conductor 260 and the oxide 230 is kept by the physical thicknesses of the insulator 250 and the metal oxide 252, so that leakage current between the conductor 260 and the oxide 230 can be reduced. Thus, with the stacked-layer structure of the insulator 250 and the metal oxide 252, the physical distance between the conductor 260 and the oxide 230 and the intensity of electric field applied from the conductor 260 to the oxide 230 can be easily adjusted as appropriate.

Specifically, the oxide semiconductor that can be used for the oxide 230 can also be used for the metal oxide 252 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than hafnium oxide. Therefore, hafnium aluminate is preferable since it is less likely to be crystallized in a thermal history (thermal budget) through the following process. Note that the metal oxide 252 is not an essential structure. Design is appropriately set in consideration of required transistor characteristics.

For the insulating layer 270, an insulating material having a function of inhibiting the passage of oxygen and impurities such as water or hydrogen is preferably used. For example, aluminum oxide or hafnium oxide is preferably used. Thus, oxidization of the conductor 260 due to oxygen from above the insulating layer 270 can be inhibited. Moreover, entry of impurities such as water or hydrogen from above the insulating layer 270 into the oxide 230 through the conductor 260 and the insulator 250 can be inhibited.

The insulating layer 271 functions as a hard mask. By providing the insulating layer 271, the conductor 260 can be processed such that a side surface of the conductor 260 is substantially perpendicular; specifically, an angle formed by the side surface of the conductor 260 and a surface of the substrate can be greater than or equal to 75° and less than or equal to 100°, preferably greater than or equal to 80° and less than or equal to 95°.

An insulating material having a function of inhibiting the passage of oxygen and impurities such as water or hydrogen may be used for the insulating layer 271 so that the insulating layer 271 also functions as a barrier layer. In that case, the insulating layer 270 does not have to be provided.

Parts of the insulating layer 270, the conductor 260, the metal oxide 252, the insulator 250, and the oxide 230c are selected and removed using the insulating layer 271 as a hard mask, whereby their side surfaces can be substantially aligned with each other and a surface of the oxide 230b can be partly exposed.

The transistor 200D includes a region 231a and a region 231b on part of the exposed surface of the oxide 230b. One of the region 231a and the region 231b functions as a source region, and the other functions as a drain region.

The region 231a and the region 231b can be formed by addition of an impurity element such as phosphorus or boron to the exposed surface of the oxide 230b by an ion implantation method, an ion doping method, a plasma immersion ion implantation method, or plasma treatment, for example. In this embodiment and the like, an "impurity element" refers to an element other than main constituent elements.

Alternatively, the region 231a and the region 231b can be formed in such manner that, after part of the surface of the oxide 230b is exposed, a metal film is formed and then heat treatment is performed so that the element contained in the metal film is diffused into the oxide 230b.

The electrical resistivity of regions of the oxide 230b to which the impurity element is added decreases. For that reason, the region 231a and the region 231b are sometimes referred to "impurity regions" or "low-resistance regions".

The region 231a and the region 231b can be formed in a self-aligned manner by using the insulating layer 271 or the conductor 260 as a mask. Accordingly, the conductor 260 does not overlap with the region 231a or the region 231b, so that the parasitic capacitance can be reduced. Moreover, an offset region is not formed between a channel formation region and the source region or the drain region (the region 231a or the region 231b). The formation of the region 231a and the region 231b in a self-aligned manner achieves an increase in on-state current, a reduction in threshold voltage, and an improvement in operating frequency, for example.

Note that an offset region may be provided between the channel formation region and the source region or the drain region in order to further reduce the off-state current. The offset region is a region where the electrical resistivity is high and a region where the above-described addition of the impurity element is not performed. The offset region can be formed by the above-described addition of the impurity element after the formation of an insulating layer 275. In this case, the insulating layer 275 serves as a mask like the insulating layer 271 or the like. Thus, the impurity element is not added to a region of the oxide 230b overlapped by the insulating layer 275, so that the electrical resistivity of the region can be kept high.

The transistor 200D includes the insulating layer 275 on the side surfaces of the insulating layer 270, the conductor 260, the metal oxide 252, the insulator 250, and the oxide 230c. The insulating layer 275 is preferably an insulator having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulating layer 275, in which case an excess-oxygen region can be easily formed in the insulating layer 275 in a later step. Silicon oxide and silicon oxynitride are preferable because of their thermal stability. The insulating layer 275 preferably has a function of diffusing oxygen.

The transistor 200D also includes the insulator 274 over the insulating layer 275 and the oxide 230. The insulator 274 is preferably deposited by a sputtering method. When a sputtering method is used, an insulator containing few impurities such as water or hydrogen can be deposited. For example, aluminum oxide is preferably used for the insulator 274.

Note that an oxide film obtained by a sputtering method may extract hydrogen from the structure body over which the oxide film is deposited. Thus, the hydrogen concentration in the oxide 230 and the insulating layer 275 can be reduced when the insulator 274 absorbs hydrogen and water from the oxide 230 and the insulating layer 275.

This embodiment can be implemented in an appropriate combination with the structures described in the other embodiments, Example, and the like.

Embodiment 3

Figure 16:
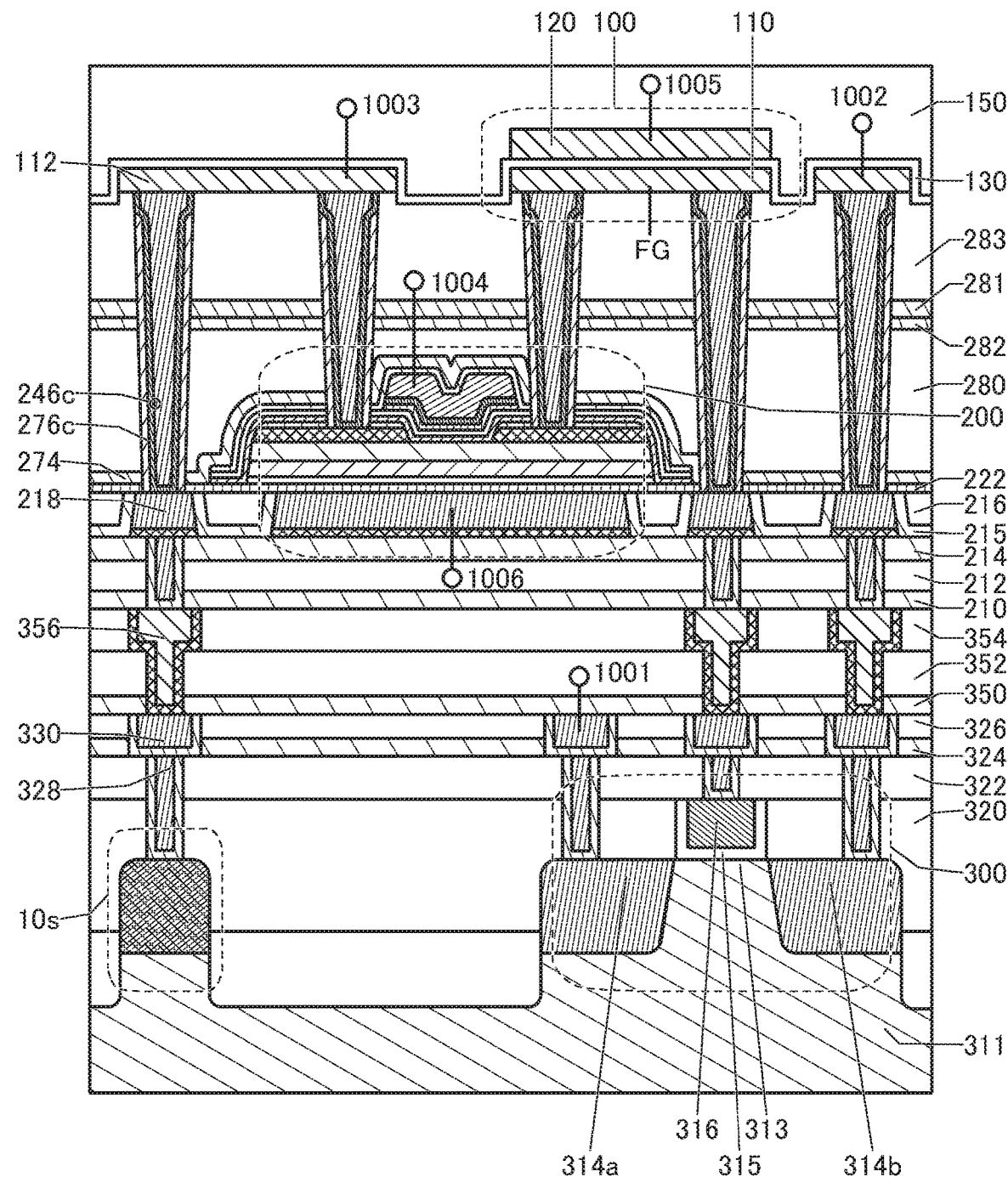
FIG. 16 A cross-sectional view illustrating a structure of a memory device of one embodiment of the present invention.

In this embodiment, one embodiment of a semiconductor device is described using FIG. 16 and FIG. 17.

[Memory Device 1]

FIG. 16 illustrates an example of a semiconductor device (memory device) using a capacitor which is one embodiment of the present invention. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200.

Each of the conductors included in the transistor 200 is preferably electrically connected to the transistor that functions as a diode element or a capacitor described in the above embodiment. Although FIG. 16 and FIG. 17 representatively illustrate only the diode 10s, the structure is not limited to this. It is preferable that design be appropriately set using the structure described in the above embodiment depending on the required performance of the semiconductor device.

The transistor 200 is a transistor whose channel is formed in a semiconductor layer including an oxide semiconductor. Since the transistor 200 has a low off-state current, a memory device which is the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 16, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to a first gate of the transistor 200. A wiring 1006 is electrically connected to a second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

The memory devices illustrated in FIG. 16 can form a memory cell array when arranged in a matrix.

<Transistor 300>

The transistor 300 is provided over a substrate 311 and includes a conductor 316 functioning as a gate electrode, an insulator 315 functioning as a gate insulator, a semiconductor region 313 formed of a part of the substrate 311, and a low-resistance region 314a and a low-resistance region 314b functioning as the source region and the drain region. The transistor 300 may be a p-channel type or an n-channel type.

In the transistor 300 illustrated in FIG. 16, the semiconductor region 313 (part of the substrate 311) in which a channel is formed has a convex shape. Furthermore, the conductor 316 is provided to cover top and side surfaces of the semiconductor region 313 with the insulator 315 therebetween. Note that a material adjusting the work function may be used for the conductor 316. The transistor 300 having such a structure is also referred to as a FIN transistor because the projecting portion of the semiconductor substrate is utilized. An insulator functioning as a mask for forming the projecting portion may be included in contact with the top surface of the projecting portion. Although the case where the projecting portion is formed by processing part of the semiconductor substrate is described here, a semiconductor film having a projecting shape may be formed by processing an SOI substrate.

Note that the transistor 300 illustrated in FIG. 16 is an example and the structure is not limited thereto; an appropriate transistor is used in accordance with a circuit configuration or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 over the conductor 246 can be formed at the same time. Note that the conductor 112 functions as a plug or a wiring that is electrically connected to the capacitor 100, the transistor 200, or the transistor 300.

Although the conductor 112 and the conductor 110 having a single-layer structure are illustrated in FIG. 16, the structure is not limited thereto; a stacked-layer structure of two or more layers may be employed. For example, between a conductor having a barrier property and a conductor having high conductivity, a conductor which is highly adhesive to the conductor having a barrier property and the conductor having high conductivity may be formed.

For the insulator 130, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like is used, and a stacked layer or a single layer can be provided.

For example, for the insulator 130, a stacked-layer structure using a material with high dielectric strength such as silicon oxynitride and a high permittivity (high-k) material is preferably used. In the capacitor 100 having such a structure, a sufficient capacitance can be ensured owing to the high permittivity (high-k) insulator, and the dielectric strength can be increased owing to the insulator with high dielectric strength, so that the electrostatic breakdown of the capacitor 100 can be inhibited.

As the insulator of a high permittivity (high-k) material (a material having a high dielectric constant), gallium oxide, hafnium oxide, zirconium oxide, an oxide including aluminum and hafnium, an oxynitride including aluminum and hafnium, an oxide including silicon and hafnium, an oxynitride including silicon and hafnium, a nitride including silicon and hafnium, or the like can be given.

As the material having a high dielectric strength (a material having a low dielectric constant), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

<Wiring Layers>

Wiring layers provided with an interlayer film, a wiring, a plug, and the like may be provided between the structure bodies. A plurality of wiring layers can be provided in accordance with the design. Here, a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are stacked over the transistor 300 in this order as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring.

The insulator functioning as an interlayer film may function as a planarization film that covers a roughness thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 16, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218, a conductor (conductor 205) included in the transistor 200, and the like are embedded in the insulator 210, the insulator 212, the insulator 214, and the insulator 216. Note that the conductor 218 functions as a plug or a wiring that is electrically connected to the capacitor 100 or the transistor 300. In addition, an insulator 150 is provided over the conductor 120 and the insulator 130.

As an insulator that can be used as an interlayer film, an insulating oxide, an insulating nitride, an insulating oxynitride, an insulating nitride oxide, an insulating metal oxide, an insulating metal oxynitride, an insulating metal nitride oxide, or the like is given.

For example, when a material with a low permittivity is used for the insulator functioning as an interlayer film, the parasitic capacitance between wirings can be reduced. Accordingly, a material is preferably selected in accordance with the function of an insulator.

For example, the insulator 216, the insulator 212, the insulator 352, the insulator 354, or the like preferably includes an insulator with a low permittivity. For example, the insulator preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride have thermal stability, a combination of silicon oxide or silicon oxynitride with a resin allows the stacked-layer structure to be thermally stable and have a low permittivity. Examples of the resin include polyester, polyolefin, polyamide (e.g., nylon and aramid), polyimide, polycarbonate, and acrylic.

When the transistor using an oxide semiconductor is surrounded by an insulator having a function of inhibiting transmission of oxygen and impurities such as hydrogen, the electrical characteristics of the transistor can be stabilized. Thus, the insulator having a function of inhibiting transmission of oxygen and impurities such as hydrogen can be used for the insulator 210, the insulator 350, and the like.

The insulator having a function of inhibiting transmission of oxygen and impurities such as hydrogen can have, for example, a single-layer structure or a stacked-layer structure of an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductors that can be used for wirings or plugs, a material including one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having a high electric conductivity typified by polycrystalline silicon including an impurity element such as phosphorus, or silicide such as nickel silicide may be used.

For example, for the conductor 328, the conductor 330, the conductor 356, the conductor 218, the conductor 112, and the like, a single-layer structure or a stacked-layer structure using a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<<Wirings or Plugs in Layer Provided with Oxide Semiconductor>>

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess oxygen region and the conductor provided in the insulator including the excess oxygen region.

For example, in FIG. 16, a structure can be employed in which the insulator 224 and the transistor 200 are sealed by the insulator 222, an insulator 254, and the insulator 274 having barrier properties. An insulator 276c is in contact with part of a conductor 246c and the insulator 280, and can inhibit diffusion of impurities such as water or hydrogen and oxygen contained in the insulator 280 into the conductor 246c.

That is, the insulator 276c can inhibit excess oxygen included in the insulator 280 from being absorbed by the conductor 246c. In addition, the insulator 276c can inhibit diffusion of hydrogen, which is an impurity, into the transistor 200 through the conductor 246c.

The insulator 276c is preferably formed using an insulating material having a function of inhibiting diffusion of an impurity such as water or hydrogen and oxygen. For example, aluminum oxide, hafnium oxide, or the like is preferably used. Other than that, a metal oxide such as magnesium oxide, gallium oxide, germanium oxide, yttrium oxide, zirconium oxide, lanthanum oxide, neodymium oxide, or tantalum oxide, silicon nitride oxide, silicon nitride, or the like can be used, for example.

The above is the description of the structure example. With the use of the structure, a semiconductor device using a transistor including an oxide semiconductor can have a small variation in electrical characteristics and higher reliability. Alternatively, a transistor including an oxide semiconductor with a high on-state current can be provided. Alternatively, a transistor including an oxide semiconductor with a low off-state current can be provided. Alternatively, a semiconductor device with low power consumption can be provided.

[Memory Device 2]

FIG. 17 illustrates an example of a memory device using the semiconductor device which is one embodiment of the present invention. The memory device illustrated in FIG. 17 includes a transistor 400 in addition to the semiconductor device including the transistor 200, the transistor 300, and the capacitor 100 illustrated in FIG. 16.

The transistor 400 can change a second gate voltage of the transistor 200. For example, a first gate and a second gate of the transistor 400 are diode-connected to a source, and the source of the transistor 400 is connected to the second gate of the transistor 200. When a negative potential of the second gate of the transistor 200 is held in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistor 200 and the transistor 400. Accordingly, the memory device including the transistor 200 and the transistor 400 can retain stored data for a long time.

In FIG. 17, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to the gate of the transistor 200, and the wiring 1006 is electrically connected to a back gate of the transistor 200. The gate of the transistor 300 and the other of the source and the drain of the transistor 200 are electrically connected to one electrode of the capacitor 100. The wiring 1005 is electrically connected to the other electrode of the capacitor 100. A wiring 1007 is electrically connected to the source of the transistor 400. A wiring 1008 is electrically connected to a gate of the transistor 400. A wiring 1009 is electrically connected to a back gate of the transistor 400. A wiring 1010 is electrically connected to the drain of the transistor 400. The wiring 1006, the wiring 1007, the wiring 1008, and the wiring 1009 are electrically connected to each other.

When the memory devices illustrated in FIG. 17 are arranged in a matrix like the memory devices illustrated in FIG. 16, a memory cell array can be formed. Note that one transistor 400 can change second gate voltages of a plurality of transistors 200. For this reason, the number of transistors 400 is preferably smaller than the number of transistors 200.

<Transistor 400>

The transistor 400 and the transistors 200 are formed in the same layer and thus can be fabricated in parallel. The transistor 400 includes a conductor 460 functioning as a first gate electrode; a conductor 405 (a conductor 405$a$ and a conductor 405$b$) functioning as a second gate electrode; the insulator 222, the insulator 224, and an insulator 450 functioning as a gate insulating layer; an oxide 430$c$ including a region where a channel is formed; a conductor 442$a$, an oxide 432$b$, and an oxide 432$a$ functioning as one of a source and a drain; a conductor 442$b$, an oxide 431$b$, and an oxide 431$a$ functioning as the other of the source and the drain; and a conductor 446 (a conductor 446$a$ and a conductor 446$b$).

In the transistor 400, the conductor 405 is in the same layer as the conductor 205. The oxide 431$a$ and the oxide 432$a$ are in the same layer as the oxide 230$a$, and the oxide 431$b$ and the oxide 432$b$ are in the same layer as the oxide 230$b$. The conductor 442 is in the same layer as the conductor 242. The oxide 430$c$ is in the same layer as the oxide 230$c$. The insulator 450 is in the same layer as the insulator 250. The conductor 460 is in the same layer as the conductor 260.

Note that the structure body in the same layer can be formed at the same time. For example, the oxide 430$c$ can be formed by processing an oxide film to be the oxide 230$c$.

In the oxide 430$c$ functioning as an active layer of the transistor 400, oxygen vacancies and impurities such as hydrogen or water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low.

<<Dicing Line>>

Here, a dicing line (referred to as a scribe line, a dividing line, or a cutting line in some cases) which is provided when a large-sized substrate is divided into semiconductor elements so that a plurality of semiconductor devices are each formed in a chip form is described below. Examples of a dividing method include the case where a groove (a dicing line) for dividing the semiconductor elements is formed on the substrate, and then the substrate is cut along the dicing line to divide (split) it into a plurality of semiconductor devices.

Here, as illustrated in FIG. 17, for example, it is preferable that a region in which the insulator 274 and an insulator 215 are in contact with each other be the dicing line. That is, the insulator 274 is formed after an opening is provided in the insulator 222 and the insulator 216 in the vicinity of the region to be the dicing line that is provided in an outer edge of the transistor 400 and the memory cell including a plurality of transistors 200.

That is, in the opening provided in the insulator 223 and the insulator 216, the insulator 214 is in contact with the insulator 274. For example, the insulator 215 and the insulator 274 may be formed using the same material and the same method. When the insulator 215 and the insulator 274 are formed using the same material and the same method, the adhesion therebetween can be increased. For example, silicon nitride is preferably used.

With such a structure, the insulator 224, the transistor 200 and the transistor 400 can be enclosed with the insulator 215 and the insulator 274. Since the insulator 215 and the insulator 274 have a function of inhibiting diffusion of oxygen, hydrogen, and water even when the substrate is divided into circuit regions each of which is provided with the semiconductor elements in this embodiment to form a plurality of chips, the mixing and diffusion of impurities such as hydrogen or water from the direction of a side surface of the divided substrate to the transistor 200 or the transistor 400 can be inhibited.

In the structure, excess oxygen in the insulator 224 can be inhibited from diffusing into the outside of the insulator 274 and the insulator 215. Accordingly, excess oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, the transistor 200 or the transistor 400 can have a small variation in the electrical characteristics and higher reliability.

This embodiment can be implemented in an appropriate combination with the structures described in the other embodiments, Example, and the like.

Embodiment 4

In this embodiment, a memory device of one embodiment of the present invention including a transistor in which an oxide is used for a semiconductor (hereinafter referred to as an OS transistor in some cases) and a capacitor (hereinafter, such a memory device is also referred to as an OS memory device in some cases), is described with reference to FIG. 18 and FIG. 19. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

Structure Example of Memory Device

Figure 18A:
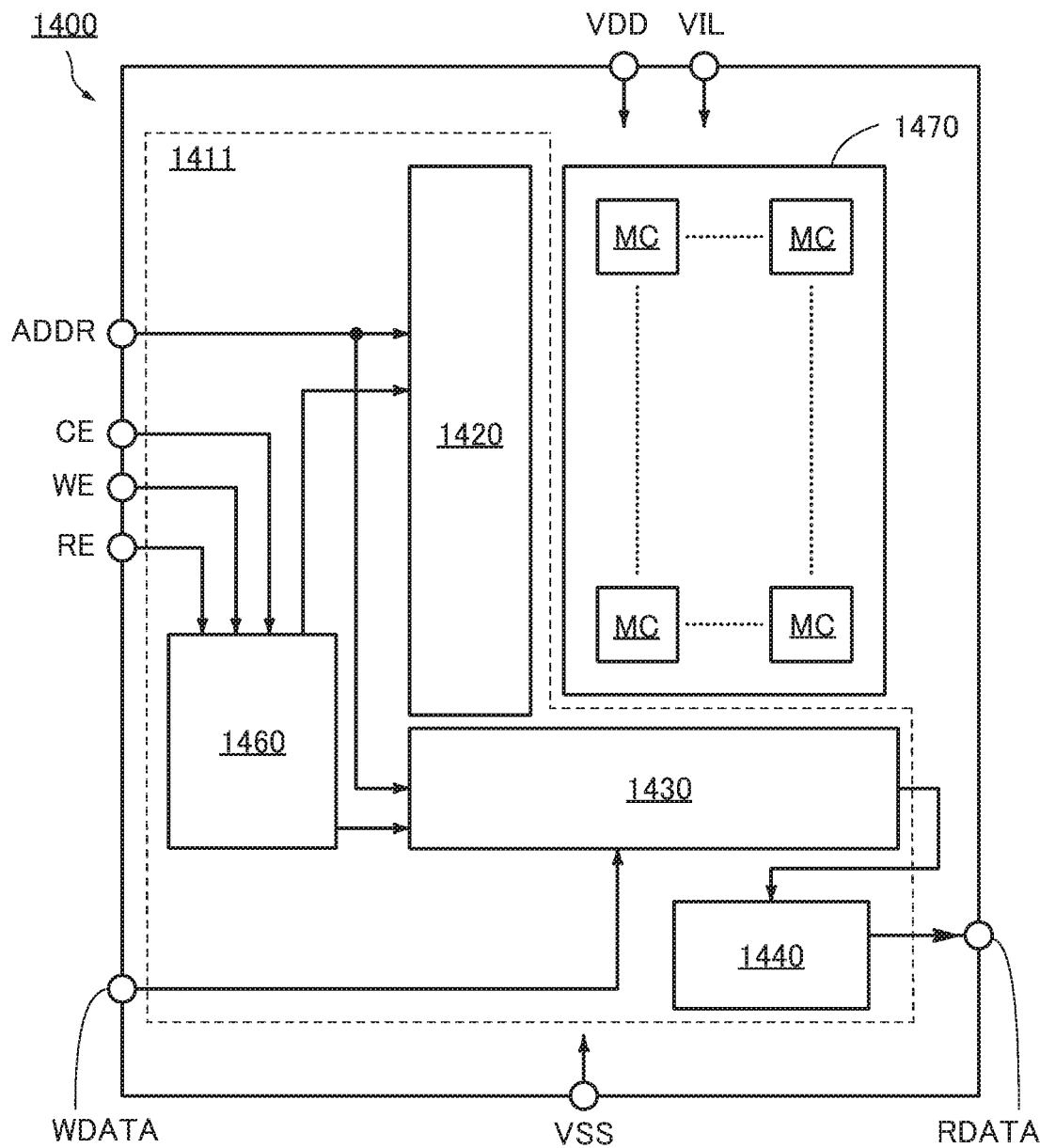
FIGS. 18A and 18B A block diagram and a schematic diagram illustrating a structure example of a memory device of one embodiment of the present invention.

FIG. 18(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and WDATA is input to the write circuit.

The control logic circuit 1460 processes the input signals (CE, WE, and RE) input from the outside, and generates control signals for the row decoder and the column decoder. CE is a chip enable signal, WE is a write enable signal, and RE is a read enable signal. Signals processed by the control logic circuit 1460 are not limited thereto, and other control signals may be input as necessary.

The memory cell array 1470 includes a plurality of memory cells MC and a plurality of wirings arranged in a matrix. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 18B:
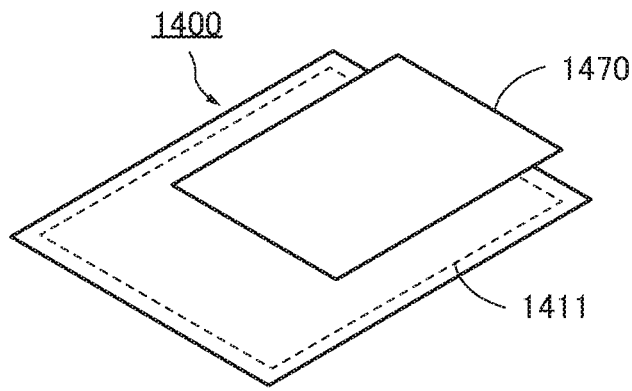

Note that FIG. 18(A) illustrates an example in which the peripheral circuit 1411 and the memory cell array 1470 are formed on the same plane; however, this embodiment is not limited thereto. For example, as illustrated in FIG. 18(B), the memory cell array 1470 may be provided to overlap part of the peripheral circuit 1411. For example, the sense amplifier may be provided below the memory cell array 1470 so that they overlap with each other.

FIG. 19 illustrates configuration examples of a memory cell applicable to the memory cell MC.

[DOSRAM]

Figure 19A:
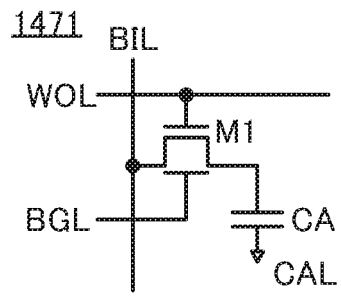
FIGS. 19A to 19H Circuit diagrams illustrating configuration examples of a memory device of one embodiment of the present invention.
Figure 19B:
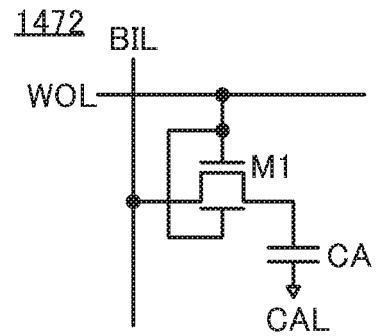
Figure 19C:
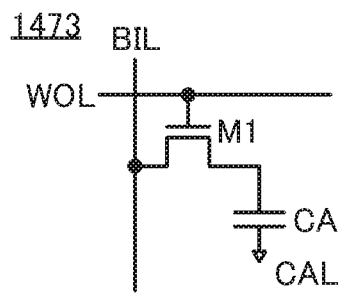
Figure 19D:
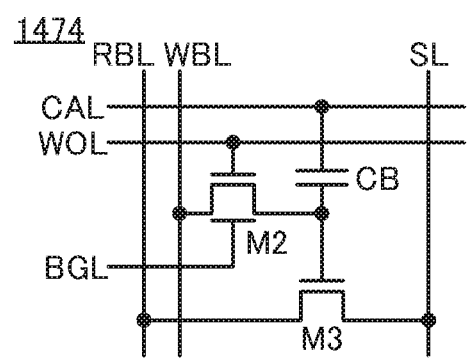
Figure 19E:
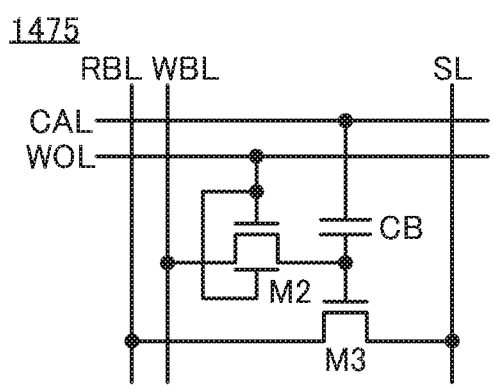
Figure 19F:
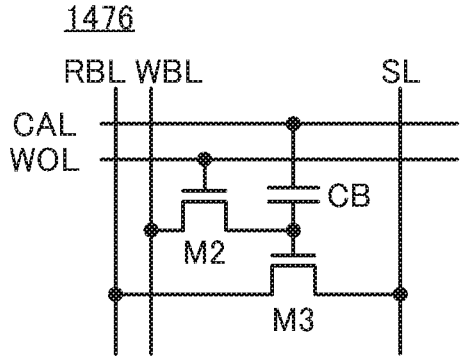
Figure 19G:
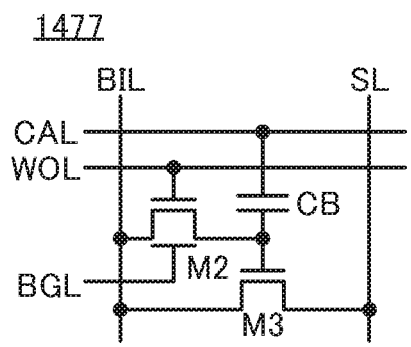

FIGS. 19(A) to 19(C) illustrate circuit configuration examples of a memory cell of a DRAM. In this specification and the like, a DRAM using a memory cell of one capacitor for one OS transistor is referred to as DOSRAM in some cases. A memory cell 1471 illustrated in FIG. 19(A) includes a transistor M1 and a capacitor CA. Note that the transistor M1 includes a gate (also referred to as a top gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. Applying a given potential to the wiring BGL can increase or decrease the threshold voltage of the transistor M1.

The memory cell MC is not limited to the memory cell 1471, and the circuit configuration can be changed. For example, as in a memory cell 1472 illustrated in FIG. 19(B), the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 19(C).

In the case where the semiconductor device described in the above embodiment is used for the memory cell 1471 and the like, the transistor described in the above embodiment can be used as the transistor M1. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation of the memory cell can be unnecessary. In addition, owing to an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIGS. 19(D) to 19(H) illustrate circuit configuration examples of a gain-cell memory cell of one capacitor for two transistors. A memory cell 1474 illustrated in FIG. 19(D) includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. By application of a given potential to the wiring BGL, the threshold voltage of the transistor M2 can be increased or decreased.

The memory cell MC is not limited to the memory cell 1474, and the circuit configuration can be changed as appropriate. For example, as in a memory cell 1475 illustrated in FIG. 19(E), the back gate of the transistor M2 may be connected not to the wiring BGL but to the wiring WOL in the memory cell MC. Alternatively, for example, the memory cell MC may be a memory cell including as single-gate transistor, that is, the transistor M2 not including a back gate, as in a memory cell 1476 illustrated in FIG. 19(F). Alternatively, for example, in the memory cell MC, the wiring WBL and the wiring RBL may be combined into one wiring BIL, as in a memory cell 1477 illustrated in FIG. 19(G).

In the case where the semiconductor device described in the above embodiment is used for the memory cell 1474 and the like, the transistor described in the above embodiment can be used as the transistor M2. When an OS transistor is used as the transistor M2, the leakage current of the transistor M2 can be extremely low. Accordingly, with the use of the transistor M2, written data can be retained for a long time, and thus the frequency of the refresh operation for the memory cell can be decreased. In addition, refresh operation of the memory cell can be unnecessary. In addition, owing to an extremely low leakage current, multi-level data or analog data can be retained in the memory cell 1474. The same applies to the memory cells 1475 to 1477.

Note that the transistor M3 may be a transistor containing silicon in a channel formation region (hereinafter, also referred to as a Si transistor in some cases). The conductivity type of the Si transistor may be of either an n-channel type or a p-channel type. The Si transistor has higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Alternatively, the transistor M3 may be an OS transistor. When an OS transistor is used as each of the transistor M2 and the transistor M3, the circuit of the memory cell array 1470 can be formed using only n-channel transistors.

Figure 19H:
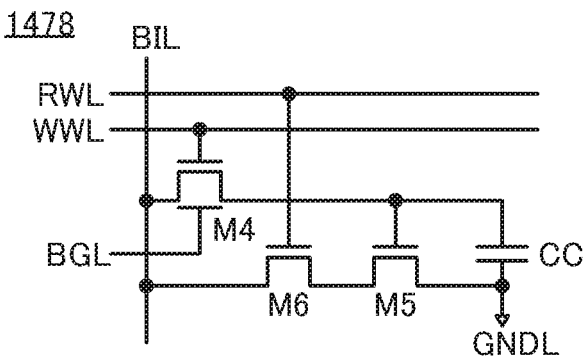

FIG. 19(H) illustrates an example of a gain-cell memory cell of one capacitor for three transistors. A memory cell 1478 illustrated in FIG. 19(H) includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate that is electrically connected to the wiring BGL. Note that the back gate and the gate of the transistor M4 may be electrically connected to each other. Alternatively, the transistor M4 may include no back gate.

Note that each of the transistor M5 and the transistor M6 may be an n-channel Si transistor or a p-channel Si transistor. Alternatively, the transistor M4 to the transistor M6 may be OS transistors, in which case the circuit of the memory cell array 1470 can be formed using only re-channel transistors.

In the case where the semiconductor device described in the above embodiment is used for the memory cell 1478, the transistor described in the above embodiment can be used as the transistor M4. When an OS transistor is used as the transistor M4, the leakage current of the transistor M4 can be extremely low.

Note that the configurations of the peripheral circuit 1411, the memory cell array 1470, and the like described in this embodiment are not limited to the above. Positions and functions of these circuits, wirings connected to the circuits, circuit elements, and the like can be changed, deleted, or added as needed.

The structure described in this embodiment can be used in an appropriate combination with the structures described in the other embodiments, Example, and the like.

Embodiment 5

In this embodiment, an example of a chip 1200 on which the semiconductor device of the present invention is mounted is described with reference to FIG. 20. A plurality of circuits (systems) are mounted on the chip 1200. The technique for integrating a plurality of circuits (systems) on one chip as described above is referred to as system on chip (SoC) in some cases.

Figure 20A:
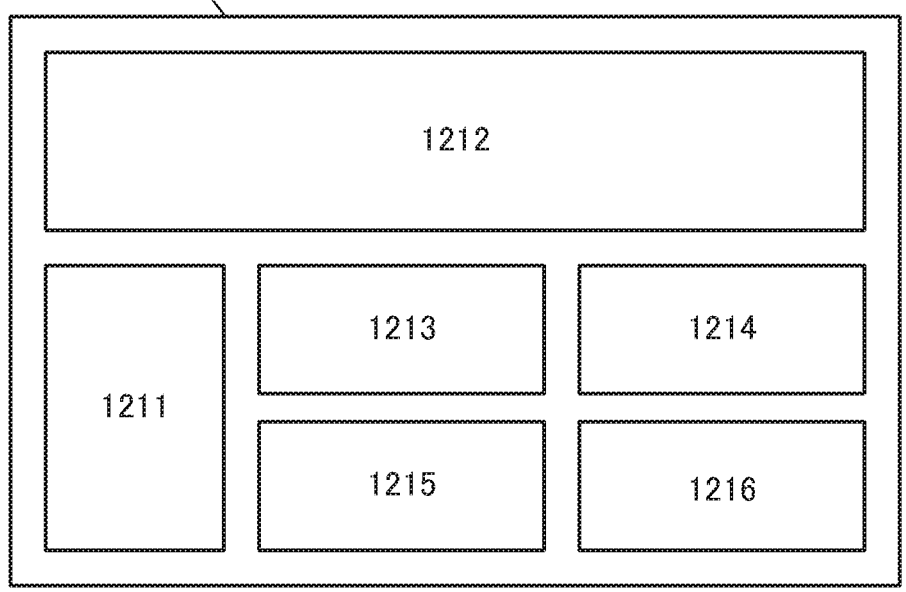
FIGS. 20A and 20B A block diagram and a schematic diagram of a semiconductor device of one embodiment of the present invention.

As illustrated in FIG. 20(A), the chip 1200 includes a CPU (Central Processing Unit) 1211, a GPU (Graphics Processing Unit) 1212, one or a plurality of analog arithmetic units 1213, one or a plurality of memory controllers 1214, one or a plurality of interfaces 1215, one or a plurality of network circuits 1216, and the like.

Figure 20B:
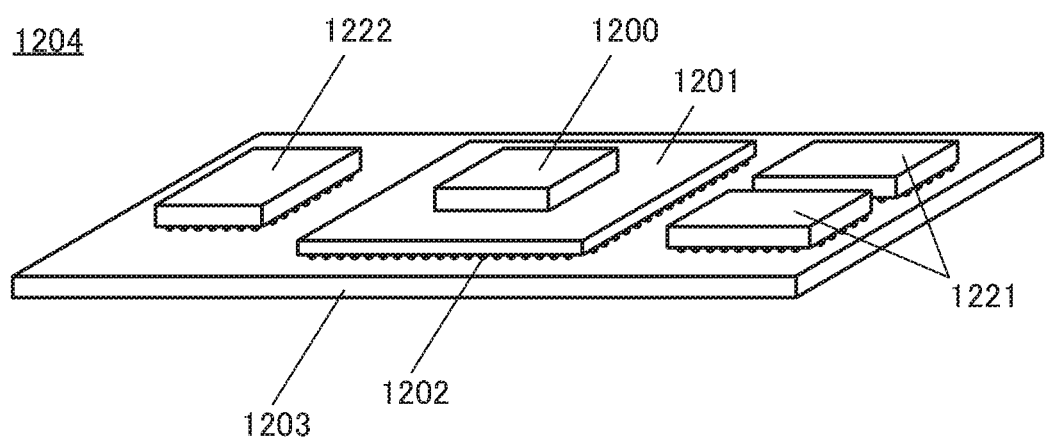

A bump (not illustrated) is provided on the chip 1200, and as illustrated in FIG. 20(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for connection with an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, a circuit for network security may be included.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (non-stationary) game console. Furthermore, the product-sum operation circuit using the GPU 1212 can execute a method such as a deep neural network (DNN), a convolutional neural network (CNN), a recurrent neural network (RNN), an autoencorder, a deep Boltzmann machine (DBM), or a deep belief network (DBN); thus, the chip 1200 can be used as an AI chip or the GPU module 1204 can be used as an AI system module.

The structure described in this embodiment can be used in an appropriate combination with the structures described in the other embodiments, Example, and the like.

Embodiment 6

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 21 schematically illustrates some structure examples of removable memory devices. The semiconductor device described in the above embodiment is processed into a packaged memory chip and used in a variety of storage devices and removable memories, for example.

Figure 21A:
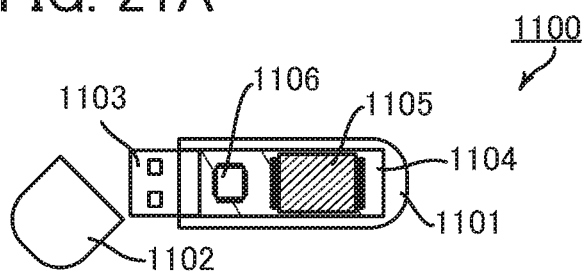
FIGS. 21A to 21E Schematic diagrams of memory devices of one embodiment of the present invention.

FIG. 21(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

Figure 21B:
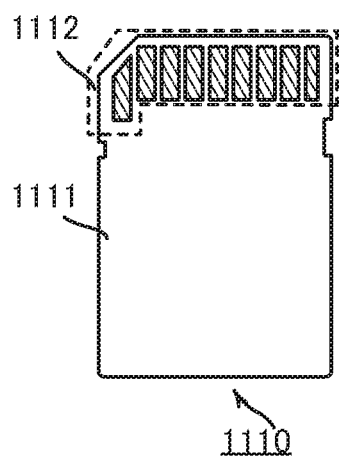
Figure 21C:
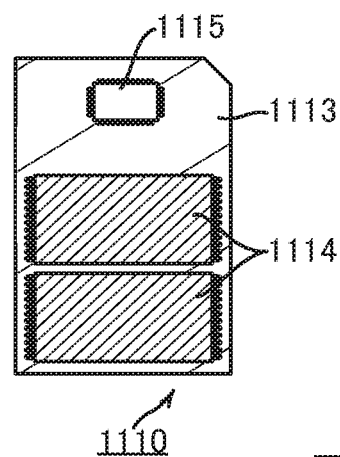

FIG. 21(B) is a schematic external view of an SD card, and FIG. 21(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

Figure 21D:
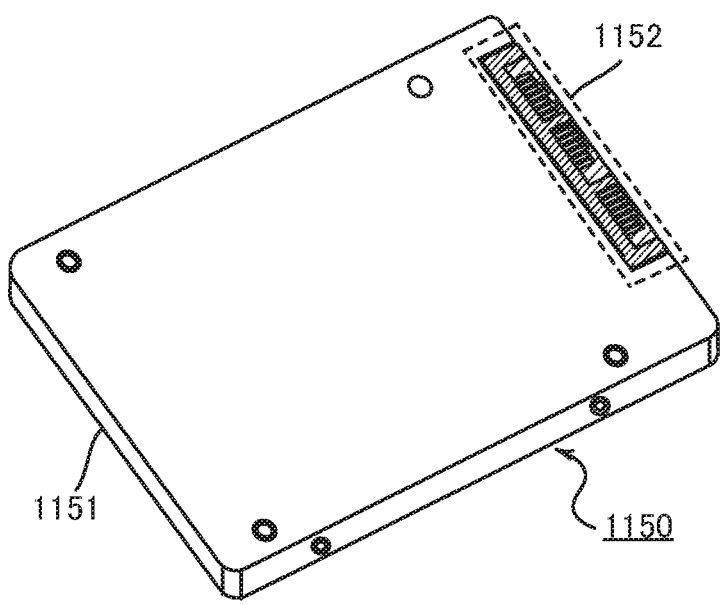
Figure 21E:
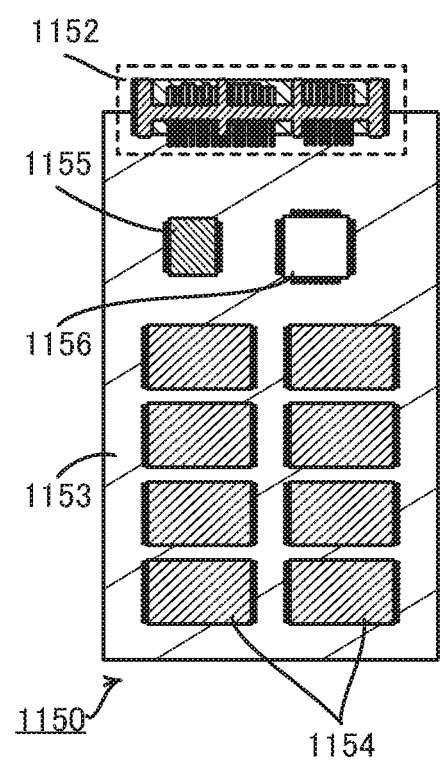

FIG. 21(D) is a schematic external view of an SSD, and FIG. 21(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments, Example, and the like.

Embodiment 7

In this embodiment, a display device and a display module are described as examples of a semiconductor device including the transistor disclosed in this specification and the like.

The transistor using an oxide semiconductor, which is described using the transistor 200 or the like, is also referred to as an OS transistor below in some cases.

<Display Device>

Figure 22A:
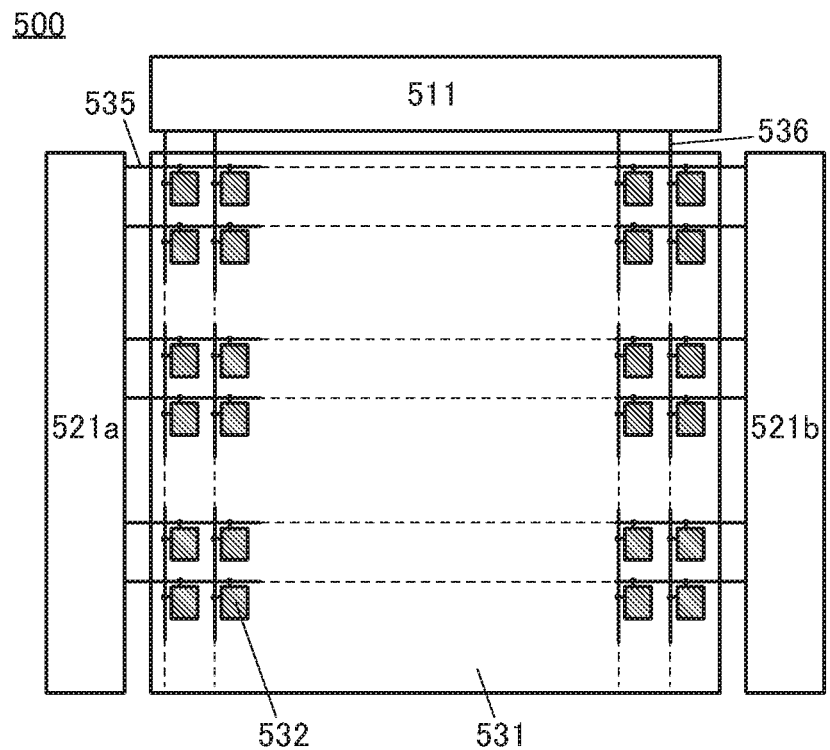
FIGS. 22A to 22C Diagrams illustrating an example of a display device and circuit configuration examples of a pixel.

An example of a display device in which the above transistor can be used is described. FIG. 22(A) is a block diagram illustrating a configuration example of a display device 500.

The display device 500 illustrated in FIG. 22(A) includes a driver circuit 511, a driver circuit 521a, a driver circuit 521b, and a display region 531. Note that the driver circuit 511, the driver circuit 521a, and the driver circuit 521b are collectively referred to as a "driver circuit" or a "peripheral driver circuit" in some cases.

The driver circuit 521a and the driver circuit 521b can function as scan line driver circuits, for example. The driver circuit 511 can function as a signal line driver circuit, for example. Note that one of the driver circuit 521a and the driver circuit 521b may be omitted. Some sort of circuit may be provided to face the driver circuit 511 with the display region 531 placed therebetween.

The display device 500 illustrated in FIG. 22(A) as an example includes p wirings 535 that are arranged substantially parallel to each other and whose potentials are controlled by the driver circuit 521a and/or the driver circuit 521b, and q wirings 536 that are arranged substantially parallel to each other and whose potentials are controlled by the driver circuit 511 (p and q are each a natural number of 1 or more). The display region 531 includes a plurality of pixels 532 arranged in a matrix. The pixel 532 includes a pixel circuit 534 and a display element.

When three pixels 532 function as one pixel, full-color display can be achieved. The three pixels 532 each control the transmittance, reflectance, amount of emitted light, or the like of red light, green light, or blue light. The light colors controlled by the three pixels 532 are not limited to the combination of red, green, and blue and may be yellow, cyan, and magenta.

A pixel 532 that controls white light may be added to the pixels controlling red light, green light, and blue light so that the four pixels 532 may collectively function as one pixel. The addition of the pixel 532 controlling white light can increase the luminance of the display region. When the number of pixels 532 functioning as one pixel is increased and red, green, blue, yellow, cyan, and magenta are used in appropriate combination, the range of color reproduction can be widened.

Using the pixels arranged in a matrix of 1920×1080, the display device 500 that can achieve display with a resolution of what is called full high definition (also referred to as "2K resolution", "2K1K", "2K", or the like) can be obtained. For example, using the pixels arranged in a matrix of 3840×2160, the display device 500 that can achieve display with a resolution of what is called ultra high definition (also referred to as "4K resolution", "4K2K", "4K", or the like) can be obtained. For example, using the pixels arranged in a matrix of 7680×4320, the display device 500 that can achieve display with a resolution of what is called super high definition (also referred to as "8K resolution", "8K4K", "8K", or the like) can be obtained. By increasing the number of pixels, the display device 500 that can achieve display with 16K or 32K resolution can be obtained.

A wiring 535g in the g-th row (g is a natural number of 1 top) is electrically connected to q pixels 532 arranged in the g-th row among the plurality of pixels 532 arranged in p rows and q columns in the display region 531. A wiring 536_h in the h-th column (h is a natural number of 1 to q) is electrically connected top pixels 532 arranged in the h-th column among the plurality of pixels 532 arranged in p rows and q columns.

[Display Element]

The display device 500 can employ various modes or include various display elements. Examples of display elements include an EL (electroluminescence) element (an organic EL element, an inorganic EL element, or an EL element containing organic and inorganic materials), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a display element using MEMS (micro electro mechanical systems), a digital micromirror device (DMD), a DMS (digital micro shutter), MIRASOL (registered trademark), an IMOD (interferometric modulation) element, a MEMS shutter display element, an optical-interference-type MEMS display element, an electrowetting element, a piezoelectric ceramic display, a display element using a carbon nanotube, and the like, which are elements including a display medium whose contrast, luminance, reflectivity, transmittance, or the like is changed by an electrical or magnetic effect. Alternatively, quantum dots may be used as the display element.

Examples of display devices using EL elements include an EL display. Examples of display devices using electron emitters include a field emission display (FED), an SED-type flat panel display (SED: Surface-conduction Electron-emitter Display), and the like. Examples of display devices using quantum dots include a quantum dot display and the like. Examples of display devices using liquid crystal elements include a liquid crystal display (a transmissive liquid crystal display, a transflective liquid crystal display, a reflective liquid crystal display, a direct-view liquid crystal display, or a projection liquid crystal display) and the like. Examples of display devices using electronic ink, Electronic Liquid Powder (registered trademark), or an electrophoretic element include electronic paper and the like. The display device may be a plasma display panel (PDP). Alternatively, the display device may be a retina scanning-type projection device.

Note that in the case of achieving a transflective liquid crystal display or a reflective liquid crystal display, some or all of pixel electrodes function as reflective electrodes. For example, some or all of pixel electrodes contain aluminum, silver, or the like. Moreover, in such a case, a memory circuit such as an SRAM can be provided under the reflective electrodes. Thus, the power consumption can be further reduced.

Note that in the case where an LED is used, graphene or graphite may be provided under an electrode or a nitride semiconductor of the LED. Graphene or graphite may be a multilayer film in which a plurality of layers are stacked. Providing graphene or graphite as described above facilitates deposition of a nitride semiconductor, such as an n-type GaN semiconductor layer containing crystals, thereover. Furthermore, a p-type GaN semiconductor layer containing crystals or the like can be provided thereover to form the LED. Note that an AlN layer may be provided between graphene or graphite and the n-type GaN semiconductor layer containing crystals. The GaN semiconductor layer included in the LED chip may be formed by MOCVD. Note that when graphene is provided, the GaN semiconductor layer included in the LED can be deposited by a sputtering method.

FIG. 22(B), FIG. 22(C), FIG. 23(A), and FIG. 23(B) illustrate circuit configuration examples that can be used for the pixel 532.

Example of Pixel Circuit for Light-Emitting Display Device

Figure 22B:
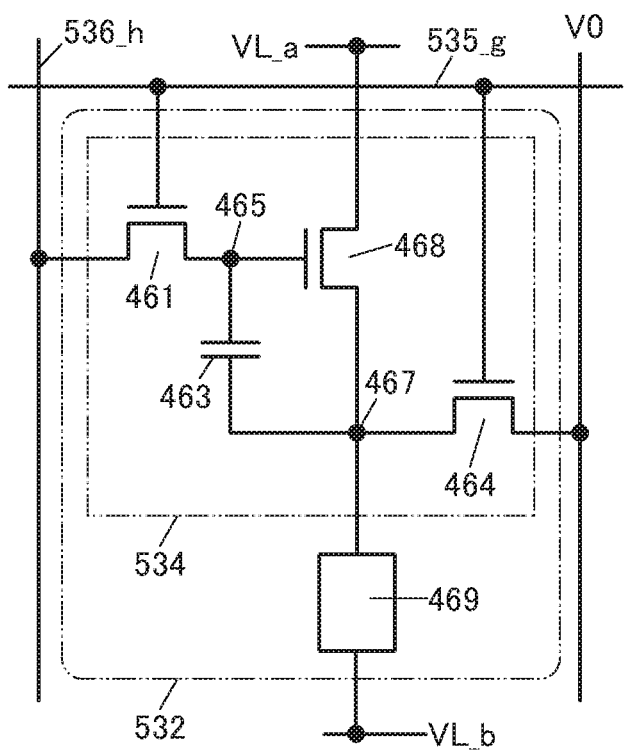

The pixel circuit 534 illustrated in FIG. 22(B) includes a transistor 461, a capacitor 463, a transistor 468, and a transistor 464. The pixel circuit 534 illustrated in FIG. 22(B) is electrically connected to a light-emitting element 469 that can function as a display element.

OS transistors can be used as the transistor 461, the transistor 468, and the transistor 464. It is particularly preferable to use an OS transistor as the transistor 461.

One of a source and a drain of the transistor 461 is electrically connected to the wiring 536_h. Furthermore, a gate of the transistor 461 is electrically connected to the wiring 535_g. A video signal is supplied from the wiring 536_h.

The transistor 461 has a function of controlling writing of a video signal to a node 465.

One of a pair of electrodes of the capacitor 463 is electrically connected to the node 465, and the other is electrically connected to a node 467. The other of the source and the drain of the transistor 461 is electrically connected to the node 465.

The capacitor 463 has a function of a storage capacitor for retaining data written to the node 465.

One of a source and a drain of the transistor 468 is electrically connected to a potential supply line VL_a, and the other is electrically connected to the node 467. Furthermore, a gate of the transistor 468 is electrically connected to the node 465.

One of a source and a drain of the transistor 464 is electrically connected to a potential supply line V0, and the other is electrically connected to the node 467. Furthermore, a gate of the transistor 464 is electrically connected to the wiring 535_g.

One of an anode and a cathode of the light-emitting element 469 is electrically connected to a potential supply line VL_b, and the other is electrically connected to the node 467.

As the light-emitting element 469, an organic electroluminescent element (also referred to as an organic EL element) can be used, for example. Note that the light-emitting element 469 is not limited thereto; an inorganic EL element formed of an inorganic material may be used, for example.

A high power supply potential VDD is supplied to one of the potential supply line VL_a and the potential supply line VL_b, and a low power supply potential VSS is supplied to the other, for example.

In the display device 500 including the pixel circuits 534 in FIG. 22(B), the pixels 532 are sequentially selected row by row by the driver circuit 521a and/or the driver circuit 521b, and then the transistor 461 and the transistor 464 are brought into an on state and a video signal is written to the node 465.

The pixel 532 in which data has been written to the node 465 is brought into a holding state when the transistor 461 and the transistor 464 are brought into an off state. Furthermore, the amount of current flowing between the source electrode and the drain electrode of the transistor 468 is adjusted in accordance with the potential of the data written to the node 465, and the light-emitting element 469 emits light with a luminance corresponding to the amount of flowing current. This operation is sequentially performed row by row; thus, an image can be displayed.

Figure 23A:
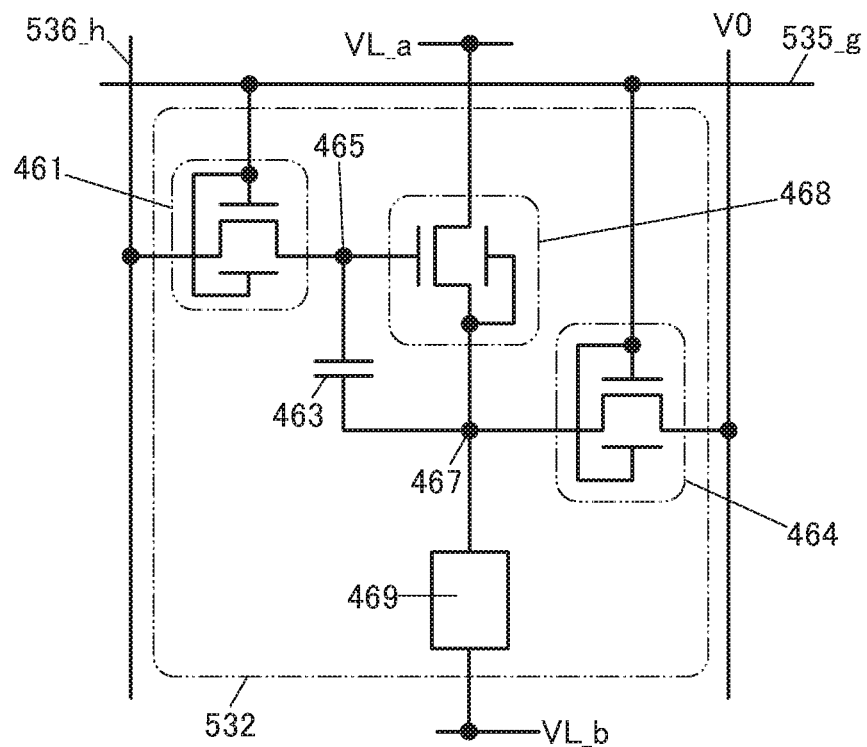
FIGS. 23A and 23B Diagrams illustrating circuit configuration examples of a pixel.

As illustrated in FIG. 23(A), a transistor having a backgate may be used as the transistor 461, the transistor 464, and the transistor 468. In each of the transistor 461 and the transistor 464 illustrated in FIG. 23(A), the gate is electrically connected to the backgate. Thus, the gate and the backgate always have the same potential. The backgate of the transistor 468 is electrically connected to the node 467. Thus, the backgate always has the same potential as the node 467.

The OS transistor described above can be used as at least one of the transistor 461, the transistor 468, and the transistor 464.

Example of Pixel Circuit for Liquid Crystal Display Device

Figure 22C:
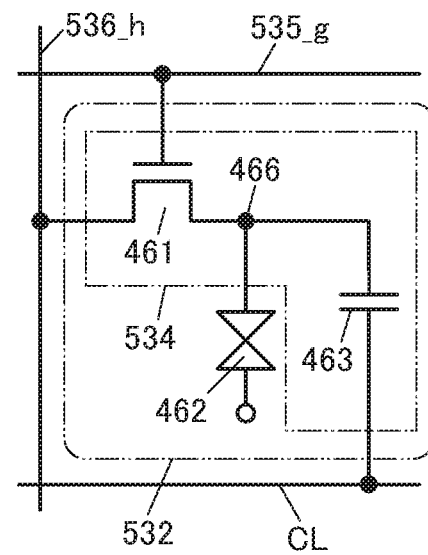

The pixel circuit 534 illustrated in FIG. 22(C) includes the transistor 461 and the capacitor 463. The pixel circuit 534 illustrated in FIG. 22(C) is electrically connected to a liquid crystal element 462 that can function as a display element. It is preferable to use an OS transistor as the transistor 461.

The potential of one of a pair of electrodes of the liquid crystal element 462 is set as appropriate according to the specifications of the pixel circuit 534. For example, the one of the pair of electrodes of the liquid crystal element 462 may be supplied with a common potential, or may have the same potential as a capacitor line CL which is described later. Alternatively, a potential supplied to the one of the pair of electrodes of the liquid crystal element 462 may vary among the pixels 532. The other of the pair of electrodes of the liquid crystal element 462 is electrically connected to a node 466. The alignment state of the liquid crystal element 462 depends on data written to the node 466.

As a driving method of the display device including the liquid crystal element 462, for example, a TN (Twisted Nematic) mode, an STN (Super Twisted Nematic) mode, a VA mode, an ASM (Axially Symmetric Aligned Micro-cell) mode, an OCB (Optically Compensated Birefringence) mode, an FLC (Ferroelectric Liquid Crystal) mode, an AFLC (AntiFerroelectric Liquid Crystal) mode, an MVA mode, a PVA (Patterned Vertical Alignment) mode, an IPS mode, an FFS mode, a TBA (Transverse Bend Alignment) mode, and the like may be used. Examples of a driving method of the display device include, in addition to the above driving methods, an ECB (Electrically Controlled Birefringence) mode, a PDLC (Polymer Dispersed Liquid Crystal) mode, a PNLC (Polymer Network Liquid Crystal) mode, and a guest-host mode. However, not limited to the above, a variety of liquid crystal elements and the driving methods thereof can be used.

When the liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

A liquid crystal exhibiting a blue phase for which an alignment film is not needed may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which a chiral material is mixed to account for 5 weight % or more is used for the liquid crystal layer in order to improve the temperature range. The liquid crystal composition that contains a liquid crystal exhibiting the blue phase and a chiral material has a short response time of 1 msec or less, and has optical isotropy, which makes the alignment process unneeded and has the viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, the productivity of the liquid crystal display device can be increased.

Moreover, it is possible to use a method called domain multiplication or multi-domain design, in which a pixel (pixel) is divided into some regions (subpixels) and molecules are aligned in different directions in their respective regions.

The specific resistivity of a liquid crystal material is greater than or equal to $1 \times 10^9$ Ω·cm, preferably greater than or equal to $1 \times 10^{11}$ Ω·cm, further preferably greater than or equal to 1×10$^{12}$ Ω·cm. Note that a value of the specific resistivity in this specification is a value measured at 20° C.

In the pixel circuit 534 in the g-th row and the h-th column, one of the source and the drain of the transistor 461 is electrically connected to the wiring 536_h, and the other is electrically connected to the node 466. The gate of the transistor 461 is electrically connected to the wiring 535_g. A video signal is supplied from the wiring 536_h. The transistor 461 has a function of controlling writing of a video signal to the node 466.

One of the pair of electrodes of the capacitor 463 is electrically connected to a wiring to which a particular potential is supplied (hereinafter, the capacitor line CL), and the other is electrically connected to the node 466. Note that the potential value of the capacitor line CL is set as appropriate according to the specifications of the pixel circuit 534. The capacitor 463 has the function of a storage capacitor for retaining data written to the node 466.

In the display device 500 including the pixel circuits 534 in FIG. 22(C), for example, the pixel circuits 534 are sequentially selected row by row by the driver circuit 521a and/or the driver circuit 521b, and then the transistor 461 is brought into an on state and a video signal is written to the node 466.

The pixel circuit 534 in which the video signal has been written to the node 466 is brought into a holding state when the transistor 461 is brought into an off state. This operation is sequentially performed row by row; thus, an image can be displayed on the display region 531.

Figure 23B:
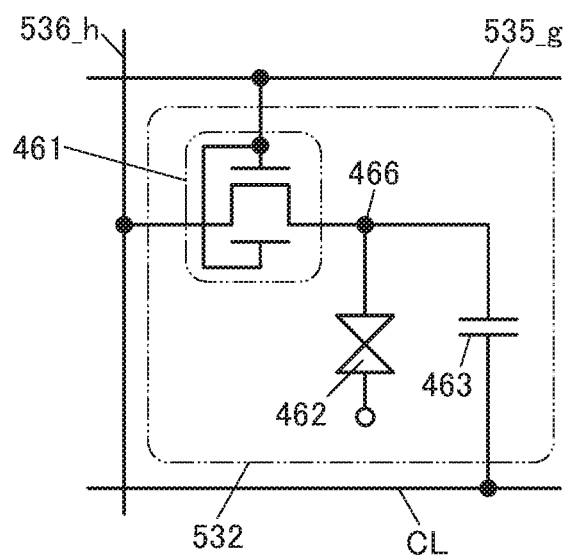

As illustrated in FIG. 23(B), a transistor having a backgate may be used as the transistor 461. In the transistor 461 illustrated in FIG. 23(B), the gate is electrically connected to the backgate. Thus, the gate and the backgate always have the same potential.

Structure Example of Peripheral Circuit

Figure 24A:
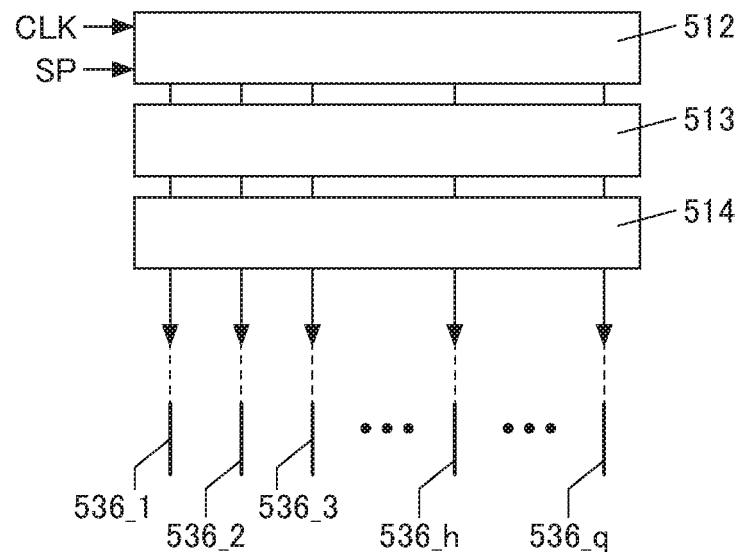
FIGS. 24A and 24B Diagrams illustrating structure examples of a driver circuit.
Figure 24B:
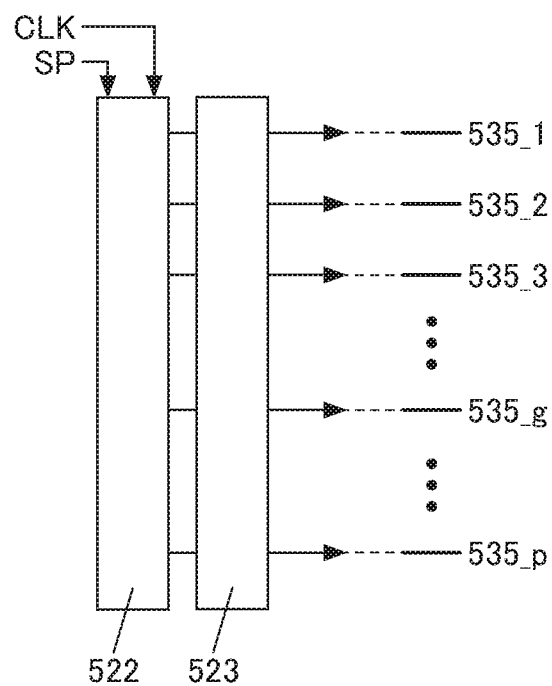

FIG. 24(A) illustrates a structure example of the driver circuit 511. The driver circuit 511 includes a shift register 512, a latch circuit 513, and a buffer 514. FIG. 24(B) illustrates a structure example of the driver circuit 521a. The driver circuit 521a includes a shift register 522 and a buffer 523. The driver circuit 521b can have a structure similar to that of the driver circuit 521a.

A start pulse SP, a clock signal CLK, and the like are input to the shift register 512 and the shift register 522.

Structure Example of Display Device

With the use the OS transistor described in the above embodiment, some or all of driver circuits that include shift registers can be integrally formed over the same substrate as a pixel portion, whereby a system-on-panel can be formed.

Figure 25A:
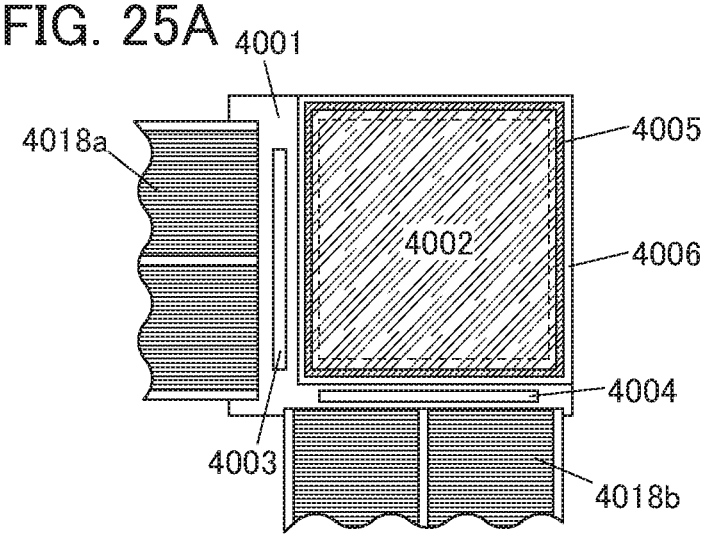
FIGS. 25A to 25C Diagrams illustrating examples of a display device.

In this embodiment, a structure example of a display device using a liquid crystal element and a structure example of a display device using an EL element are described. In FIG. 25(A), a sealant 4005 is provided so as to surround a pixel portion 4002 provided over a first substrate 4001, and a pixel 402 is sealed by the sealant 4005 and a second substrate 4006. In FIG. 25(A), a signal line driver circuit 4003 and a scan line driver circuit 4004 that are formed using a single crystal semiconductor or a polycrystalline semiconductor over a substrate separately prepared are mounted in a region different from the region surrounded by the sealant 4005 over the first substrate 4001. Various signals and potentials given to the signal line driver circuit 4003, the scan line driver circuit 4004, or the pixel portion 4002 are supplied from an FPC 4018a (Flexible printed circuit) and an FPC 4018b.

Figure 25B:
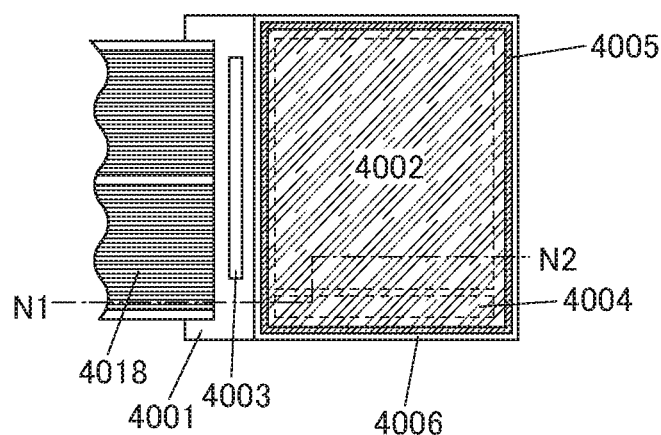
Figure 25C:
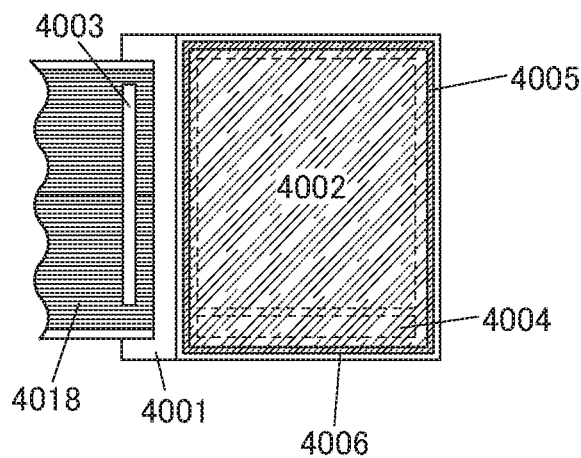

In FIG. 25(B) and FIG. 25(C), the sealant 4005 is provided so as to surround the pixel portion 4002 and the scan line driver circuit 4004 that are provided over the first substrate 4001. The second substrate 4006 is provided over the pixel portion 4002 and the scan line driver circuit 4004. Thus, the pixel portion 4002 and the scan line driver circuit 4004 are sealed together with a display element by the first substrate 4001, the sealant 4005, and the second substrate 4006. In FIG. 25(B) and FIG. 25(C), the signal line driver circuit 4003 that is formed using a single crystal semiconductor or a polycrystalline semiconductor over a substrate separately prepared is mounted in a region different from the region surrounded by the sealant 4005 over the first substrate 4001. In FIG. 25(B) and FIG. 25(C), various signals and potentials given to the signal line driver circuit 4003, the scan line driver circuit 4004, or the pixel portion 4002 are supplied from the FPC 4018.

Although FIG. 25(B) and FIG. 25(C) illustrate the examples in which the signal line driver circuit 4003 is formed separately and mounted on the first substrate 4001, the structure is not limited thereto. The scan line driver circuit may be separately formed and then mounted, or only part of the signal line driver circuit or part of the scan line driver circuit may be separately formed and then mounted.

Note that there is no particular limitation on the connection method of the separately formed driver circuit; wire bonding, COG (Chip On Glass), TCP (Tape Carrier Package), COF (Chip On Film), or the like can be used. FIG. 25(A) illustrates an example in which the signal line driver circuit 4003 and the scan line driver circuit 4004 are mounted by COG, FIG. 25(B) illustrates an example in which the signal line driver circuit 4003 is mounted by COG, and FIG. 25(C) illustrates an example in which the signal line driver circuit 4003 is mounted by TCP.

In some cases, the display device encompasses a panel in which the display element is sealed, and a module in which an IC or the like including a controller is mounted on the panel.

The pixel portion and the scan line driver circuit provided over the first substrate include a plurality of transistors, and the OS transistor described in the above embodiment can be used.

Figures 26A, 26B:
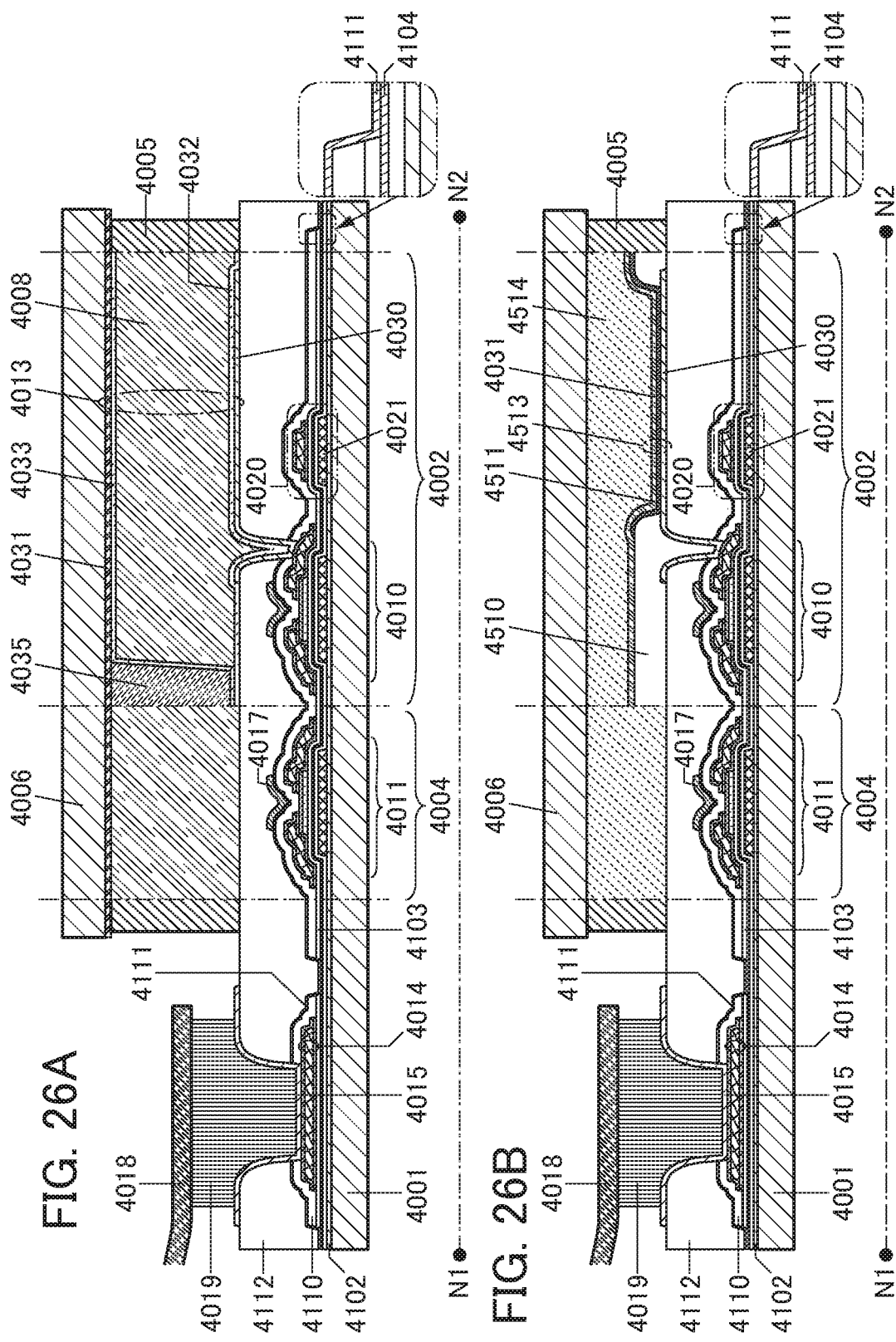
FIGS. 26A and 26B Diagrams illustrating examples of a display device.

FIG. 26(A) and FIG. 26(B) are cross-sectional views illustrating cross-sectional structures of portions indicated by the chain line N1-N2 in FIG. 25(B). FIG. 26(A) is an example of a liquid crystal display device using a liquid crystal element as the display element. FIG. 26(B) is an example of a light-emitting display device (also referred to as an "EL display device") using a light-emitting element as the display element.

The display devices illustrated in FIG. 26(A) and FIG. 26(B) each include the electrode 4015, and the electrode 4015 is electrically connected to a terminal included in the FPC 4018 through an anisotropic conductive layer 4019. The electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The pixel portion 4002 and the scan line driver circuit 4004 provided over the first substrate 4001 include a plurality of transistors, and in FIG. 26(A) and FIG. 26(B), the transistor 4010 included in the pixel portion 4002 and the transistor 4011 included in the scan line driver circuit 4004 are illustrated as examples. The insulating layer 4112 is provided over the transistor 4010 and the transistor 4011 in FIG. 26(A), and a partition wall 4510 is formed over the insulating layer 4112 in FIG. 26(B).

The transistor 4010 and the transistor 4011 are provided over an insulating layer 4102. The transistor 4010 and the transistor 4011 each include an electrode 4017 formed over an insulating layer 4103, and the insulating layer 4112 is formed over the electrode 4017. Note that the electrode 4017 can function as a back gate electrode.

The transistor described in the above embodiment can be used as the transistor 4010 and the transistor 4011. It is preferable to use OS transistors as the transistor 4010 and the transistor 4011. A change in the electrical characteristics of OS transistors is inhibited and thus the OS transistors are electrically stable. Accordingly, the display devices of this embodiment illustrated in FIG. 26(A) and FIG. 26(B) can be highly reliable display devices.

In the OS transistor, a current value in an off state (off-state current value) can be made small. Accordingly, the retention time of an electrical signal such as an image signal can be made longer, and a writing interval can also be set longer in a power-on state. Accordingly, the frequency of refresh operation can be reduced, which leads to an effect of reducing power consumption.

The OS transistor can have relatively high field-effect mobility and is thus capable of high-speed operation. Consequently, when the above OS transistor is used in a driver circuit portion or the pixel portion of the display device, high-quality images can be obtained. Moreover, the driver circuit portion or the pixel portion can be separately formed over the same substrate, so that the number of components of the display device can be reduced.

The display devices illustrated in FIG. 26(A) and FIG. 26(B) each include a capacitor 4020. The capacitor 4020 includes an electrode 4021 formed in the same step as a gate electrode of the transistor 4010, and an electrode formed in the same step as a source electrode and a drain electrode thereof. The electrodes overlap with each other with the insulating layer 4103 therebetween.

In general, the capacitance of a capacitor provided in a pixel portion of the display device is set in consideration of leakage current or the like of a transistor provided in the pixel portion so that charge can be held for a predetermined period. The capacitance of the capacitor may be set in consideration of off-state current of the transistor or the like.

For example, when an OS transistor is used for the pixel portion of the liquid crystal display device, the capacitance of the capacitor can be ⅓ or smaller or ⅕ or smaller of the liquid crystal capacitance. Moreover, using an OS transistor can omit the formation of a capacitor.

The transistor 4010 provided in the pixel portion 4002 is electrically connected to the display element. In FIG. 26(A), a liquid crystal element 4013 that is a display element includes the first electrode layer 4030, a second electrode layer 4031, and a liquid crystal layer 4008. An insulating layer 4032 and an insulating layer 4033 having a function of alignment films are provided to sandwich the liquid crystal layer 4008. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided to adjust a distance (cell gap) between the first electrode layer 4030 and the second electrode layer 4031. Note that a spherical spacer may be used.

In the display device, a black matrix (light-blocking layer), an optical member (optical substrate) such as a polarizing member, a retardation member, or an anti-reflection member, and the like may be provided. For example, circular polarization may be employed by using a polarizing substrate and a retardation substrate. In addition, a backlight, a side light, or the like may be used as a light source.

The display devices illustrated in FIG. 26(A) and FIG. 26(B) include the insulating layer 4111 and an insulating layer 4104. As the insulating layer 4111 and the insulating layer 4104, insulating layers through which an impurity element does not easily pass are used. A semiconductor layer of the transistor is sandwiched between the insulating layer 4111 and the insulating layer 4104, whereby entry of impurities from the outside can be prevented. Moreover, when the insulating layer 4111 and the insulating layer 4104 are in contact with each other outside the pixel portion 4002, the effect of preventing entry of impurities from the outside can be enhanced.

The insulating layer 4104 can be formed using a material and a method similar to those for the insulating layer 210, for example. The insulating layer 4111 can be formed using a material and a method similar to those for the insulator 282, for example.

As the display element included in the display device, a light-emitting element utilizing electroluminescence (also referred to as an "EL element") can be used. An EL element includes a layer containing a light-emitting compound (also referred to as an "EL layer") between a pair of electrodes. By generating a potential difference between the pair of electrodes that is greater than the threshold voltage of the EL element, holes are injected from the anode side and electrons are injected from the cathode side to the EL layer. The injected electrons and holes are recombined in the EL layer and a light-emitting substance contained in the EL layer emits light.

EL elements are classified according to whether a light-emitting material is an organic compound or an inorganic compound; in general, the former is referred to as an organic EL element, and the latter is referred to as an inorganic EL element.

In an organic EL element, by voltage application, electrons from one electrode and holes from the other electrode are injected into the EL layer. The carriers (electrons and holes) are recombined, and thus, a light-emitting organic compound forms an excited state, and light is emitted when the excited state returns to a ground state. Owing to such a mechanism, this light-emitting element is referred to as a current-excitation light-emitting element.

Besides the light-emitting compound, the EL layer may also include a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), and the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is interposed between dielectric layers, which are further interposed between electrodes, and its light emission mechanism is localized type light emission that utilizes inner-shell electron transition of metal ions. Note that the description is made here using an organic EL element as a light-emitting element.

In order that light emitted from the light-emitting element can be extracted, at least one of the pair of electrodes is transparent. A transistor and a light-emitting element are formed over a substrate; the light-emitting element can have a top emission structure in which light emission is extracted from the surface on the side opposite to the substrate, a bottom emission structure in which light emission is extracted from the surface on the substrate side, or a dual emission structure in which light emission is extracted from both surfaces. The light-emitting element having any of the emission structures can be used.

A light-emitting element 4513 that is a display element is electrically connected to the transistor 4010 provided in the pixel portion 4002. The structure of the light-emitting element 4513 is a stacked-layer structure of the first electrode layer 4030, a light-emitting layer 4511, and the second electrode layer 4031; however, the structure is not limited thereto. The structure of the light-emitting element 4513 can be changed as appropriate depending on, for example, the direction in which light is extracted from the light-emitting element 4513.

The partition wall 4510 is formed using an organic insulating material or an inorganic insulating material. It is particularly preferable that a photosensitive resin material be used, and an opening portion be formed over the first electrode layer 4030 such that a side surface of the opening portion is formed to be an inclined surface having continuous curvature.

The light-emitting layer 4511 may be formed using a single layer. Alternatively, a plurality of layers may be stacked.

A protective layer may be formed over the second electrode layer 4031 and the partition wall 4510 in order to prevent entry of oxygen, hydrogen, moisture, carbon dioxide, and the like into the light-emitting element 4513. For the protective layer, silicon nitride, silicon nitride oxide, aluminum oxide, aluminum nitride, aluminum oxynitride, aluminum nitride oxide, DLC (Diamond Like Carbon), or the like can be formed. In a space that is sealed by the first substrate 4001, the second substrate 4006, and the sealant 4005, a filler 4514 is provided for sealing. In this manner, it is preferable that packaging (sealing) be performed with a protective film (such as a laminate film or an ultraviolet curable resin film) or a cover material with high air-tightness and little degasification to prevent exposure to the outside air.

As the filler 4514, an ultraviolet curable resin or a thermosetting resin as well as an inert gas such as nitrogen or argon can be used; and PVC (polyvinyl chloride), an acrylic resin, polyimide, an epoxy resin, a silicone resin, PVB (polyvinyl butyral), EVA (ethylene vinyl acetate), or the like can be used. In addition, a drying agent may be contained in the filler 4514.

For the sealant 4005, a glass material such as a glass frit or a resin material such as a light curable resin, a thermosetting resin, or a curable resin that is cured at room temperature, such as a two-component-mixture-type resin, can be used. In addition, a drying agent may be contained in the sealant 4005.

In addition, if necessary, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment that can reduce glare by diffusing reflected light with projections and depressions on a surface can be performed.

When the light-emitting element has a microcavity structure, light with high color purity can be extracted. Furthermore, when a microcavity structure and a color filter are used in combination, glare can be reduced and visibility of a displayed image can be increased.

The first electrode layer and the second electrode layer (also referred to as a pixel electrode layer, a common electrode layer, a counter electrode layer, or the like) for applying voltage to the display element have light-transmitting properties or light-reflecting properties, which depends on the direction in which light is extracted, the position where the electrode layer is provided, and the pattern structure of the electrode layer.

For the first electrode layer 4030 and the second electrode layer 4031, a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added can be used.

The first electrode layer 4030 and the second electrode layer 4031 can be formed using one or more kinds of metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof and metal nitrides thereof.

The first electrode layer 4030 and the second electrode layer 4031 can be formed using a conductive composition including a conductive macromolecule (also referred to as a conductive polymer). As the conductive macromolecule, what is called a π-electron conjugated conductive macromolecule can be used. Examples include polyaniline or a derivative thereof, polypyrrole or a derivative thereof, polythiophene or a derivative thereof, and a copolymer of two or more kinds of aniline, pyrrole, and thiophene or a derivative thereof.

Since the transistor is easily broken owing to static electricity or the like, a protective circuit for protecting the driver circuit is preferably provided. The protective circuit is preferably formed using a nonlinear element.

With the use of the shift register described in the above embodiment, it is possible to provide a highly reliable display device. With the use of the transistor described in the above embodiment, it is possible to further increase the reliability of the display device. With the use of the transistor described in the above embodiment, it is possible to provide a display device that has a high resolution, a large size, and high display quality. Furthermore, a display device with reduced power consumption can be provided.

<Display Module>

Figure 27:
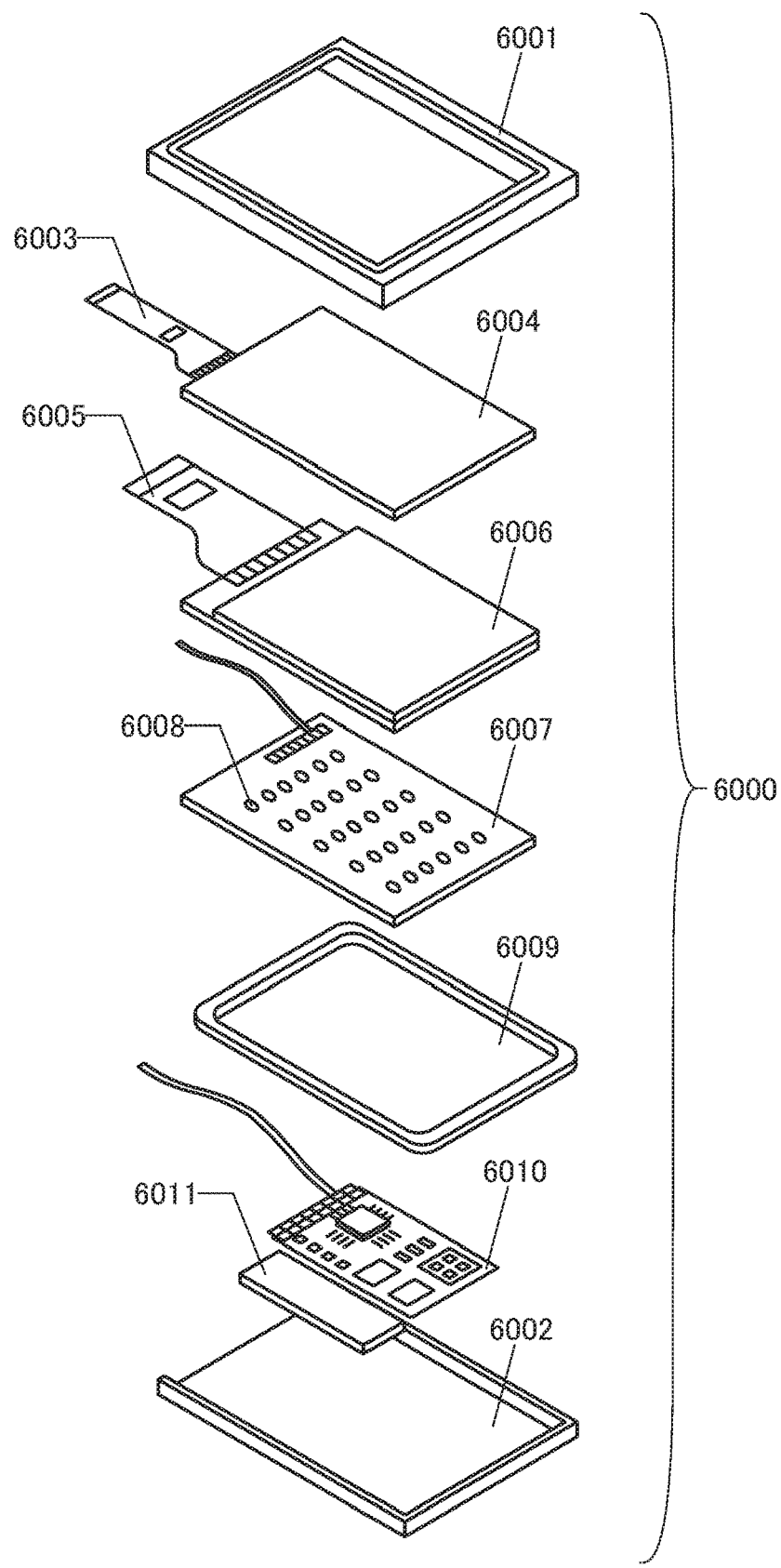
FIG. 27 A diagram illustrating an example of a display module.

A display module is described as an example of a semiconductor device using the above-described OS transistor. In a display module 6000 illustrated in FIG. 27, a touch sensor 6004 connected to an FPC 6003, a display panel 6006 connected to an FPC 6005, a backlight unit 6007, a frame 6009, a printed circuit board 6010, and a battery 6011 are provided between an upper cover 6001 and a lower cover 6002. Note that the backlight unit 6007, the battery 6011, the touch sensor 6004, and the like are not provided in some cases.

The semiconductor device of one embodiment of the present invention can be used for, for example, the touch sensor 6004, the display panel 6006, and an integrated circuit mounted on the printed circuit board 6010. For example, the above-described display device can be used for the display panel 6006.

The shapes and sizes of the upper cover 6001 and the lower cover 6002 can be changed as appropriate in accordance with the sizes of the touch sensor 6004, the display panel 6006, and the like.

The touch sensor 6004 can be a resistive or capacitive touch sensor and can be formed to overlap with the display panel 6006. A touch sensor function can be added to the display panel 6006. For example, an electrode for a touch sensor can be provided in each pixel of the display panel 6006 so that a capacitive touch panel function is added. Alternatively, a photosensor can be provided in each pixel of the display panel 6006 so that an optical touch sensor function is added, for example. In the case where the touch sensor 6004 do not need to be provided, the touch sensor 6004 can be omitted.

The backlight unit 6007 includes a light source 6008. A structure may be employed in which the light source 6008 is provided at an end portion of the backlight unit 6007 and a light diffusing plate is used. When a light-emitting display device or the like is used for the display panel 6006, the backlight unit 6007 can be omitted.

The frame 6009 has a function of protecting the display panel 6006 and a function of an electromagnetic shield for blocking electromagnetic waves generated from the printed circuit board 6010 side. The frame 6009 may also have a function of a radiator plate.

The printed circuit board 6010 includes a power supply circuit, a signal processing circuit for outputting a video signal and a clock signal, and the like. As a power supply for supplying power to the power supply circuit, the battery 6011 or a commercial power supply may be used. Note that the battery 6011 can be omitted when a commercial power supply is used as the power supply.

The display module 6000 can be additionally provided with a member such as a polarizing plate, a retardation plate, or a prism sheet.

This embodiment can be implemented in an appropriate combination with the structures described in the other embodiments and the like.

Embodiment 8

The semiconductor device of one embodiment of the present invention can be used for a processor such as a CPU and a GPU or a chip. FIG. 28 illustrates specific examples of electronic devices including a processor such as a CPU and a GPU or a chip of one embodiment of the present invention.

<Electronic Device and System>

The GPU or the computer of one embodiment of the present invention can be mounted on a variety of electronic devices. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or notebook personal computer, a monitor for a computer and the like, digital signage, and a large game machine like a pachinko machine. In addition, when the integrated circuit or the chip of one embodiment of the present invention is provided in the electronic device, the electronic device can include artificial intelligence.

The electronic device of one embodiment of the present invention may include an antenna. When a signal is received by the antenna, a video, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, a position, speed, acceleration, angular velocity, rotational frequency, distance, light, liquid, magnetism, temperature, a chemical substance, sound, time, hardness, an electric field, current, voltage, electric power, radioactive rays, a flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 28 illustrates examples of the electronic device.

[Mobile Phone]

FIG. 28(A) illustrates a mobile phone (smartphone) which is a type of an information terminal. An information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the chip of one embodiment of the present invention. Examples of the application utilizing artificial intelligence include an application for recognizing voice and displaying the contents of the conversation on the display portion 5511; an application for recognizing letters, figures, and the like input to the touch panel of the display portion 5511 by a user and displaying them on the display portion 5511; and an application for performing biometric authentication using fingerprints, voice prints, or the like.

[Information Terminal]

FIG. 28(B) illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the chip of one embodiment of the present invention as the information terminal 5500 described above. Examples of the application utilizing artificial intelligence include designsupport software, text correction software, and software for automatic menu generation. Furthermore, with the use of the desktop information terminal 5300, novel artificial intelligence can be developed.

Note that in the above, although a smartphone and a desktop information terminal are respectively illustrated in FIGS. 28(A) and 28(B) as examples of the electronic device, artificial intelligence can also be applied to an information terminal other than a smartphone and a desktop information terminal. Examples of an information terminal other than a smartphone and a desktop information terminal include a PDA (Personal Digital Assistant), a notebook information terminal, and a workstation.

[Electrical Appliance]

FIG. 28(C) illustrates an electric refrigerator-freezer 5800 which is an example of an electrical appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting the temperature to be appropriate for the foods stored in the electric refrigerator-freezer 5800, and the like.

Although the electric refrigerator-freezer is described as an electrical appliance in FIG. 28(C), other examples of the electrical appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Console]

FIG. 28(D) illustrates a portable game console 5200 which is an example of a game console. The portable game console includes a housing 5201, a display portion 5202, a button 5203, and the like.

With the use of the GPU or the chip of one embodiment of the present invention in the portable game console 5200, the portable game console 5200 with low power consumption can be obtained. Furthermore, heat generation from a circuit can be reduced owing to low power consumption; thus, the influence of heat generation on the circuit itself, the peripheral circuit, and the module can be reduced.

Moreover, with the use of the GPU or the chip of one embodiment of the present invention in the portable game console 5200, the portable game console 5200 including artificial intelligence can be obtained.

Basically, the progress of a game, the actions and words of game characters, and expressions of a phenomenon or the like that occurs in the game are determined by a program of the game; however, the use of artificial intelligence in the portable game console 5200 enables expressions not limited by the program of the game. For example, expressions are possible in which the actions and words of game characters are changed depending on questions posed by the player, the progress of the game, and time.

When a game requiring a plurality of players is played on the portable game console 5200, the artificial intelligence can create a virtual game player; thus, the game can be played alone with the game player created by the artificial intelligence as an opponent.

Although the portable game console is illustrated in FIG. 28(D) as an example of a game machine, the game machine using the GPU or the chip of one embodiment of the present invention is not limited thereto. Examples of the game machine using the GPU or the chip of one embodiment of the present invention include a home stationary game machine, an arcade game machine installed in entertainment facilities (a game center, an amusement park, and the like), a throwing machine for batting practice installed in sports facilities, and the like.

[Moving Vehicle]

The GPU or the chip of one embodiment of the present invention can be used in an automobile, which is a moving vehicle, and around a driver's seat in the automobile.

FIG. 28(E1) illustrates an automobile 5700 which is an example of a moving vehicle, and FIG. 28(E2) illustrates the periphery of a windshield inside the automobile. FIG. 28(E1) illustrates a display panel 5701, a display panel 5702, and a display panel 5703 that are attached to a dashboard and a display panel 5704 that is attached to a pillar.

The display panel 5701 to the display panel 5703 can provide a variety of kinds of information such as a speedometer, a tachometer, a mileage, a fuel meter, a gearshift indicator, air-condition setting, and the like. The content, layout, or the like of the display on the display panels can be changed appropriately to suit the user's preferences, so that the design can be improved. The display panel 5701 to the display panel 5703 can also be used as lighting devices.

The display panel 5704 displays an image taken by an imaging device (not illustrated) provided for the automobile 5700, whereby the view obstructed by the pillar (blind areas) can be complemented. That is, display of an image taken by an imaging device provided on the outside of the automobile 5700 can fill in blind areas and improve safety. In addition, display of an image that complements the area that cannot be seen makes it possible to confirm safety more naturally and comfortably. The display panel 5704 can also be used as a lighting device.

Because the GPU or the chip of one embodiment of the present invention can be used as a component of artificial intelligence, the chip can be used in an automatic driving system of the automobile 5700, for example. The chip can also be used for a system for navigation, risk prediction, or the like. The display panel 5701 to the display panel 5704 may display information regarding navigation, risk prediction, and the like.

Although an automobile is illustrated in FIGS. 28(E1) and 28(E2) as an example of a moving vehicle, moving vehicles are not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

FIG. 28(F) schematically illustrates data transmission in a broadcasting system. Specifically, FIG. 28(F) illustrates a path in which a radio wave (a broadcasting signal) transmitted from a broadcast station 5680 reaches a television receiver (TV) 5600 of each household. The TV 5600 includes a receiving device (not illustrated), and the broadcast signal received by an antenna 5650 is transmitted to the TV 5600 through the receiving device.

Although an UHF (Ultra High Frequency) antenna is illustrated as the antenna 5650 in FIG. 28(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 28(F) and may be satellite broadcasting using an artificial satellite, data broadcasting using an optical line, or the like.

The above-described broadcasting system may be a broadcasting system utilizing artificial intelligence by including the chip of one embodiment of the present invention. When the broadcast data is transmitted from the broadcast station 5680 to the TV 5600 of each household, the broadcast data is compressed by an encoder. The antenna 5650 receives the compressed broadcast data, and then the broadcast data is decompressed by a decoder of the receiving device in the TV 5600. Utilizing the artificial intelligence enables, for example, recognition of a display pattern included in a displayed image in motion compensation prediction, which is one of the compressing methods for the encoder. In addition, in-frame prediction or the like can also be performed utilizing the artificial intelligence. Furthermore, for example, when the broadcast data with low resolution is received and the broadcast data is displayed on the TV 5600 with high resolution, image interpolation processing such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As the application of artificial intelligence in the TV 5600, a recording device with artificial intelligence may be provided in the TV 5600, for example. With such a structure, the artificial intelligence can learn the user's preference, so that TV programs that suit the user's preference can be recorded automatically in the recording device.

The electronic device and the functions of the electronic device, the application example of the artificial intelligence and its effects, and the like described in this embodiment can be combined as appropriate with the description of another electronic device.

This embodiment can be implemented in an appropriate combination with the structures described in the other embodiments, Example, and the like.

REFERENCE NUMERALS

10 diode, 10$bg$ diode, 10$d$ diode, 10$s$ diode, 10$tg$ diode, 20 substrate, 21 region, 21$bg$ region, 21$d$ region, 21$s$ region, 21$tg$ region, 22 region, 22$bg$ region, 22$d$ region, 22$s$ region, 22$tg$ region, 24$bg$ plug, 24$d$ plug, 24$s$ plug, 24$tg$ plug, 26$bg$ wiring, 26$bg$1 wiring, 26$bg$2 wiring, 26$d$ wiring, 26$d$1 wiring, 26$d$2 wiring, 26$s$ wiring, 26$s$1 wiring, 26$s$2 wiring, 26$tg$ wiring, 26$tg$1 wiring, 26$tg$2 wiring, 29 conductor, 200 transistor, 200$bg$ transistor, 200$d$ transistor, 200$s$ transistor, 200$t$ transistor, 200$tg$ transistor, 205 conductor, 230 oxide, 260 conductor

The invention claimed is:

1. A semiconductor device comprising:
   a transistor comprising a first conductor, a second conductor, a third conductor, and an oxide semiconductor over a semiconductor substrate;
   a first diode element;
   a second diode element; and
   a third diode element,
   wherein the first to third diode elements are in the semiconductor substrate, and
   wherein charged charges in the transistor move to the semiconductor substrate through the first diode element, the second diode element, and the third diode element.

2. The semiconductor device according to claim 1, further comprising a fourth diode element,
   wherein the fourth diode element is electrically connected to the semiconductor substrate.

3. The semiconductor device according to claim 1, wherein the semiconductor device comprises two or more transistors.

* * * * *